(12) United States Patent
Hart et al.

(10) Patent No.: US 11,977,206 B2
(45) Date of Patent: *May 7, 2024

(54) DISPLAY ARTICLES WITH DIFFRACTIVE, ANTIGLARE SURFACES AND THIN, DURABLE ANTIREFLECTION COATINGS

(71) Applicant: Corning Incorporated, Corning, NY (US)

(72) Inventors: Shandon Dee Hart, Elmira, NY (US); Karl William Koch, III, Elmira, NY (US); Carlo Anthony Kosik Williams, Painted Post, NY (US); Lin Lin, Painted Post, NY (US); Wageesha Senaratne, Horseheads, NY (US); William Allen Wood, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 235 days.

This patent is subject to a terminal disclaimer.

(21) Appl. No.: 17/370,311

(22) Filed: Jul. 8, 2021

(65) Prior Publication Data

US 2022/0011466 A1 Jan. 13, 2022

Related U.S. Application Data

(60) Provisional application No. 63/049,843, filed on Jul. 9, 2020.

(51) Int. Cl.
*G02B 1/11* (2015.01)
*C03C 15/00* (2006.01)
(Continued)

(52) U.S. Cl.
CPC ............... *G02B 1/11* (2013.01); *C03C 15/00* (2013.01); *C23C 14/021* (2013.01);
(Continued)

(58) Field of Classification Search
CPC ...... G02B 5/0221; G02B 1/11; G02B 5/0294; G02B 27/42; G02B 27/4272; G02B 2207/101
See application file for complete search history.

(56) References Cited

U.S. PATENT DOCUMENTS 3,067,021 A 12/1962 Pelley et al.
3,150,032 A 9/1964 Rubenstein
(Continued)

FOREIGN PATENT DOCUMENTS

AU 199540318 8/1996
AU 2015252116 A1 11/2015
(Continued)

OTHER PUBLICATIONS

Boerner et al; "Holographic Antiglare and Antireflection Films for Flat Panel Displays" SID 03 DIGEST, 7.3, p. 68, 2003.
(Continued)

*Primary Examiner* — Jia X Pan
(74) *Attorney, Agent, or Firm* — William M. Johnson; William J. Tucker

(57) ABSTRACT

A display article is described herein that includes: a substrate comprising a thickness and primary surface; a diffractive surface region defined by the primary surface; and an antireflective coating disposed on the diffractive surface region. The diffractive surface region comprises structural features that comprise different heights in a multimodal distribution. The substrate exhibits a sparkle of <4%, and a transmittance haze of <20%, each from an incident angle of 0°. The antireflection coating comprises a plurality of alternating high refractive index and low refractive index layers. Further, each of the low index layers comprises a refractive index of ≤about 1.8, and each of the high index layers comprises a refractive index of >1.8. The article exhibits a first-surface average visible specular reflectance of less than
(Continued)

0.2% at an incident angle of 20°, and a maximum hardness of ≥8 GPa in a Berkovich Indenter Hardness Test.

22 Claims, 30 Drawing Sheets

(51) Int. Cl.
    *C23C 14/02*     (2006.01)
    *C23C 14/04*     (2006.01)
    *C23C 16/02*     (2006.01)
    *C23C 16/04*     (2006.01)
    *G02B 1/118*     (2015.01)
    *G02B 1/14*     (2015.01)
    *G02B 5/02*     (2006.01)
    *G02B 27/42*     (2006.01)

(52) U.S. Cl.
    CPC ........ *C23C 14/042* (2013.01); *C23C 16/0227* (2013.01); *C23C 16/042* (2013.01); *G02B 1/118* (2013.01); *G02B 1/14* (2015.01); *G02B 5/0221* (2013.01); *G02B 5/0268* (2013.01); *G02B 27/4205* (2013.01); *G02B 27/4272* (2013.01); *G02B 2207/101* (2013.01)

(56) References Cited

U.S. PATENT DOCUMENTS

| | | | |
|---|---|---|---|
| 3,413,058 A | 11/1968 | Fang et al. |
| 4,579,765 A | 3/1986 | Schachtner |
| 4,687,707 A | 8/1987 | Matsuo et al. |
| 4,797,316 A | 1/1989 | Hecq et al. |
| 4,946,923 A | 8/1990 | Nagata et al. |
| 5,210,253 A | 5/1993 | Kinami et al. |
| 5,399,387 A | 3/1995 | Law et al. |
| 5,470,606 A | 11/1995 | De Boer |
| 5,618,619 A | 4/1997 | Petrmichl et al. |
| 5,737,472 A | 4/1998 | Bernasson et al. |
| 6,046,855 A | 4/2000 | Goto |
| 6,208,389 B1 | 3/2001 | Aben et al. |
| 6,219,121 B1 | 4/2001 | Sahouani et al. |
| RE37,183 E | 5/2001 | Kawamura et al. |
| 6,254,913 B1 | 7/2001 | Wadsworth et al. |
| 6,286,965 B1 | 9/2001 | Caskey et al. |
| 6,340,404 B1 | 1/2002 | Oka et al. |
| 6,521,677 B2 | 2/2003 | Yashiro et al. |
| 6,723,423 B1 | 4/2004 | Kaneko et al. |
| 6,743,516 B2 | 6/2004 | Murphy et al. |
| 6,824,709 B2 | 11/2004 | Shundo |
| 6,846,599 B2 | 1/2005 | Ide |
| 6,862,139 B2 | 2/2005 | Chang et al. |
| 7,037,573 B2 | 5/2006 | Miyatake et al. |
| 7,122,253 B2 | 10/2006 | Yamaguchi et al. |
| 7,128,428 B2 | 10/2006 | Takahashi et al. |
| 7,149,032 B2 | 12/2006 | Ohishi et al. |
| 7,171,676 B2 | 1/2007 | Takeda et al. |
| 7,253,861 B2 | 8/2007 | Niiyama et al. |
| 7,264,866 B2 | 9/2007 | Hashimoto et al. |
| 7,332,213 B2 | 2/2008 | Mimura et al. |
| 7,371,439 B2 | 5/2008 | Matsunaga et al. |
| 7,371,786 B2 | 5/2008 | Yoshihara et al. |
| 7,390,099 B2 | 6/2008 | Takao et al. |
| 7,410,686 B2 | 8/2008 | Osada et al. |
| 7,542,207 B2 | 6/2009 | Matsunaga |
| 7,604,358 B2 | 10/2009 | Ninomiya et al. |
| 7,629,400 B2 | 12/2009 | Hyman |
| 7,645,502 B2 | 1/2010 | Mikami et al. |
| 7,737,633 B2 | 6/2010 | Zheng |
| 7,796,123 B1 | 9/2010 | Irvin et al. |
| 7,799,732 B2 | 9/2010 | Tanaka et al. |
| 7,903,340 B2 | 3/2011 | Nagahama et al. |
| 7,973,892 B2 | 7/2011 | Lim |
| 8,026,021 B2 | 9/2011 | Stumpe et al. |
| 8,062,731 B2 | 11/2011 | Takada et al. |
| 8,110,278 B2 | 2/2012 | Hsu et al. |
| 8,124,215 B2 | 2/2012 | Takao et al. |
| 8,304,055 B2 | 11/2012 | Haga et al. |
| 8,312,739 B2 | 11/2012 | Lee et al. |
| 8,325,418 B2 | 12/2012 | Nagahama et al. |
| 8,514,351 B2 | 8/2013 | Sasaki et al. |
| 8,561,429 B2 | 10/2013 | Allan et al. |
| 8,628,896 B2 | 1/2014 | Ikeda et al. |
| 8,822,018 B2 | 9/2014 | Thoumazet et al. |
| 8,845,172 B2 | 9/2014 | Jang et al. |
| 8,854,623 B2 | 10/2014 | Fontaine et al. |
| 8,888,965 B2 | 11/2014 | Kuppuswamy et al. |
| 9,023,457 B2 | 5/2015 | Carrilero et al. |
| 9,051,404 B2 | 6/2015 | Jiang et al. |
| 9,051,423 B2 | 6/2015 | Qiu |
| 9,079,802 B2 | 7/2015 | Bellman et al. |
| 9,102,131 B2 | 8/2015 | Derks et al. |
| 9,158,044 B2 | 10/2015 | Akiyama et al. |
| 9,263,202 B2 | 2/2016 | Lee et al. |
| 9,316,885 B2 | 4/2016 | Lo et al. |
| 9,335,444 B2 | 5/2016 | Hart et al. |
| 9,359,261 B2 | 6/2016 | Bellman et al. |
| 9,366,784 B2 | 6/2016 | Bellman et al. |
| 9,400,420 B2 | 7/2016 | Pudleiner et al. |
| 9,411,180 B2 | 8/2016 | Gollier et al. |
| 9,418,193 B2 | 8/2016 | Dowski et al. |
| 9,535,280 B2 | 1/2017 | Borrelli et al. |
| 9,550,161 B2 | 1/2017 | Arfsten et al. |
| 9,573,842 B2 | 2/2017 | Gollier et al. |
| 9,581,731 B2 | 2/2017 | Bookbinder et al. |
| 9,588,263 B2 | 3/2017 | Gollier et al. |
| 9,651,720 B2 | 5/2017 | Lander et al. |
| 9,701,248 B2 | 7/2017 | Neuman et al. |
| 9,701,579 B2 | 7/2017 | Gollier et al. |
| 9,703,011 B2 | 7/2017 | Adib et al. |
| 9,718,249 B2 | 7/2017 | Kwong |
| 9,726,786 B2 | 8/2017 | Hart et al. |
| 9,766,376 B2 | 9/2017 | Ho et al. |
| 9,786,194 B2 | 10/2017 | Hyman |
| 9,823,209 B2 | 11/2017 | Yu et al. |
| 9,880,328 B2 | 1/2018 | Gollier et al. |
| 9,896,596 B2 | 2/2018 | Jung et al. |
| 9,939,557 B2 | 4/2018 | David et al. |
| 9,964,773 B2 | 5/2018 | Wang |
| 9,987,820 B2 | 6/2018 | Mehlmann et al. |
| 10,183,889 B2 | 1/2019 | Gollier et al. |
| 10,613,340 B2 | 4/2020 | Borrelli et al. |
| 10,698,151 B2 | 6/2020 | Hamilton et al. |
| 10,899,661 B2 | 1/2021 | Gollier et al. |
| 10,921,492 B2 | 2/2021 | Gregorski et al. |
| 10,948,629 B2 | 3/2021 | Hart et al. |
| 2002/0085284 A1 | 7/2002 | Nakamura et al. |
| 2002/0090507 A1 | 7/2002 | Barth et al. |
| 2002/0167629 A1 | 11/2002 | Blanchard |
| 2003/0234460 A1 | 12/2003 | Hayashi et al. |
| 2004/0005482 A1 | 1/2004 | Kobayashi et al. |
| 2004/0184765 A1 | 9/2004 | Difrancesco et al. |
| 2004/0188874 A1 | 9/2004 | Hikita et al. |
| 2004/0195960 A1 | 10/2004 | Czeremuszkin et al. |
| 2004/0233174 A1 | 11/2004 | Robrecht et al. |
| 2005/0007019 A1 | 1/2005 | Kim et al. |
| 2005/0074591 A1 | 4/2005 | Zagdoun |
| 2005/0287309 A1 | 12/2005 | Veerasamy |
| 2006/0152801 A1 | 7/2006 | Matsunaga |
| 2006/0153979 A1 | 7/2006 | Asakura et al. |
| 2006/0240266 A1 | 10/2006 | Schicht et al. |
| 2006/0274047 A1 | 12/2006 | Spath et al. |
| 2006/0274048 A1 | 12/2006 | Spath et al. |
| 2006/0286465 A1 | 12/2006 | Kim |
| 2007/0014981 A1 | 1/2007 | Chiang et al. |
| 2007/0141357 A1 | 6/2007 | Bekiarian et al. |
| 2007/0152985 A1 | 7/2007 | Ostergaard et al. |
| 2007/0166536 A1 | 7/2007 | Dollase et al. |
| 2007/0240804 A1 | 10/2007 | Arai et al. |
| 2007/0249789 A1 | 10/2007 | Buehler et al. |
| 2007/0266896 A1 | 11/2007 | Suwa et al. |
| 2008/0138606 A1 | 6/2008 | Yoshihara et al. |
| 2008/0191463 A1 | 8/2008 | Vermeulen et al. |
| 2008/0241523 A1 | 10/2008 | Huignard et al. |

(56) References Cited

U.S. PATENT DOCUMENTS

| | | |
|---|---|---|
| 2009/0004462 A1 | 1/2009 | Zhang et al. |
| 2009/0017314 A1 | 1/2009 | Nadaud et al. |
| 2009/0051668 A1 | 2/2009 | Cheng |
| 2009/0104385 A1 | 4/2009 | Reymond et al. |
| 2009/0135492 A1 | 5/2009 | Kusuda et al. |
| 2009/0178704 A1 | 7/2009 | Kalejs et al. |
| 2009/0268299 A1 | 10/2009 | Furui et al. |
| 2010/0009154 A1 | 1/2010 | Allan et al. |
| 2010/0027383 A1 | 2/2010 | Suzuki et al. |
| 2010/0062217 A1 | 3/2010 | Kurematsu |
| 2010/0130348 A1 | 5/2010 | Kang et al. |
| 2010/0149483 A1 | 6/2010 | Chiavetta, III |
| 2010/0167019 A1 | 6/2010 | Ohyanagi et al. |
| 2010/0182551 A1 | 7/2010 | Tochigi et al. |
| 2010/0195311 A1 | 8/2010 | Furui et al. |
| 2010/0196650 A1 | 8/2010 | Okawa et al. |
| 2010/0196685 A1 | 8/2010 | Murata et al. |
| 2010/0238384 A1 | 9/2010 | Tochigi et al. |
| 2010/0258752 A1 | 10/2010 | Mochizuki et al. |
| 2010/0272990 A1 | 10/2010 | Bondesan et al. |
| 2010/0316861 A1 | 12/2010 | Kubler et al. |
| 2011/0064943 A1 | 3/2011 | Wang |
| 2011/0100424 A1 | 5/2011 | Roche et al. |
| 2011/0128664 A1 | 6/2011 | Coue et al. |
| 2012/0013983 A1 | 1/2012 | Chang et al. |
| 2012/0070603 A1 | 3/2012 | Hsu |
| 2012/0113043 A1 | 5/2012 | Liu et al. |
| 2012/0250135 A1 | 10/2012 | Yeh et al. |
| 2012/0270041 A1 | 10/2012 | Matsumoto et al. |
| 2013/0127202 A1 | 5/2013 | Hart |
| 2013/0142994 A1 | 6/2013 | Wang et al. |
| 2014/0090864 A1 | 4/2014 | Paulson |
| 2014/0093711 A1 | 4/2014 | Paulson |
| 2014/0106141 A1 | 4/2014 | Bellman et al. |
| 2014/0113083 A1 | 4/2014 | Lee et al. |
| 2014/0131091 A1 | 5/2014 | Smith |
| 2014/0154661 A1 | 6/2014 | Bookbinder et al. |
| 2014/0313441 A1 | 10/2014 | Lim |
| 2014/0320422 A1 | 10/2014 | Williams et al. |
| 2014/0334006 A1* | 11/2014 | Adib .............. C03C 17/006 359/580 |
| 2014/0376094 A1 | 12/2014 | Bellman et al. |
| 2015/0079368 A1 | 3/2015 | Koike et al. |
| 2015/0111725 A1 | 4/2015 | Van et al. |
| 2015/0160376 A1 | 6/2015 | Kohli et al. |
| 2015/0177778 A1 | 6/2015 | Chen et al. |
| 2015/0185554 A1 | 7/2015 | Zhao et al. |
| 2015/0250237 A1 | 9/2015 | Shoham et al. |
| 2015/0253467 A1 | 9/2015 | Sano |
| 2015/0309628 A1 | 10/2015 | Chen et al. |
| 2015/0316442 A1 | 11/2015 | Tamada et al. |
| 2015/0322270 A1 | 11/2015 | Amin et al. |
| 2015/0323705 A1 | 11/2015 | Hart et al. |
| 2015/0323812 A1 | 11/2015 | Ishak et al. |
| 2015/0355382 A1 | 12/2015 | Henn et al. |
| 2016/0002498 A1 | 1/2016 | Maghsoodi et al. |
| 2016/0016845 A1 | 1/2016 | Cho et al. |
| 2016/0041308 A1 | 2/2016 | Kramer et al. |
| 2016/0083835 A1 | 3/2016 | Adib et al. |
| 2016/0137873 A1 | 5/2016 | Kostromine et al. |
| 2016/0146978 A1 | 5/2016 | Lee et al. |
| 2016/0246154 A1 | 8/2016 | O'Keeffe |
| 2016/0306046 A1 | 10/2016 | Axelsson et al. |
| 2016/0362583 A1 | 12/2016 | Naik et al. |
| 2016/0363698 A1 | 12/2016 | Fan et al. |
| 2017/0003420 A1 | 1/2017 | Berit-Debat et al. |
| 2017/0015584 A1 | 1/2017 | Krzyzak et al. |
| 2017/0050349 A1 | 2/2017 | Hara et al. |
| 2017/0075039 A1 | 3/2017 | Hart et al. |
| 2017/0129806 A1 | 5/2017 | Fujii et al. |
| 2017/0162828 A1 | 6/2017 | MacKerron et al. |
| 2017/0183255 A1 | 6/2017 | Walther et al. |
| 2017/0183257 A1 | 6/2017 | Apitz et al. |
| 2017/0199307 A1 | 7/2017 | Hart et al. |
| 2017/0210666 A1 | 7/2017 | Chang et al. |
| 2017/0235418 A1 | 8/2017 | Inamoto et al. |
| 2017/0260620 A1 | 9/2017 | Cheah et al. |
| 2017/0276838 A1 | 9/2017 | Oishi et al. |
| 2017/0285227 A1 | 10/2017 | Chen et al. |
| 2017/0307790 A1 | 10/2017 | Bellman et al. |
| 2018/0095303 A1 | 4/2018 | Cho et al. |
| 2018/0162091 A1 | 6/2018 | Takeda et al. |
| 2018/0203163 A1 | 7/2018 | Thakkar et al. |
| 2018/0251398 A1 | 9/2018 | Ikegami et al. |
| 2018/0352668 A1 | 12/2018 | Amin et al. |
| 2018/0372919 A1 | 12/2018 | Suzuki et al. |
| 2019/0039935 A1 | 2/2019 | Couillard et al. |
| 2019/0039946 A1 | 2/2019 | Bayne et al. |
| 2019/0045038 A1 | 2/2019 | Zhou et al. |
| 2019/0062200 A1 | 2/2019 | He et al. |
| 2019/0219739 A1* | 7/2019 | Gregorski ............ G02B 5/0236 |
| 2020/0057177 A1 | 2/2020 | Hart et al. |
| 2020/0158917 A1 | 5/2020 | Hart et al. |
| 2020/0158922 A1 | 5/2020 | Hayashi et al. |
| 2020/0379143 A1* | 12/2020 | Gu ..................... G02B 1/18 |
| 2021/0181382 A1 | 6/2021 | Gregorski et al. |

FOREIGN PATENT DOCUMENTS

| | | |
|---|---|---|
| CA | 2629555 A1 | 11/2009 |
| CN | 1312450 A | 9/2001 |
| CN | 1318722 A | 10/2001 |
| CN | 1653880 A | 8/2005 |
| CN | 1869736 A | 11/2006 |
| CN | 2859579 Y | 1/2007 |
| CN | 1936623 A | 3/2007 |
| CN | 1940601 A | 4/2007 |
| CN | 1946646 A | 4/2007 |
| CN | 201165502 Y | 12/2008 |
| CN | 201483977 U | 5/2010 |
| CN | 201707457 U | 1/2011 |
| CN | 102109630 A | 6/2011 |
| CN | 201945707 U | 8/2011 |
| CN | 201984393 U | 9/2011 |
| CN | 202171708 U | 3/2012 |
| CN | 202177751 U | 3/2012 |
| CN | 202177765 U | 3/2012 |
| CN | 202182978 U | 4/2012 |
| CN | 102627407 A | 8/2012 |
| CN | 202615053 U | 12/2012 |
| CN | 102923969 A | 2/2013 |
| CN | 103013196 A | 4/2013 |
| CN | 103013219 A | 4/2013 |
| CN | 202904161 U | 4/2013 |
| CN | 103099529 A | 5/2013 |
| CN | 202924088 U | 5/2013 |
| CN | 202924096 U | 5/2013 |
| CN | 103171230 A | 6/2013 |
| CN | 203025361 U | 6/2013 |
| CN | 103254670 A | 8/2013 |
| CN | 103302934 A | 9/2013 |
| CN | 103305816 A | 9/2013 |
| CN | 203260587 U | 10/2013 |
| CN | 203535376 U | 4/2014 |
| CN | 203567294 U | 4/2014 |
| CN | 203620645 U | 6/2014 |
| CN | 103921487 A | 7/2014 |
| CN | 103934756 A | 7/2014 |
| CN | 203689480 U | 7/2014 |
| CN | 103964705 A | 8/2014 |
| CN | 104418511 A | 3/2015 |
| CN | 104559625 A | 4/2015 |
| CN | 104845544 A | 8/2015 |
| CN | 204727835 U | 10/2015 |
| CN | 204894681 U | 12/2015 |
| CN | 105446558 A | 3/2016 |
| CN | 105737103 A | 7/2016 |
| CN | 205368144 U | 7/2016 |
| CN | 105843452 A | 8/2016 |
| CN | 105859148 A | 8/2016 |
| CN | 106113837 A | 11/2016 |
| CN | 205687804 U | 11/2016 |
| CN | 106199812 A | 12/2016 |
| CN | 205818592 U | 12/2016 |

(56) References Cited

FOREIGN PATENT DOCUMENTS

| | | |
|---|---|---|
| CN | 106338783 A | 1/2017 |
| CN | 106378880 A | 2/2017 |
| CN | 106431004 A | 2/2017 |
| CN | 106941545 A | 7/2017 |
| CN | 107042642 A | 8/2017 |
| CN | 107174867 A | 9/2017 |
| CN | 107310209 A | 11/2017 |
| EP | 0698798 A2 | 2/1996 |
| EP | 0966410 A1 | 12/1999 |
| EP | 0996410 A1 | 5/2000 |
| EP | 1069088 A1 | 1/2001 |
| EP | 1275623 A1 | 1/2003 |
| EP | 1432874 A1 | 6/2004 |
| EP | 2149540 A1 | 2/2010 |
| FR | 2966934 A3 | 5/2012 |
| FR | 2982607 A1 | 5/2013 |
| GB | 2485522 A | 5/2012 |
| ID | 11085 | 3/2011 |
| IN | 201201777 | 10/2015 |
| JP | 58-127463 A | 7/1983 |
| JP | 61-019888 A | 1/1986 |
| JP | 02-077434 A | 3/1990 |
| JP | 02-156448 A | 6/1990 |
| JP | 07-290652 A | 11/1995 |
| JP | 07-331115 A | 12/1995 |
| JP | 2000-121806 A | 4/2000 |
| JP | 2000-275404 A | 10/2000 |
| JP | 2001-503100 A | 3/2001 |
| JP | 2001-281402 A | 10/2001 |
| JP | 2001-281406 A | 10/2001 |
| JP | 2001-311806 A | 11/2001 |
| JP | 2002-082207 A | 3/2002 |
| JP | 2002-210906 A | 7/2002 |
| JP | 2002-212317 A | 7/2002 |
| JP | 2003-026826 A | 1/2003 |
| JP | 2003-082127 A | 3/2003 |
| JP | 2004-069878 A | 3/2004 |
| JP | 2004-244594 A | 9/2004 |
| JP | 2004-291303 A | 10/2004 |
| JP | 2004-333901 A | 11/2004 |
| JP | 2005-042072 A | 2/2005 |
| JP | 2005-070724 A | 3/2005 |
| JP | 2005-187639 A | 7/2005 |
| JP | 2005-187640 A | 7/2005 |
| JP | 2005-227415 A | 8/2005 |
| JP | 2005-246296 A | 9/2005 |
| JP | 2005-300576 A | 10/2005 |
| JP | 2006-047504 A | 2/2006 |
| JP | 2006-110754 A | 4/2006 |
| JP | 2006-317957 A | 11/2006 |
| JP | 2006-352105 A | 12/2006 |
| JP | 2007-055064 A | 3/2007 |
| JP | 2007-072372 A | 3/2007 |
| JP | 2007-086521 A | 4/2007 |
| JP | 2007-114377 A | 5/2007 |
| JP | 2007-156205 A | 6/2007 |
| JP | 2007-523776 A | 8/2007 |
| JP | 2007-240707 A | 9/2007 |
| JP | 2007-271953 A | 10/2007 |
| JP | 2007-298667 A | 11/2007 |
| JP | 2008-003425 A | 1/2008 |
| JP | 2008-116596 A | 5/2008 |
| JP | 2008-158156 A | 7/2008 |
| JP | 2009-025384 A | 2/2009 |
| JP | 2009-149468 A | 7/2009 |
| JP | 2009-175725 A | 8/2009 |
| JP | 2010-061044 A | 3/2010 |
| JP | 2010-125719 A | 6/2010 |
| JP | 2010-167410 A | 8/2010 |
| JP | 2011-246365 A | 12/2011 |
| JP | 2012-132022 A | 7/2012 |
| JP | 2012-228811 A | 11/2012 |
| JP | 2012-242837 A | 12/2012 |
| JP | 2013-070093 A | 4/2013 |
| JP | 2013-226666 A | 11/2013 |
| JP | 2013-234571 A | 11/2013 |
| JP | 2015-006650 A | 1/2015 |
| JP | 5650347 B1 | 1/2015 |
| JP | 5736214 B2 | 6/2015 |
| JP | 2015-167470 A | 9/2015 |
| JP | 2015-171770 A | 9/2015 |
| JP | 2016-009172 A | 1/2016 |
| JP | 2016-201236 A | 11/2016 |
| JP | 2017-528411 A | 9/2017 |
| KR | 10-2006-0024545 A | 3/2006 |
| KR | 10-2006-0060171 A | 6/2006 |
| KR | 10-2006-0065724 A | 6/2006 |
| KR | 10-0709879 B1 | 4/2007 |
| KR | 10-2007-0054850 A | 5/2007 |
| KR | 10-2007-0063134 A | 6/2007 |
| KR | 10-2008-0048578 A | 6/2008 |
| KR | 10-2008-0057443 A | 6/2008 |
| KR | 10-2009-0098975 A | 9/2009 |
| KR | 10-2009-0119968 A | 11/2009 |
| KR | 10-2010-0013836 A | 2/2010 |
| KR | 10-2010-0123624 A | 11/2010 |
| KR | 2011-0047596 A | 5/2011 |
| KR | 10-2011-0078682 A | 7/2011 |
| KR | 10-1121207 B1 | 3/2012 |
| KR | 2013-0031689 | 3/2013 |
| KR | 10-2014-0061842 A | 5/2014 |
| KR | 10-1517051 B1 | 5/2015 |
| KR | 10-2015-0116802 A | 10/2015 |
| KR | 10-2017-0028190 A | 3/2017 |
| KR | 10-2017-0043566 A | 4/2017 |
| TW | 201615588 A | 5/2016 |
| TW | 201715257 A | 5/2017 |
| WO | 98/40323 | 9/1998 |
| WO | 98/52518 A1 | 11/1998 |
| WO | 02/00772 A1 | 1/2002 |
| WO | 03/09767 A1 | 2/2003 |
| WO | 03/27397 A1 | 4/2003 |
| WO | 2007/049589 A1 | 5/2007 |
| WO | 2008/062605 A1 | 5/2008 |
| WO | 2009/008240 A1 | 1/2009 |
| WO | 2009/037886 A1 | 3/2009 |
| WO | 2009/065490 A2 | 5/2009 |
| WO | 2010/114135 A1 | 10/2010 |
| WO | 2013/023359 A1 | 2/2013 |
| WO | 2013/085795 A1 | 6/2013 |
| WO | 2014/061614 A1 | 4/2014 |
| WO | 2014/117333 A1 | 8/2014 |
| WO | 2015/015338 A2 | 2/2015 |
| WO | 2015/030118 A1 | 3/2015 |
| WO | 2015/084253 A1 | 6/2015 |
| WO | 2015/115154 A1 | 8/2015 |
| WO | 2015/125498 A1 | 8/2015 |
| WO | 2015/137196 A1 | 9/2015 |
| WO | 2015/190374 A1 | 12/2015 |
| WO | 2016/069113 A1 | 5/2016 |
| WO | 2016/190047 A1 | 12/2016 |
| WO | 2016/204009 A1 | 12/2016 |
| WO | 2017/041307 A1 | 3/2017 |
| WO | 2018/043253 A1 | 3/2018 |
| WO | 2018/125676 A1 | 7/2018 |
| WO | 2022/125846 A1 | 6/2022 |

OTHER PUBLICATIONS

International Search Report and Written Opinion of the International Searching Authority; PCT/US2019/012807; Mailed Mar. 29, 2019; 12 Pages; European Patent Office.

Oliver et al; "An Improved Technique for Determining Hardness and Elastic Modulus Using Load and Displacement Sensing Indentation Experiments"; J. Mater. Res., vol. 7, No. 6, 1992, pp. 1564-1583.

Oliver et al; "Measurement of Hardness and Elastic Modulus By Instrument Indentation: Advances in Understanding and Refinements To Methodology";. J. Mater. Res., vol. 19, No. 1, 2004, pp. 3-20.

Taguchi et al; "Ultra-Low-Reflective 60-IN. LCD With Uniform Moth-Eye Surface for Digital Signage," SID 10 DIGEST, 80.3, p. 1196, 2010.

(56) References Cited

OTHER PUBLICATIONS

"CIELUV", Available at: https://en.wikipedia.org/wiki/CIELUV, 1976, 5 pages.
"Heron's formula", Available at: https://en.wikipedia.org/wiki/Heron%27s_formula, 8 pages.
"High-precision, fast array spectroradiometer—for demanding measurements", Available at: https://www.instrumentsystems.com/en/products/spectrometers/cas-140d, 4 pages.
"Illuminance Meters", Available at: https://sensing.konicaminolta.us/us/technologies/illuminance-meters/, 2 pages.
"Welcome to Display-Metrology & Systems", Available at: www.display-messtechnik.de/en/measurement, 2014, 1 page.
Al-Dahoudi, N. et al., "Transparent conducting, anti-static and anti-static-anti-glare coatings on plastic substrates," Thin Solid Films 2001, 392, pp. 299-304.
ASTM C770-16(2020), "Standard Test Method for Measurement of Glass Stress-Optical Coefficient," ASTM International, West Conshohocken, PA, 2020, www.astm.org.
ASTM D1003-21, "Standard Test Method for Haze and Luminous Transmittance of Transparent Plastics," ASTM International, West Conshohocken, PA, 2021, www.astm.org.
ASTM D523-14(2018), "Standard Test Method for Specular Gloss," ASTM International, West Conshohocken, PA, 2018, www.astm.org.
ASTM E2001-13, "Standard Guide for Resonant Ultrasound Spectroscopy for Defect Detection in Both Metallic and Non-metallic Parts," ASTM International, West Conshohocken, PA, 2013, www.astm.org.
Cecala, C. et al., "Fourier Optics Modeling of Display Sparkle from Anti-Glare Cover Glass: Comparison to Experimental Data," Imaging and Applied Optics Congress, OSA Technical Digest (Optical Society of America, 2020), paper JW5B.8, 2 pages.
Chou, S.Y. et al., "Imprint of Sub-25 nm Vias and Trenches in Polymers," Appl. Phys. Lett. 67, 3114, 1995, 3 pages.
Cook, R. L., "Stochastic sampling in computer graphics," Computer Graphics (Proceedings of ACM SIGGRAPH 86) 5, 1 (1986), pp. 51-72.
Kelley, E., "Proposed Diffuse Ambient Contrast Measurement Methods for Flat Panel Displays," 2001, NISTIR 6738, National Institute of Standards and Technology, Gaithersburg, Maryland, 7 pages.
Kittel, C., Introduction to Solid State Physics, seventh edition, John Wiley & Sons, Inc., NY, 1996, pp. 611-627.
Liu, B.T. et al., "Strength of the interactions between light-scattering particles and resins affects the haze of anti-glare films," Colloids Surf. A Physicochem. Eng. Aspects 2011, 389, pp. 138-143.
Modified ASTM D5767-18 test protocol, "Standard Test Method for Instrumental Measurement of Distinctness-of-Image (DOI) Gloss of Coated Surfaces using a Rhopoint IQ Gloss Haze & DOI Meter," Rhopoint Instruments Ltd.
Schlömer, T. et al., "Farthest-points optimized point sets with maximized minimum distance," Proc. ACM SIGGRAPH Symposium on high performance graphics: HPG 2011 pp. 135-142.
Shackelford, J.F., Introduction to Materials Science for Engineers, Sixth Edition, Pearson Prentice Hall, New Jersey, 2005, pp. 404-418.
Simonsen, et al., "Haze of random systems: an approximate analytic approach," Phys Rev A 79 063813 (2009), 23 pages.
Stillwell, A. et al., "Perception of Sparkle in Anti-Glare Display Screens," JSID 22(2), 129-136 (2014).
International Search Report and Written Opinion of the International Searching Authority; PCT/US2021/040771; dated Nov. 5, 2021; 11 pages; European Patent Office.
Charles Kittel, "Introduction to Solid State Physics." Seventh Edition, John Wiley & Sons, Inc., NY, 1996, pp. 611-627.
Fischer-Cripps; "Critical Review of Analysis and Interpretation of Nanoindentation Test Date"; Surface & Coatings Technology, 200, 4153-4165 (2006).
Hay et al; "Continuous Stiffness Measurement During Instrumented Indentation Testing"; Experimental Techniques, 34 (3) 86-94 (2010).
James F. Shackelford, "Introduction to Materials Science for Engineers," Sixth Edition, Pearson Prentice Hall, New Jersey, 2005, pp. 404-418.
Smart and Moore; "Solid State Chemistry, an Introduction," Chapman & Hall University and Professional Division, London, 1992, pp. 136-151.

\* cited by examiner

DISPLAY ARTICLES WITH DIFFRACTIVE, ANTIGLARE SURFACES AND THIN, DURABLE ANTIREFLECTION COATINGS

CROSS-REFERENCE TO RELATED APPLICATIONS

This patent application claims the benefit of priority under 35 U.S.C. § 119(e) to U.S. Provisional Patent Application No. 63/049,843, entitled "DISPLAY ARTICLES WITH DIFFRACTIVE, ANTIGLARE SURFACES AND METHODS OF MAKING THE SAME," filed Jul. 9, 2020, the entire disclosure of which is incorporated herein by reference.

The present application relates to, but does not claim priority to, commonly owned and assigned U.S. patent application Ser. No. 17/369,279 (D31977), entitled "FEATURED REGION TO REDUCE SPECULAR REFLECTANCE INCLUDING A LOW REFRACTIVE INDEX SUBSTRATE WITH HIGHER ELEVATED SURFACES AND LOWER ELEVATED SURFACES AND A HIGH REFRACTIVE INDEX MATERIAL DISPOSED ON THE LOWER ELEVATED SURFACES" and filed on Jul. 7, 2021; U.S. patent application Ser. No. 17/369,301 (D31038/32632), entitled "ANTI-GLARE SUBSTRATE FOR A DISPLAY ARTICLE INCLUDING A TEXTURED REGION WITH PRIMARY SURFACE FEATURES AND SECONDARY SURFACE FEATURES IMPARTING A SURFACE ROUGHNESS THAT INCREASES SURFACE SCATTERING" and filed on Jul. 7, 2021; U.S. patent application Ser. No. 17/369,315 (D32630/32632), entitled "TEXTURED REGION OF A SUBSTRATE TO REDUCE SPECULAR REFLECTANCE INCORPORATING SURFACE FEATURES WITH AN ELLIPTICAL PERIMETER OR SEGMENTS THEREOF, AND METHOD OF MAKING THE SAME" and filed on Jul. 7, 2021; and U.S. patent application Ser. No. 17/370,350 (D32623), entitled "DISPLAY ARTICLES WITH ANTIGLARE SURFACES AND THIN, DURABLE ANTIREFLECTION COATINGS" and filed on Jul. 8, 2021. The entire disclosures of each of the foregoing U.S. patent applications, publications and patent documents are incorporated herein by reference.

FIELD

The present disclosure generally relates to display articles with diffractive, antiglare surfaces with thin, durable anti reflective coatings, particularly display articles comprising a substrate with one or more primary surfaces with a diffractive surface region having antiglare characteristics and a multilayer antireflective coating thereon.

BACKGROUND

Antiglare surfaces are often used in display devices such as LCD screens, tablets, smartphones, OLEDs and touch screens to avoid or reduce specular reflection of ambient light. In many display devices, these antiglare surfaces are formed by providing a level of roughness to one or more surfaces of the glass and/or films on the glass to spread and scatter incident light. Antiglare surfaces in the form of a roughened glass surface are often used on the front surfaces of these display devices to reduce the apparent visibility of external reflections from the display and improve readability of the display under differing lighting conditions.

Conventional approaches for imparting antiglare properties on glass substrates employed in display articles have been successful to a certain degree. Typically, these approaches have been used to employ a randomized surface roughness profile in the surfaces of the substrate and/or within films on such substrates. These approaches, however, have resulted in glass substrates and display articles with high haze and/or high display sparkle. The high haze levels can reduce display contrast by scattering high-angle light towards the user, making black levels appear 'washed out'. The high display sparkle levels are unwanted random variations in pixel brightness resulting in a grainy appearance that shifts with viewing angle.

In addition, cover articles are often used to protect devices within electronic products, to provide a user interface for input and/or display, and/or for many other functions. Such products include mobile devices, for example smart phones, smart watches, mp3 players and computer tablets. These display articles may also benefit from some transparency, scratch-resistance, abrasion resistance or a combination thereof. These applications often demand scratch-resistance and strong optical performance characteristics, in terms of maximum light transmittance and minimum reflectance.

These display articles are often used in applications (e.g., mobile devices) with packaging constraints. In particular, many of these applications can significantly benefit from reductions in overall thickness, even reductions of a few percent. In addition, many of the applications that employ such display and non-display articles benefit from low manufacturing cost, e.g., through the minimization of raw material costs, minimization of process complexity and yield improvements. Smaller packaging with optical and mechanical property performance attributes comparable to existing display and non-display articles can also serve the desire for reduced manufacturing cost (e.g., through less raw material costs, through reductions in the number of layers in an anti-reflective structure, reduced process time leading to higher manufacturing throughout and therefore lower capital equipment cost per part, etc.).

The optical performance of cover display articles can be improved by using various anti-reflective coatings; however, known anti-reflective coatings are susceptible to wear or abrasion. Such abrasion can compromise any optical performance improvements achieved by the anti-reflective coating. Abrasion damage can include reciprocating sliding contact from counter face objects (e.g., fingers). In addition, abrasion damage can generate heat, which can degrade chemical bonds in the film materials and cause flaking and other types of damage to the cover glass. Since abrasion damage is often experienced over a longer term than the single events that cause scratches, the coating materials disposed experiencing abrasion damage can also oxidize, which further degrades the durability of the coating.

In view of these considerations, there is a need for display articles and substrates with improved antiglare characteristics that include, but are not limited to, the suppression of specular reflection, low sparkle and low distinctness of image. Further, there is a need for these same display articles to also possess abrasion-resistance and antireflection optical properties.

SUMMARY

According to an aspect of the disclosure, a display article is provided that includes: a substrate comprising a thickness and a primary surface; a diffractive surface region defined by the primary surface; and an antireflective coating disposed on the diffractive surface region defined by the primary surface of the substrate. The diffractive surface region comprises a plurality of structural features that comprises a plurality of different heights in a multimodal distribution. Further, the substrate exhibits a sparkle of less than 4%, as measured by pixel power deviation ($PPD_{140}$) at an incident angle of 0° from normal, and a transmittance haze of less than 40% from an incident angle of 0° from normal. The antireflection coating comprises a plurality of alternating high refractive index and low refractive index layers. Further, each of the low refractive index layers comprises a refractive index of less than or equal to about 1.8, and each of the high refractive index layers comprises a refractive index of greater than 1.8. The article exhibits a first-surface average specular reflectance (% R) of less than 0.2% at an incident angle of 20° from normal in the visible spectrum from about 450 nm to 650 nm. In addition, the article exhibits a maximum hardness of 8 GPa or greater, as measured by a Berkovich Indenter Hardness Test over an indentation depth of 50 nm or greater.

According to another aspect of the disclosure, a display article is provided that includes: a substrate comprising a thickness and a primary surface; a diffractive surface region defined by the primary surface; and an antireflective coating disposed on the diffractive surface region defined by the primary surface of the substrate. The diffractive surface region comprises a plurality of structural features comprising a pitch of less than 125 µm and a fill fraction from 30% to 70%, each structural feature comprising a diameter from 5 µm to 120 µm. Further, the substrate exhibits a sparkle of less than 4%, as measured by pixel power deviation ($PPD_{140}$) at an incident angle of 0° from normal, and a transmittance haze of less than 40% from an incident angle of 0° from normal. The antireflection coating comprises a plurality of alternating high refractive index and low refractive index layers. Further, each of the low refractive index layers comprises a refractive index of less than or equal to about 1.8, and each of the high refractive index layers comprises a refractive index of greater than 1.8. The article exhibits a first-surface average specular reflectance (% R) of less than 0.2% at an incident angle of 20° from normal in the visible spectrum from about 450 nm to 650 nm. In addition, the article exhibits a maximum hardness of 8 GPa or greater, as measured by a Berkovich Indenter Hardness Test over an indentation depth of 50 nm or greater.

According to an aspect of the disclosure, a display article is provided that includes: a substrate comprising a thickness and a primary surface; a diffractive surface region defined by the primary surface; and an antireflective coating disposed on the diffractive surface region defined by the primary surface of the substrate. The diffractive surface region comprises a plurality of structural features comprising a pitch of less than 125 µm and a fill fraction from 30% to 70%. Each structural feature comprises a height or depth from 50 nm to 250 nm. The antireflection coating comprises a plurality of alternating high refractive index and low refractive index layers. Further, each of the low refractive index layers comprises a refractive index of less than or equal to about 1.8, and each of the high refractive index layers comprises a refractive index of greater than 1.8. The article exhibits a first-surface average specular reflectance (% R) of less than 0.2% at an incident angle of 20° from normal in the visible spectrum from about 450 nm to 650 nm. In addition, the article exhibits a maximum hardness of 8 GPa or greater, as measured by a Berkovich Indenter Hardness Test over an indentation depth of 50 nm or greater.

Additional features and advantages will be set forth in the detailed description which follows, and will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the disclosure as it is claimed.

The accompanying drawings are included to provide a further understanding of principles of the disclosure, and are incorporated in, and constitute a part of, this specification. The drawings illustrate one or more embodiment(s) and, together with the description, explain, by way of example, principles and operation of the disclosure. It is to be understood that various features of the disclosure disclosed in this specification and in the drawings can be used in any and all combinations.

BRIEF DESCRIPTION OF THE DRAWINGS

These and other features, aspects and advantages of the present disclosure are better understood when the following detailed description of the disclosure is read with reference to the accompanying drawings, in which.

DETAILED DESCRIPTION

Figure 1A:
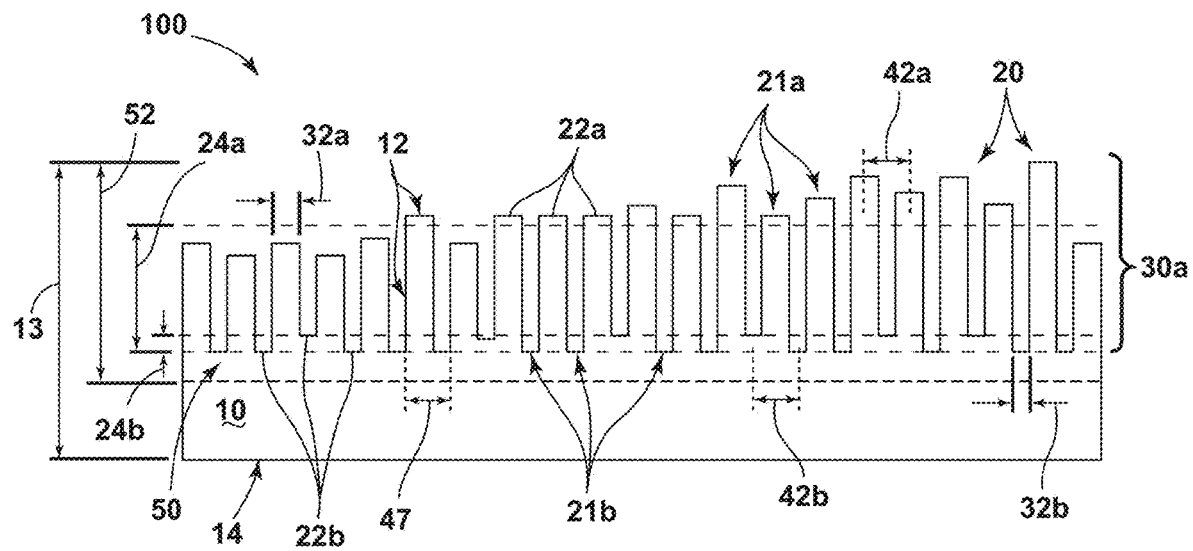
FIG. 1A is a cross-sectional, schematic view of a display article, according to an embodiment of the disclosure.

In the following detailed description, for purposes of explanation and not limitation, example embodiments disclosing specific details are set forth to provide a thorough understanding of various principles of the present disclosure. However, it will be apparent to one having ordinary skill in the art, having had the benefit of the present disclosure, that the present disclosure may be practiced in other embodiments that depart from the specific details disclosed herein. Moreover, descriptions of well-known devices, methods and materials may be omitted so as not to obscure the description of various principles of the present disclosure. Finally, wherever applicable, like reference numerals refer to like elements.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Directional terms as used herein—for example "up," "down," "right," "left," "front," "back," "top," "bottom"—are made only with reference to the figures as drawn and are not intended to imply absolute orientation.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

As used herein, the singular forms "a," "an" and "the" include plural referents unless the context clearly dictates otherwise. Thus, for example, reference to a "component" includes aspects having two or more such components, unless the context clearly indicates otherwise.

As used herein, the "Berkovich Indenter Hardness Test" includes measuring the hardness of a material on a surface thereof by indenting the surface with a diamond Berkovich indenter. The Berkovich Indenter Hardness Test includes indenting the air-side surface 61 of an antireflective coating 60 of a display article 100 of the disclosure (see FIGS. 1C-1E and corresponding description) with the diamond Berkovich indenter to form an indent to an indentation depth in the range from about 50 nm to about 1000 nm (or the entire thickness of the anti-reflective coating or layer, whichever is less) and measuring the hardness from this indentation at various points along the entire indentation depth range, along a specified segment of this indentation depth (e.g., in the depth range from about 100 nm to about 500 nm), or at a particular indentation depth (e.g., at a depth of 100 nm, at a depth of 500 nm, etc.) generally using the methods set forth in Oliver, W. C.; Pharr, G. M., "An improved technique for determining hardness and elastic modulus using load and displacement sensing indentation experiments", *J. Mater. Res.*, Vol. 7, No. 6, 1992, 1564-1583; and Oliver, W. C. and Pharr, G. M, "Measurement of Hardness and Elastic Modulus by Instrument Indentation: Advances in Understanding and Refinements to Methodology", J. Mater. Res., Vol. 19, No. 1, 2004, 3-20. Further, when hardness is measured over an indentation depth range (e.g., in the depth range from about 100 nm to about 500 nm), the results can be reported as a maximum hardness within the specified range, wherein the maximum is selected from the measurements taken at each depth within that range. As used herein, "hardness" and "maximum hardness" both refer to as-measured hardness values, not averages of hardness values. Similarly, when hardness is measured at an indentation depth, the value of the hardness obtained from the Berkovich Indenter Hardness Test is given for that particular indentation depth.

Aspects of the disclosure generally pertain to display articles with a combination of antireflective (AR) and antiglare (AG) optical properties, along with mechanical strength and wear resistance. These display articles advantageously possess lower first surface specular reflectance levels (e.g., lower than 0.08% at 20° incidence from normal) as compared to articles solely with AR or AG properties and characteristics. More particularly, the display articles have one or more diffractive, AG substrate surfaces (e.g., a diffractive surface region with structural features, such as pillars, that comprise different heights in a multimodal distribution) with a thin, durable multilayer AR coating (e.g., with a plurality of alternating low and high refractive index layers). As the diffractive AG surface region can scatter light in both transmission and reflection, it can also reduce the appearance of buried reflections in the display. The multilayer AR coating can be disposed over the diffractive AG surface region of the substrate, creating an overall lower specular reflectance for the combined structure. This approach is complementary because it results in two different, additive optical mechanisms. The diffractive AG surface region lowers specular reflectance through diffractive scattering of specular reflected light into non-specular reflection angles, while the multilayer AR coating reduces specular reflectance through thin film interference. Moreover, these display articles have antiglare properties, such as low pixel power deviation ($PPD_{140}$) (e.g., less than 4%) and low transmitted haze (e.g., less than 40%). Further, the AR coating can enable the article to exhibit a maximum hardness of 8 GPa or greater, as measured by a Berkovich Indenter Hardness Test along an indentation depth of 50 nm or greater.

Additional aspects of the disclosure generally pertain to display articles with diffractive, antiglare surfaces and methods of making the same, particularly display articles comprising a substrate with one or more primary surfaces with a diffractive surface region and antiglare characteristics. In general, the display articles and substrates of the disclosure employ an engineered diffractive surface region with antiglare properties, such as low distinctness of image (DOI), low pixel power deviation ($PPD_{140}$) and low transmitted haze. Each of these antiglare properties is desirable for display applications, and conventional approaches have not achieved this combination of antiglare properties. The diffractive surface regions, according to aspects of the disclosure, possess structural features, such as holes and/or pillars, with a diameter of less than 100 μm, a pitch of less than 125 μm and a fill fraction of 40 to 55%. The diffractive surface regions, as including these holes and/or pillars, can enable the display articles employing them to exhibit a first-surface reflectance DOI of less than 80%, a $PPD_{140}$ of less than 4%, and a transmitted haze of less than 20%. Further, these properties are achievable without the additional presence of any antireflective coating structures over the diffractive surface region. Further, the diffractive surface region, in some embodiments, can have a multimodal distribution (e.g., a bimodal distribution) of surface heights with a height and/or depth of from 120 to 200 nm, which can reduce specular reflectance through diffractive interference.

The display articles of the disclosure, as including a diffractive surface region (and with or without an antireflection coating), offer several advantages over display articles with conventional approaches to achieving antireflective characteristics. For example, the display articles of the disclosure can suppress specular reflectance by a factor of 10× or more using diffractive light scattering, while also achieving a combination of low haze, low sparkle and high mechanical durability. The high mechanical durability is associated with the relatively low aspect ratio of the structural features of the diffractive surface region. In addition, some display articles according to the disclosure employ a diffractive surface region and a multilayer antireflective coating structure to achieve specular reductions of greater than 20×, 50× or even 100×. Another advantage of the display articles of the disclosure is that the planar step-like and semi-planar morphology, together with the controlled structure depths of less than 1 micron, or less than 250 nm, of the diffractive surface region allows them to be easily fabricated with much lower consumption of glass material and etching chemicals (such as HF) compared to conventional etched, antiglare glass substrates, leading to less environmental waste and potential cost benefits. Various processes can be employed to create these structures (e.g., organic mask and etching, organic mask and vapor deposition, organic mask and liquid phase deposited oxide), which can aid in maintaining low manufacturing costs. A further advantage of these display articles is that they can exhibit a combination of antiglare, optical properties not achievable from conventional antiglare approaches. For example, the display articles of the disclosure, as incorporating a diffractive surface region, have achieved a DOI of less than 80%, a $PPD_{140}$ of less than 2% and a haze of less than 5%.

Figure 1B:
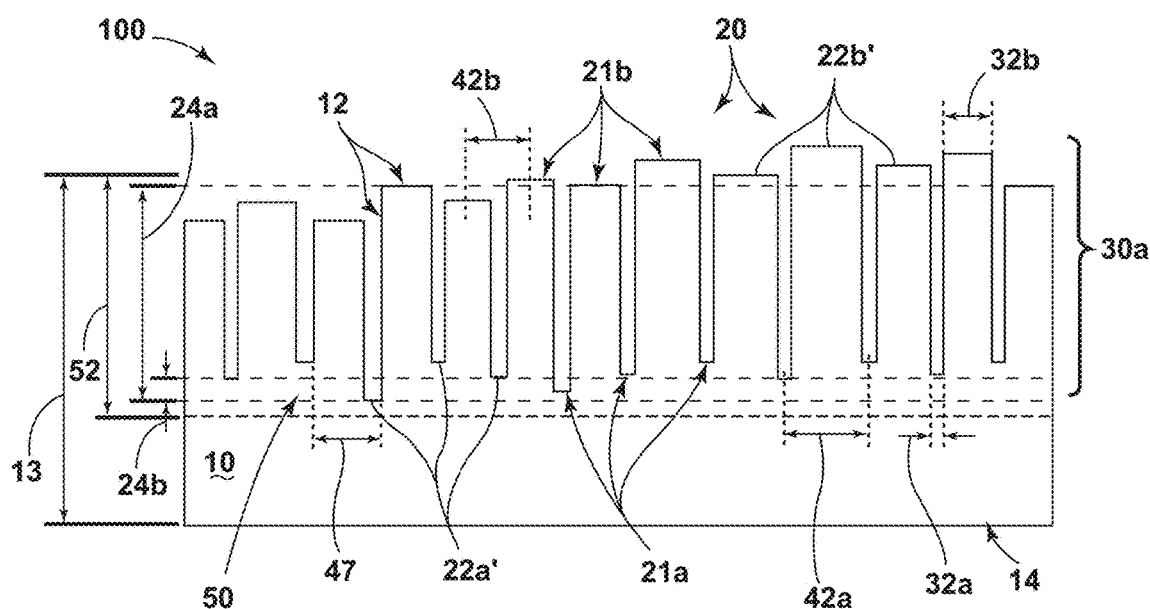
FIG. 1B is a cross-sectional, schematic view of a display article, according to an embodiment of the disclosure.

Referring to FIGS. 1A and 1B, a display article 100 is depicted as including a substrate 10 with a plurality of primary surfaces 12 and 14, and a thickness 13. The primary surface 12 of the substrate 10 also includes a diffractive surface region 30a. Hence, the primary surface 12 has a diffractive surface region 30a defined thereon such that the diffractive surface region 30a is formed from or otherwise part of the substrate 10, as shown in FIG. 1A. In some implementations (not shown), a diffractive surface region 30a can also be defined by the primary surface 14 of the substrate 10. Further, in some implementations, the diffractive surface region 30a is defined by both of primary surfaces 12 and 14. As also depicted in FIG. 1A, the diffractive surface region 30a includes a plurality of structural features 20 that comprises a plurality of different heights and/or depths in a multimodal distribution.

Referring again to the diffractive surface region 30a shown in FIGS. 1A and 1B, it can describe a surface comprised of circular pillars or holes (i.e., the structural features 20) with a fixed set of a few possible discrete height or depth levels above or below the primary surface 12 of the substrate 10. Each feature 20, in some instances, can have a planar top characterized by a single height or depth. These features 20 may have the same or a finite number of different diameters. The placement of the features 20 can be random, but this is by design or otherwise purposely engineered and not a random function of the manufacturing process. The manufacturing process can use some form of precision, engineered masking to produce the designed feature shapes exactly (to within some tolerance). As used herein, a diffractive surface region 30a with a plurality of structural features 20 (as shown in exemplary form in FIGS. 1A and 1B) with a plurality of different heights in a "multimodal distribution" means that diffractive surface region 30a consists primarily of two (e.g., a bimodal distribution), three (e.g., a trimodal distribution), four, five or more distinct and purposely engineered average or primary heights, and each of these average or primary heights consists of distributions whose widths are less than or comparable to the vertical separation between the heights. Referring again to FIGS. 1A and 1B, the exemplary diffractive surface region 30a comprises a plurality of heights and/or depths in a bimodal distribution. Further, as used herein, a "bimodal distribution" means that the diffractive surface region 30a consists primarily of two distinct and purposely engineered average or primary heights, and each of these average or primary heights consists of distributions whose widths are less than or comparable to the vertical separation between the heights.

In embodiments, the plurality of structural features 20 includes pillars and/or holes and these pillars and/or holes make up a multimodal distribution of surface heights and/or depths. According to some implementations, the diffractive surface region 30a can comprise a two-dimensional array of circular, square, hexagonal, polygonal, or irregular structural features 20. Further, these structural features 20 can be arranged in an ordered or a semi-ordered array—essentially, any of various array schemes that are reproducibly fabricated and do not depend on manufacturing process randomness for their function. As such, in some embodiments of the display article 100 depicted in FIGS. 1A and 1B, the diffractive surface region 30a comprises a plurality of structural features 20 that comprises a plurality of different heights in a multimodal distribution and is distributed across the surface region 30a in a semi-ordered or an ordered array.

Referring again to the display article 100 of FIGS. 1A and 1B, the substrate 10 can exhibit a sparkle of less than 4%, as measured by $PPD_{140}$ at an incident angle of 0° from normal. The substrate 10 can also exhibit a DOI of less than 80% at an incident angle of 20° from normal. Further, the substrate 10 of the display article 100 can exhibit a transmittance haze of less than 40% from an incident angle of 0° from normal. Embodiments of the display article 100 depicted in FIGS. 1A and 1B can also exhibit a combination of these optical properties.

According to some implementations of the display article 100 depicted in FIGS. 1A and 1B, the multimodal distribution of the diffractive surface region 30a further includes a first portion of structural features 22a, 22a' at a first average height 24a (or, interchangeably referred to as a first average depth 24a) and a second portion of structural features 22b, 22b' at a second average height 24b (or, interchangeably referred to as a second average depth 24b). According to embodiments of the display article 100, the first portion of structural features 22a, 22a' can be pillars 22a, as shown in exemplary form in FIG. 1A. According to embodiments of the display article 100, the first portion of structural features 22a, 22a' can be holes 22a', as shown in exemplary form in FIG. 1B. According to some of these embodiments, from a structural standpoint, the second portion of structural features 22b, 22b' can be a set of ligaments 22b (e.g., as shown in FIG. 1A situated between the pillars 22a) or mesas 22b' (e.g., as shown in FIG. 1B situated between the holes 22a') between the first portion of structural features 22a, 22a'. According to implementations, the ligaments 22b can be the ligaments, matrixes or other comparable structure between the first portion of the structural features 22a, 22a', when the first portion is configured as pillars 22a. Further, the mesas 22b' can be mesas, plateaus, matrixes or other comparable structure between the first portion of the structural features 22a, 22a', when the first portion is configured as holes 22a'. It should also be understood, however, that the second portion of structural features 22b, 22b', like the first portion of structural features 22a, 22a', includes a distribution of surface heights with a second average height 24b. Further, the first average height 24a of the pillars 22a or the first average depth 24a of the holes 22a', depending on the configuration of the diffractive surface region 30a, can range from about 25 nm to about 300 nm, from about 50 nm to about 250 nm, from about 75 nm to about 225 nm, from about 100 nm to about 200 nm, from about 120 nm to about 180 nm, or from about 130 nm to about 170 nm.

As noted earlier, the display article 100 depicted in FIGS. 1A and 1B includes a substrate 10 with a diffractive surface region 30a that can include a plurality of structural features 20 of different heights in a multimodal distribution. This multimodal distribution can have a plurality of surface height modes, e.g., the distribution may be bimodal (e.g., with a first portion of structural features 22a, 22a' and a second portion of structural features 22b, 22b'), tri-modal, four-modal, five-modal, etc. In embodiments, the diffractive surface region 30a is configured such that each of these modes is characterized by a distinct peak of surface height vs. area fraction within the distribution of surface heights. These peaks may be distinguished by a decrease in area fraction of at least 20%, at least 50% or at least 80% from the peak surface height value between the distinct peaks associated with each of the modes. Further, the peaks of each of the modes may have a varying width, and the area fraction does not need to drop to zero between the peaks of the distribution. In some embodiments, however, the area fraction for heights in between each of the peaks on a surface height vs. area chart may drop to zero or close to zero.

Referring again to the display article 100 depicted in FIGS. 1A and 1B, the multimodal distribution of the diffractive surface region 30a can be further characterized such that the difference between the first average height 24a and the second average height 24b is from about 25 nm to about 300 nm, from about 50 nm to about 250 nm, from about 75 nm to about 225 nm, from about 100 nm to about 200 nm, from about 120 nm to about 200 nm, from about 120 nm to about 180 nm, from about 130 nm to about 170 nm, or from about 140 nm to about 180 nm. For example, the difference between the first average height 24a and the second average height 24b can be about 25 nm, 50 nm, 75 nm, 100 nm, 120 nm, 125 nm, 140 nm, 150 nm, 175 nm, 180 nm, 200 nm, 225 nm, 250 nm, 275 nm, 300 nm, and all height differences between the foregoing levels. In some embodiments, the difference between the first average height 24a and the second average height 24b may be in a range that corresponds to about ¼ of the wavelength of visible light in air, or odd multiples of the ¼ of the wavelength of visible light.

Referring again to the display article 100 depicted in FIGS. 1A and 1B, embodiments are configured such that the diffractive surface region 30a includes a first planar region 21a that corresponds to the first average height 24a of the first portion of structural features 22a, 22a' and a second planar region 21b that corresponds to the second average height 24b of the second portion of structural features 22b, 22b'. That is, each of the first and second planar regions 21a and 21b, respectively, is planar in the sense that these regions have close to the same surface height (i.e., within one mode of the surface height vs. area fraction distribution of the surface heights of the plurality of structural features 20). Further, each of these planar regions 21a and 21b can be characterized by a surface height variation (or roughness) within the planar region of less than 50 nm root-mean-square (RMS) variation, less than 20 nm RMS, less than 10 nm RMS, less than 5 nm RMS, less than 2 nm RMS, or less than 1 nm RMS. For example, each of these planar regions 21a and 21b can be characterized by a surface height variation from 0.1 nm RMS to 50 nm RMS, from 0.1 nm RMS to 20 nm RMS, from 0.1 nm RMS to 10 nm RMS, or from 0.1 nm RMS to 1 nm RMS. Further, according to some embodiments, the planar regions 21a and 21b can also include individual sub-regions or domains (not shown) having an average area within each domain of greater than 5 μm², greater than 10 μm², greater than 20 μm², greater than 50 μm², or greater than 100 μm².

According to some embodiments of the display article 100 depicted in FIGS. 1A and 1B, as noted earlier, the diffractive surface region 30a can include two or more planar regions (e.g., first and second planar regions 21a and 21b). Further, each of these planar regions (e.g., plateaus, mesas, etc.) can be substantially planar, meaning that more than 50%, more than 80%, or more than 90% of the diffractive surface region 30a is planar. In some embodiments, the total surface area of the first and second planar regions 21a and 21b is at least 50%, at least 60%, at least 70%, at least 80%, or at least 90% of a total surface area of the diffractive surface region 30a.

According to implementations of the display article 100 depicted in FIGS. 1A and 1B, the article is characterized by a low level of sparkle. In general, the diffractive surface region 30a associated with the substrate 10 of these articles can produce light deflections leading to an image artifact called "sparkle". Display "sparkle" or "dazzle" is a generally undesirable side effect that can occur when introducing antiglare or light scattering surfaces into a pixelated display system such as, for example, an LCD, an OLED, touch screens, or the like, and differs in type and origin from the type of "sparkle" or "speckle" that has been observed and characterized in projection or laser systems. Sparkle is associated with a very fine grainy appearance of the display and may appear to have a shift in the pattern of the grains with changing viewing angle of the display, Display sparkle may be manifested as bright and dark or colored spots at approximately the pixel-level size scale.

As used herein, the terms "pixel power deviation" and "$PPD_{140}$" refer to the quantitative measurement for display sparkle. Further, as used herein, the term "sparkle" is used interchangeably with "pixel power deviation" and "$PPD_{140}$." $PPD_{140}$ is calculated by image analysis of display pixels according to the following procedure. A grid box is drawn around each LCD pixel. The total power within each grid box is then calculated from charge-coupled device (CCD) camera data and assigned as the total power for each pixel. The total power for each LCD pixel thus becomes an array of numbers, for which the mean and standard deviation may be calculated. The $PPD_{140}$ value is defined as the standard deviation of total power per pixel divided by the mean power per pixel (times TOO). The total power collected from each LCD pixel by the eye simulator camera is measured and the standard deviation of total pixel power ($PPD_{140}$) is calculated across the measurement area, which typically comprises about 30×30 LCD pixels.

The details of a measurement system and image processing calculation that are used to obtain $PPD_{140}$ values are described in U.S. Pat. No. 9,411,180 entitled "Apparatus and Method for Determining Sparkle," the salient portions of which that are related to PPD measurements are incorporated by reference herein in their entirety. Further, unless otherwise noted, the SMS-1000 system (Display-Messtechnik & Systeme GmbH & Co. KG) is employed to generate and evaluate the $PPD_{140}$ measurements of this disclosure. The $PPD_{140}$ measurement system includes: a pixelated source comprising a plurality of pixels (e.g., a Lenovo Z50 140 ppi laptop), wherein each of the plurality of pixels has referenced indices i and j; and an imaging system optically disposed along an optical path originating from the pixelated source. The imaging system comprises: an imaging device disposed along the optical path and having a pixelated sensitive area comprising a second plurality of pixels, wherein each of the second plurality of pixels are referenced with indices in and n; and a diaphragm disposed on the optical path between the pixelated source and the imaging device, wherein the diaphragm has an adjustable collection angle for an image originating in the pixelated source. The image processing calculation includes: acquiring a pixelated image of the transparent sample, the pixelated image comprising a plurality of pixels; determining boundaries between adjacent pixels in the pixelated image; integrating within the boundaries to obtain an integrated energy for each source pixel in the pixelated image; and calculating a standard deviation of the integrated energy for each source pixel, wherein the standard deviation is the power per pixel dispersion. As used herein, all "$PPD_{140}$" and "sparkle" values, attributes and limits are calculated and evaluated with a test setup employing a display device having a pixel density of 140 pixels per inch (PPI) (also referred herein as "$PPD_{140}$").

According to some implementations of the display article 100 shown in FIGS. 1A and 1B, the substrate 10 exhibits a sparkle of less than 4%, 3.5%, 3%, 2.5%, 2%, 1.5%, 1%, 0.5%, and all sparkle threshold values between the foregoing levels, as measured by $PPD_{140}$ at an incident angle of 0° from normal with a 140 ppi LCD display. For example, the substrate 10 can exhibit a sparkle of 3.5%, 3.25%, 3%, 2.75%, 2.5%, 2.25%, 2%, 1.75%, 1.5%, 1.25%, 1%, 0.75%, 0.5%, and all sparkle values between the foregoing levels, as measured by $PPD_{140}$ at an incident angle of 0° from normal.

Referring again to the display article 100 depicted in FIGS. 1A and 1B, the article can also be configured for optimal antiglare performance, as manifested by low distinctness of image (DOI) values. As used herein, "DOI" is equal to $100*(R_s-R_{0.3}°)/R_s$, where $R_s$ is the specular reflectance flux measured from incident light (at 20° from normal) directed onto the diffractive surface region 30a of the display article 100 of the disclosure and $R_{0.3}°$ is the reflectance flux measured from the same incident light at 0.3° from the specular reflectance flux, $R_s$. Unless otherwise noted, the DOI values and measurements reported in this disclosure are obtained according to the ASTM D5767-18, entitled "Standard Test Method for Instrumental Measurement of Distinctness-of-Image (DOI) Gloss of Coated Surfaces using a Rhopoint IQ Gloss Haze & DOI Meter" (Rhopoint Instruments Ltd.). According to some embodiments of the display article 100 shown in FIGS. 1A and 1B, the substrate 10 exhibits a DOI of less than 90%, 85%, 80%, 75%, 70%, 65%, 60%, 55%, 50%, 45%, 40%, and all DOI threshold values between the foregoing levels, as measured at an incident angle of 20° from normal. For example, the substrate 10 can exhibit a DOI of 87.5%, 85%, 82.5%, 80%, 77.5%, 75%, 72.5%, 70%, 67.5%, 65%, 62.5%, 60%, 57.5%, 55%, 52.5%, 50%, 47.5%, 45%, 42.5%, 40%, and all DOI values between the foregoing levels, as measured at an incident angle of 20° from normal.

As used herein, the terms "transmission haze" and "haze" refer to the percentage of transmitted light scattered outside an angular cone of about ±2.5° in accordance with ASTM D1003, entitled "Standard Test Method for Haze and Luminous Transmittance of Transparent Plastics," the contents of which are incorporated by reference herein in their entirety. For an optically smooth surface, transmission haze is generally close to zero. According to implementations of the display article 100 depicted in FIGS. 1A and 1B, the articles can be characterized by a haze of less than 20%. According to implementations of the display article 100 shown in FIGS. 1A and 1B, the substrate 10 can also exhibit a transmittance haze of less than 40%, 35%, 30%, 25%, 20%, 15%, 10%, 5%, and all haze threshold values between the foregoing levels, as measured at an incident angle of 0° from normal. As an example, the substrate 10 can exhibit a transmittance haze of 38%, 36%, 34%, 32%, 30%, 28%, 26%, 24%, 22%, 20%, 18%, 17%, 16%, 15%, 14%, 13%, 12%, 11%, 10%, 9%, 8%, 7%, 6%, 5%, 4%, 3%, 2%, 1%, and all haze values between the foregoing levels, as measured at an incident angle of 0° from normal.

According to some implementations of the display article 100 depicted in FIGS. 1A and 1B, the diffractive surface region 30a of the substrate 10 can effect a reduction in specular reflectance (Rs) and absolute specular reflectance (% R). As used herein, "specular reflectance (Rs)" is defined as the total reflected light from the first surface of the substrate 10 (e.g., primary surface 12) within a cone of angles of +/−0.1°, or as the peak intensity of light within this specular angular range. Further, the Rhopoint IQ meter reports an Rs value in gloss units that is normalized to a maximum of 100 for a flat glass having an index of 1.567 illuminated at 20° angle of incidence and no back-surface reflectance. As such a glass is known to have a first-surface absolute specular reflectance (% R) of 4.91%, Rs values in gloss units (GU) reported by the Rhopoint IQ meter can be converted to an absolute specular reflectance (% R) by multiplying by a factor of 4.91/100. As such, implementations of the display article 100 are configured such that they exhibit a reduction in the specular reflectance (Rs) or absolute specular reflectance (% R) by a factor of 2, a factor of 4, a factor of 5, or a factor of 10 or more as compared to the same surface of a substrate, but lacking the diffractive surface region 30a. In embodiments, the substrate 10 (e.g., a glass composition having a refractive index of about 1.51), as including the diffractive surface region 30a, can exhibit a first-surface absolute specular reflectance (% R) of less than 2%, less than 1.5%, less than 1%, less than 0.8%, less than 0.6%, less than 0.5%, less than 0.4%, or even less than 0.25%, as measured at an incident angle of 20° from normal, at wavelengths between 450 nm and 650 nm.

Figure 1C:
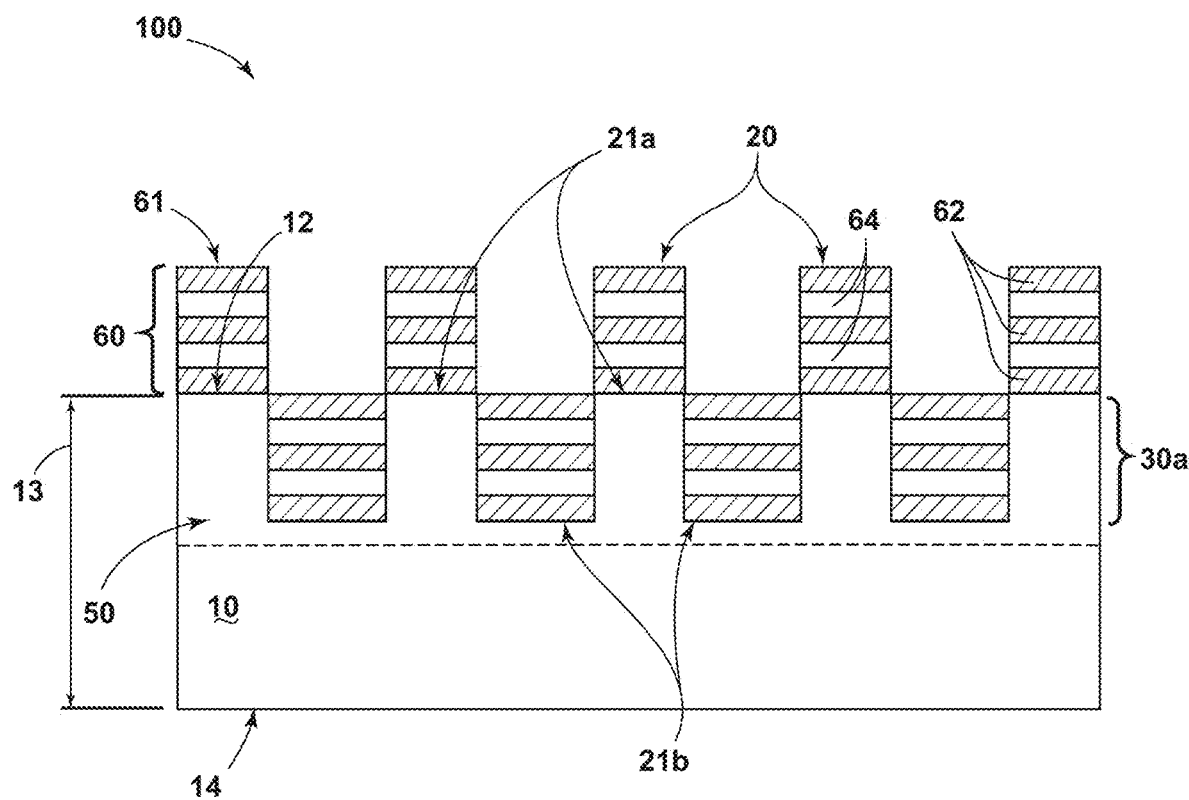
FIG. 1C is a cross-sectional, schematic view of a display article with an antireflective coating, according to an embodiment of the disclosure.

Referring now to FIG. 1C, a display article 100 is depicted with the same features and attributes as the display article 100 shown in FIGS. 1A and 1B, with like-numbered elements having substantially the same functions and structures. Further, the display article 100 depicted in FIG. 1C employs an antireflective coating 60 disposed on the primary surface 12 of the substrate 10, to further improve the antiglare effect of the display article 100. In embodiments, the display article 100, as depicted in FIG. 1C with an antireflective coating 60, is particularly beneficial for end use applications requiring transmittance and some degree of transmitted scattering (e.g., for display devices that include features that result in subsurface reflectance such as touch sensor layers, thin film transistor layers, indium-tin-oxide layers, and other subsurface features). In embodiments, the antireflective coating 60 is configured according to a multilayer antireflective coating or film structure, as prepared to effect antiglare, optical properties for the article employing it. As an example, the antireflective coating 60 includes a plurality of alternating low refractive index and high refractive index layers 62 and 64, respectively. In some implementations, the antireflective coating 60 can have a total of three (3) to nine (9) layers, three (3) to six (6) layers, three (3) to five (5) layers, e.g., 3 layers, 4 layers, 5 layers, 6 layers, 7 layers, 8 layers or 9 layers in total. Further, each of the low index layers 62 comprises a refractive index of less than or equal to about 1.8 and about the same or greater than a refractive index of the substrate 10; and each of the high refractive index layers 64 comprises a refractive index that is greater than 1.8. In this configuration, the display article 100 can exhibit a first-surface absolute specular reflectance (% R) of less than 0.5%, less than 0.4%, less than 0.3%, less than 0.2%, or even less than 0.1%, as measured at an incident angle of 0-20° from normal. Further, according to some embodiments, the display article 100 can exhibit a first-surface absolute specular reflectance (% R) of less than 0.5%, less than 0.4%, less than 0.3%, less than 0.2%, or even less than 0.1%, as measured at an incident angle of 0-20° from normal at one or more wavelengths between 450 nm and 650 nm.

The antiglare effects afforded by the addition of the antireflective coating 60 in the display article 100 shown in FIG. 1C should be approximately additive in a proportional sense. That is, the diffractive surface region 30a of a display article 100 shown in FIGS. 1A and 1B can lower the specular reflectance of the primary surface 12 of the substrate 10 by a factor of 10, and the addition of the antireflective coating 60 can further lower the specular reflectance by a factor of 10, leading to a reduction in the specular reflectance of the display article 100 of FIG. 1C of about a factor of 100. As such, it is believed that the display article 100, as configured according to FIG. 1C, can, according to some embodiments, exhibit a first-surface absolute specular reflectance (% R) of less than 0.1%, less than 0.08%, less than 0.06%, less than 0.05%, less than 0.04%, or even less than 0.025%, as measured at an incident angle of 0-20° from normal at one or more wavelengths between 450 nm and 650 nm.

In an exemplary embodiment, as shown in FIG. 1C, a low refractive index layer 62 of the antireflective coating 60 is disposed directly on the diffractive surface region 30a of the primary surface 12 of the substrate 10. Further, according to the embodiment shown in FIG. 1C, a low refractive index layer 62 is disposed as the top-most layer of the display article 100 and the antireflective coating 60 has a total of five (5) layers, i.e., a multilayer structure with five (5) low and high refractive index layers: 62/64/62/64/62. Suitable materials for the low refractive index layer 62 include: $SiO_2$, $Al_2O_3$, $GeO_2$, $SiO_x$, $AlO_xN_y$, $SiO_xN_y$, $SiAl_yO_xN_y$, $MgO$ and $MgAl_2O_4$. Suitable materials for the high refractive index layer 64 include: $Al_2O_3$, $AlO_xN_y$, $SiO_xN_y$, $SiAl_yO_xN_y$, $AlN$, $SiN_x$, $Si_3N_4$, $Nb_2O_5$, $Ta_2O_5$, $HfO_2$, $TiO_2$, $ZrO_2$, $Y_2O_3$, and diamond-like carbon. Further, the thicknesses of each of the low and high index layers 62 and 64 can range from about 1 nm to about 250 nm and the total thickness of the antireflective coating 60 can range from about 5 nm to about 3000 nm, 5 nm to 2500 nm, 5 nm to 2000 nm, from 5 nm to 1500 nm, from 5 nm to 1000 nm, from 5 nm to 750 nm, from 5 nm to 500 nm, from 5 nm to 450 nm, from 5 nm to 400 nm, from 5 nm to 350 nm, from 5 nm to 300 nm, from 5 nm to 275 nm, from 5 nm to 260 nm, from 5 nm to 250 nm, from 100 nm to 500 nm, from 100 nm to 400 nm, from 100 nm to 350 nm, from 100 nm to 300 nm, from 100 nm to 275 nm, from 100 nm to 250 nm, from 200 nm to 500 nm, from 200 nm to 400 nm, from 200 nm to 350 nm, from 200 nm to 300 nm, from 200 nm to 275 nm, from 200 nm to 250 nm, from 250 nm to 350 nm, from 250 nm to 340 nm, and all thickness values within the foregoing ranges.

According to some embodiments of the display article 100 depicted in FIG. 1C, the antireflection coating 60 can be configured with a scratch resistant layer. In some embodiments, the scratch resistant layer can be the farthest, middlemost or lowest high refractive index layer 64 from the substrate 10. In some implementations, the scratch resistant layer is the thickest high refractive index layer 64 in the antireflection coating 60 and may also comprise one of $Si_3N_4$, $SiN_x$ and $SiO_xN_y$. The scratch resistant layer can also have a physical thickness from 50 nm to 2000 nm, from 50 nm to 1000 nm, from 50 nm to 500 nm, from 50 nm to 400 nm, from 50 nm to 300 nm, from 50 nm to 200 nm, 50 nm to 150 nm, 75 nm to 175 nm, 100 nm to 160 nm, and all thickness values within the foregoing ranges.

According to an implementation of the display article 100 depicted in FIG. 1C, the structure of the antireflection coating 60 can be configured with a design as listed below in Table 1A. In this implementation, the antireflection coating 60 has a total thickness of 260.5 nm, and employs a scratch resistant layer with a thickness of 105.9 nm and a $SiO_xN_y$ composition.

TABLE 1A

| Layer | Material | Refractive Index (@ 550 nm) | Extinction Coefficient (@ 550 nm) | Thickness (nm) |
|---|---|---|---|---|
| Air | | 1.000 | 0 | |
| 1 | $SiO_2$ | 1.461 | 0 | 85.9 |
| 2 | $SiO_xN_y$ | 1.997 | 3.6e−4 | 105.9 |
| 3 | $SiO_2$ | 1.461 | 0 | 22.3 |
| 4 | $SiO_xN_y$ | 1.997 | 3.6e−4 | 21.4 |
| 5 | $SiO_2$ | 1.461 | 0 | 25.00 |
| Substrate | ion-exchanged strengthened glass | 1.510 | | |
| Total Thickness | | | | 260.5 |

According to another implementation of the display article 100 depicted in FIG. 1C, the structure of the antireflection coating 60 can be configured with a design as listed below in Table 1B. In this implementation, the antireflection coating 60 has a total thickness of 338.4 nm, and employs a scratch resistant layer with a thickness of 158.5 nm and a $SiN_x$ composition.

TABLE 1B

| Layer | Material | Refractive Index (@ 550 nm) | Extinction Coefficient (@ 550 nm) | Thickness (nm) |
|---|---|---|---|---|
| Air | | 1.000 | 0 | |
| 1 | $SiO_2$ | 1.471 | 0 | 94.6 |
| 2 | $SiN_x$ | 2.028 | 0.00057 | 158.5 |
| 3 | $SiO_2$ | 1.456 | 0 | 37.2 |
| 4 | $SiN_x$ | 2.041 | 0.00057 | 23.1 |
| 5 | $SiO_2$ | 1.449 | 0 | 25.0 |
| Substrate | ion-exchange strengthened glass | 1.508 | | |
| Total Thickness | | | | 338.4 |

According to a further implementation of the display article 100 depicted in FIG. 1C, the structure of the antireflection coating 60 can be configured with a design as listed below in Table 1C. In this implementation, the antireflection coating 60 has a total thickness of 301.48 nm, and employs a scratch resistant layer with a thickness of 135.0 nm and a $SiN_x$ composition.

TABLE 1C

| Layer | Material | Refractive Index (@ 550 nm) | Thickness (nm) |
|---|---|---|---|
| Air | | 1 | |
| 1 | $SiO_2$ | 1.477 | 87.7 |
| 2 | $SiN_x$ | 2.041 | 135.0 |
| 3 | $SiO_2$ | 1.477 | 38.6 |
| 4 | $SiN_x$ | 2.041 | 15.2 |
| 5 | $SiO_2$ | 1.477 | 25.0 |
| Substrate | ion-exchanged, strengthened glass | 1.506 | |
| Total thickness | | | 301.48 |

According to a further implementation of the display article 100 depicted in FIG. 1C, the structure of the antireflection coating 60 can be configured with a design as listed below in Table 1D. In this implementation, the antireflection coating 60 has a total thickness of 295.5 nm, and employs a scratch resistant layer with a thickness of 128.0 nm and a $SiN_x$ composition.

TABLE 1D

| Layer | Material | Refractive Index (@ 550 nm) | Thickness (nm) |
|---|---|---|---|
| Air | | 1 | |
| 1 | $SiO_2$ | 1.465 | 90.4 |
| 2 | $SiN_x$ | 2.043 | 128.0 |
| 3 | $SiO_2$ | 1.465 | 37.8 |
| 4 | $SiN_x$ | 2.043 | 14.4 |
| 5 | $SiO_2$ | 1.465 | 25.0 |
| Substrate | ion-exchanged, strengthened glass | 1.506 | |
| Total thickness | | | 295.5 |

Referring again to the display article 100 shown in FIG. 1C, in this configuration, the display article 100 can exhibit a first-surface average visible specular (or average photopic specular, as understood by those with skill in the field of the disclosure) reflectance (% R) of less than 1%, 0.9%, 0.8%, 0.7%, 0.6% 0.5%, less than 0.4%, less than 0.3%, less than 0.2%, less than 0.15%, less than 0.1%, or even less than 0.8%, as measured at any incident angle from about 5° to 20° from normal and detected with an angular aperture (in angular range) of +/−0.1 degrees in the visible spectrum from about 450 nm to 650 nm. Further, according to some embodiments, the display article 100 can exhibit a first-surface average specular (or average photopic specular) reflectance (% R) of less than 1%, 0.9%, 0.8%, 0.7%, 0.6%, 0.5%, less than 0.4%, less than 0.3%, less than 0.2%, or even less than 0.1%, as measured at an incident angle from about 5° to 20° from normal at wavelengths from 450 nm to 650 nm.

In some implementations, the first-surface specular reflectance of the display article 100 shown in FIG. 1C can be evaluated using a Rhopoint IQ Goniophotometer instrument to obtain specular reflectance value report levels (Rspec or Rs) in a small aperture range of +/−0.1 degrees (e.g., as compared to +/−2 degrees for other common instruments). This small angular aperture provides better resolution of specular and non-specular reflected light. In these embodiments, the display article 100 can exhibit specular reflectance value report levels (Rspec) of less than 5, less than 4, less than 3, or even less than 2. In some embodiments, the Rspec values measured from the display articles 100 using a Rhopoint IQ Goniophotometer can be normalized to obtain the average specular (or average photopic specular) reflectance (% R) ranges and levels reported above through multiplying by the previously mentioned conversion factor of 4.91/100. Thus, Rspec*4.91/100=% R.

In other implementations, the reflectance levels of the display article 100 of FIG. 1C can be characterized through gloss measurements, which also can be conducted with a Rhopoint IQ instrument. In some embodiments, the display article 100 can exhibit gloss levels of less than 10, or less than 5, as measured at 20° incidence, which correspond to reflectance (% R) values of less than 0.5%, or less than 0.25%, at 20° incidence with +/−0.9° angular acceptance. In some embodiments, the display article 100 can exhibit gloss levels of less than 45, less than 40, or less than 35, as measured at 60° incidence, which correspond to reflectance (% R) values of less than 2.25%, less than 2%, or less than 1.75%, at 60° incidence with +/−2.2° angular acceptance.

The display article 100 shown in FIG. 1C can also exhibit sparkle of less than 5%, as measured by pixel power deviation ($PPD_{140}$) at an incident angle of 0° from normal, according to some embodiments. In some implementations, the display article 100 shown in exemplary form in FIG. 1D can exhibit sparkle levels of less than 4%, 3.5%, 3%, 2.5%, 2%, 1.5%, 1%, or 0.5%, as measured by pixel power deviation ($PPD_{140}$) at an incident angle of 0° from normal. In some aspects, the display article 100 of FIG. 1D exhibits sparkle levels from 5% to 0.1%, from 5% to 0.5%, from 5% to 1%, and all sparkle levels in the foregoing ranges.

With further regard to the display article 100 shown in FIG. 1C, the article can exhibit a two-surface transmittance level of greater than 90%, 91%, 92%, 93%, 94%, or even 95%. These two-surface transmittance levels are reported for display articles 100 with one antireflection coating 60 disposed on the diffractive surface region 30a, as defined with the primary surface 12 of the substrate 10. The other primary surface 14 of the substrate 10 remains bare, and has an intrinsic reflectance of about 4%, meaning that the maximum possible two-surface transmittance for these display articles 100 is about 96%.

Referring again to the display article 100 of FIG. 1C, the article can exhibit transmittance haze values of less than 40%, according to embodiments. In some implementations, the display article 100 shown in exemplary form in FIG. 1C can exhibit transmittance haze levels of less than 40%, 35%, 30%, 25%, 20%, 15%, 10%, or 5%. For example, the display article 100 can exhibit transmittance haze levels of about 40%, 37.5%, 35%, 32.5%, 30%, 27.5%, 25%, 22.5%, 20%, 17.5%, 15%, 12.25%, 10%, 7.5%, 5%, 1%, and all transmittance haze values between the foregoing levels. In some embodiments, the display article 100 of FIG. 1C can exhibit transmittance haze levels from 50% to 0.5%, 50% to 1%, 50% to 5%, 40% to 0.5%, 40% to 1%, 40% to 5%, 30% to 0.5%, 30% to 1%, 30% to 5%, 20% to 0.5%, 20% to 1%, 20% to 5%, 10% to 0.5%, 10% to 1%, and all transmittance haze values in the foregoing ranges. In some embodiments, the display article 100 of FIG. 1C can exhibit reflected haze levels of less than 30%, less than 25%, less than 20%, less than 10%, or even less than 8%. For example, such display articles 100 can exhibit a reflected haze level of 29%, 28%, 27%, 26%, 25%, 22.5%, 20%, 15%, 10%, 8%, 6%, 4%, 2%, and all reflected haze values between the foregoing levels.

The display article 100 shown in FIG. 1C can also exhibit distinctness of image (DOI) levels of 95% or less, 90% or less, or even 80% or less, as measured at an incident angle of 20° from normal. In some implementations, the display article 100 shown in exemplary form in FIG. 1C can exhibit DOI levels of less than 99%, 95%, 90%, 85%, 80%, 75%, 70%, 65%, 60%, or 55%, as measured at an incident angle of 20° from normal. In some aspects, the display article 100 of FIG. 1C exhibits DOI levels from 99% to 40%, from 99% to 50%, from 95% to 40%, from 95% to 50%, from 90% to 40%, from 90% to 50%, from 85% to 40%, from 85% to 50%, from 80% to 40%, and from 80% to 50%, and all DOI levels in the foregoing ranges.

Referring again to the display articles 100 depicted in FIG. 1C, each of these articles, according to some embodiments, can exhibit a maximum hardness of 8 GPa or greater as measured on the air-side surface 61 of the antireflection coating 60 by a Berkovich Indenter Hardness Test along an indentation depth of 50 nm or greater. In some implementations, the display article 100 can exhibit a maximum hardness level of 8 GPa, 9 GPa, 10 GPa, 11 GPa, 12 GPa, 13 GPa, 14 GPa, 15 GPa, 16 GPa, 17 GPa, 18 GPa, 19 GPa, 20 GPa, or even higher values, or any maximum hardness value between the foregoing levels, as measured with a Berkovich Indenter Hardness Test along an indentation depth of 50 nm or greater, or 100 nm or greater. Preferred ranges of the maximum hardness of the antireflection coating 60 are greater than 8 GPa, 9 GPa, 10 GPa, 11 GPa, or even greater than 12 GPa, with a total thickness of the coating being less than 500 nm, less than 400 nm, less than 350 nm, or even less than 300 nm.

Referring again to FIGS. 1A-1C, the substrate 10 of the display article 100 can be configured with a multi-component glass composition having about 40 mol % to 80 mol % silica and a balance of one or more other constituents, e.g., alumina, calcium oxide, sodium oxide, boron oxide, etc. In some implementations, the bulk composition of the substrate 10 is selected from the group consisting of aluminosilicate glass, a borosilicate glass and a phosphosilicate glass. In other implementations, the bulk composition of the substrate 10 is selected from the group consisting of aluminosilicate glass, a borosilicate glass, a phosphosilicate glass, a soda lime glass, an alkali aluminosilicate glass, and an alkali aluminoborosilicate glass. In further implementations, the substrate 10 is a glass-based substrate, including, but not limited to, glass-ceramic materials that comprise a glass component at about 90% or greater by weight and a ceramic component. In other implementations of the display article 100, the substrate 10 can be a polymer material, with durability and mechanical properties suitable for the development and retention of the diffractive surface region 30a.

In one embodiment of the display article 100 depicted in FIGS. 1A-1C, the substrate 10 has a bulk composition that comprises an alkali aluminosilicate glass that comprises alumina, at least one alkali metal and, in some embodiments, greater than 50 mol % $SiO_2$, in other embodiments, at least 58 mol % $SiO_2$, and in still other embodiments, at least 60 mol % $SiO_2$, wherein the ratio ($Al_2O_3$ (mol %)+$B_2O_3$ (mol %))/Σ alkali metal modifiers (mol %)>1, where the modifiers are alkali metal oxides. This glass, in particular embodiments, comprises, consists essentially of, or consists of: about 58 mol % to about 72 mol % $SiO_2$; about 9 mol % to about 17 mol % $Al_2O_3$; about 2 mol % to about 12 mol % $B_2O_3$; about 8 mol % to about 16 mol % $Na_2O$; and 0 mol % to about 4 mol % $K_2O$, wherein the ratio ($Al_2O_3$ (mol %)+$B_2O_3$ (mol)/Σ alkali metal modifiers (mol %)>1, where the modifiers are alkali metal oxides.

In another embodiment of the display article 100, as shown in FIGS. 1A-1C, the substrate 10 has a bulk composition that comprises an alkali aluminosilicate glass comprising, consisting essentially of, or consisting of: about 61 mol % to about 75 mol % $SiO_2$; about 7 mol % to about 15 mol % $Al_2O_3$; 0 mol % to about 12 mol % $B_2O_3$; about 9 mol % to about 21 mol % $Na_2O$; 0 mol % to about 4 mol % $K_2O$; 0 mol % to about 7 mol % MgO; and 0 mol % to about 3 mol % CaO.

In yet another embodiment, the substrate 10 has a bulk composition that comprises an alkali aluminosilicate glass comprising, consisting essentially of, or consisting of: about 60 mol % to about 70 mol % $SiO_2$; about 6 mol % to about 14 mol % $Al_2O_3$; 0 mol % to about 15 mol $B_2O_3$; 0 mol % to about 15 mol $Li_2O$; 0 mot % to about 20 mol % $Na_2O$; 0 mol % to about 10 mol % $K_2O$; 0 mol % to about 8 mol % MgO; 0 mol % to about 10 mol % CaO; 0 mol % to about 5 mol % $ZrO_2$; 0 mol % to about 1 mol % $SnO_2$; 0 mol % to about 1 mol % $CeO_2$; less than about 50 ppm $As_2O_3$; and less than about 50 ppm $Sb_2O_3$; wherein 12 mol %≤$Li_2O$+$Na_2O$+$K_2O$≤20 mol % and 0 mol %≤MgO+Ca≤1.0 mol %.

In still another embodiment, the substrate 10 has a bulk composition that comprises an alkali aluminosilicate glass comprising, consisting essentially of, or consisting of: about 64 mol to about 68 mol % $SiO_2$; about 12 mol % to about 16 mol % $Na_2O$; about 5 mol % to about 12 mol % $Al_2O_3$; 0 mol % to about 3 mol % $B_2O_3$; about 2 mol % to about 5 mol % $K_2O$; about 4 mol % to about 6 mol % MgO; and 0 mol % to about 5 mol % CaO, wherein: 66 mol %≤$SiO_2$+$B_2O_3$+CaO≤69 mol %; $Na_2O$+$K_2O$+$B_2O_3$+MgO+CaO+SrO>10 mol %; 5 mol %≤MgO+CaO+SrO≤8 mol %; ($Na_2O$+$B_2O_3$)—$Al_2O_3$≤2 mol %; 2 mol %≤$Na_2O$—$Al_2O_3$≤6 mol %; and 4 mol %≤($Na_2O$+$K_2O$)—$Al_2O_3$≤10 mol %.

In other embodiments, the substrate 10 has a bulk composition that comprises $SiO_2$, $Al_2O_3$, $P_2O_5$, and at least one alkali metal oxide ($R_2O$), wherein 0.75>[($P_2O_5$ (mol %)+$R_2O$ (mol %))/$M_2O_3$ (mol %)]≤1.2, where $M_2O_3$=$Al_2O_3$+$B_2O_3$. In some embodiments, [($P_2O_5$ (mol %)±$R_2O$ (mol %))/$M_2O_3$ (mol %)]=1 and, in some embodiments, the glass does not include $B_2O_3$ and $M_2O_3$=$Al_2O_3$. The substrate 10 comprises, in some embodiments: about 40 to about 70 mol $SiO_2$; 0 to about 28 mol % $B_2O_3$; about 0 to about 28 mol % $Al_2O_3$; about 1 to about 14 mol % $P_2O_5$; and about 12 to about 16 mol % $R_2O$. In some embodiments, the glass substrate comprises: about 40 to about 64 mol % $SiO_2$; 0 to about 8 mol % $B_2O_3$; about 16 to about 28 mol % $Al_2O_3$; about 2 to about 12 mol % $P_2O_5$; and about 12 to about 16 mol % $R_2O$. The substrate 10 may further comprise at least one alkaline earth metal oxide such as, but not limited to, MgO or CaO.

In some embodiments, the substrate 10 has a bulk composition that is substantially free of lithium; i.e., the glass comprises less than 1 mol % $Li_2O$ and, in other embodiments, less than 0.1 mol % $Li_2O$ and, in other embodiments, 0.01 mol % $Li_2O$, and in still other embodiments, 0 mol % $Li_2O$. In some embodiments, such glasses are free of at least one of arsenic, antimony, and barium; i.e., the glass comprises less than 1 mol % and, in other embodiments, less than 0.1 mol and in still other embodiments, 0 mol % of $As_2O_3$, $Sb_2O_3$, and/or BaO.

In other embodiments of the display article 100 depicted in FIGS. 1A-1C, the substrate 10 has a bulk composition that comprises, consists essentially of or consists of a glass composition, such as Corning® Eagle XG® glass, Corning® Gorilla® glass, Corning® Gorilla® Glass 2, Corning® Gorilla® Glass 3, Corning® Gorilla® Glass 4 or Corning® Gorilla® Glass 5.

According to other embodiments, the substrate 10 of the display article 100 depicted in FIGS. 1A-1C can possess an ion-exchangeable glass composition that is strengthened by either chemical or thermal means that are known in the art. In one embodiment, the substrate 10 is chemically strengthened by ion exchange. In this process, metal ions at or near a primary surface 12 and/or primary surface 14 of the substrate 10 are exchanged for larger metal ions having the same valence as the metal ions in the glass substrate. The exchange is generally carried out by contacting the substrate 10 with an ion exchange medium such as, for example, a molten salt bath that contains the larger metal ion. The metal ions are typically monovalent metal ions such as, for example, alkali metal ions. In one non-limiting example, chemical strengthening of a substrate 10 that contains sodium ions by ion exchange is accomplished by immersing the substrate 10 in an ion exchange bath comprising a molten potassium salt such as potassium nitrate ($KNO_3$) or the like. In one particular embodiment, the ions in the surface layer of the substrate 10 and the larger ions are monovalent alkali metal cations, such as $Li^+$ (when present in the glass), $Na^+$, $K^+$, $Rb^+$, and $Cs^+$. Alternatively, monovalent cations in the surface layer of the substrate 10 may be replaced with monovalent cations other than alkali metal cations, such as $Ag^+$ or the like.

In these embodiments of the display article 100 depicted in FIGS. 1A-1C, the replacement of small metal ions by larger metal ions in the ion exchange process creates a compressive stress region 50 in the substrate 10 that extends from the primary surface 12 to a depth 52 (referred to as the "depth of layer") that is under compressive stress. It should also be understood that a compressive stress region can be formed in the glass substrate that extends from the primary surface 14 to a depth (not shown in FIGS. 1A-1C) that is comparable in nature to the compressive stress region 50. More particularly, this compressive stress at the primary surface 14 of the glass substrate is balanced by a tensile stress (also referred to as "central tension") within the interior of the glass substrate. In some embodiments, the primary surface 12 of the substrate 10 described herein, when strengthened by ion exchange, has a compressive stress of at least 350 MPa, and the region under compressive stress extends to a depth 52, i.e., depth of layer, of at least 15 μm below the primary surface 12.

Ion exchange processes are typically carried out by immersing the substrate 10 in a molten salt bath containing the larger ions to be exchanged with the smaller ions in the glass. It will be appreciated by those skilled in the art that parameters for the ion exchange process, including, but not limited to, bath composition and temperature, immersion time, the number of immersions of the glass in a salt bath (or baths), use of multiple salt baths, additional steps such as annealing, washing, and the like, are generally determined by the composition of the glass and the desired depth of layer and compressive stress of the glass as a result of the strengthening operation. By way of example, ion exchange of alkali metal-containing glasses may be achieved by immersion in at least one molten bath containing a salt such as, but not limited to, nitrates, sulfates, and chlorides of the larger alkali metal ion. The temperature of the molten salt bath typically is in a range from about 380° C. up to about 450° C., while immersion times range from about 15 minutes up to about 16 hours. However, temperatures and immersion times different from those described above may also be used. Such ion exchange treatments, when employed with a substrate 10 having an alkali aluminosilicate glass composition, result in a compressive stress region 50 having a depth 52 (depth of layer) ranging from about 10 μm up to at least 50 μm with a compressive stress ranging from about 200 MPa up to about 800 MPa, and a central tension of less than about 100 MPa.

As the etching processes that can be employed to create the diffractive surface region 30a of the display article 100 shown in FIGS. 1A-1C, according to some embodiments, can remove alkali metal ions from the substrate 10 that would otherwise be replaced by a larger alkali metal ion during an ion exchange process, a preference exists for developing a compressive stress region 50 in the display article 100 after the formation and development of the diffractive surface region 30a, In other embodiments, a compressive stress region 50 can be developed in the substrate 10 prior to development of the diffractive surface region 30a to a depth 52 sufficient to account for some loss in the depth of layer in the region 50 associated with the various treatments associated with forming the diffractive surface region 30a, as outlined below. Alternatively, the diffractive surface region 30a may be created by an additive or coating process rather than a substrate etching process, in which case it may be desirable to develop the compressive stress region 50 before this additive or coating process.

According to another implementation of the display article 100 depicted in FIGS. 1A-1C, the article can further include an easy-to-clean (ETC) coating (not shown) disposed over the diffractive surface region 30a. In most embodiments, the ETC coating is deposited over the diffractive surface region 30a such that its surface morphology generally mirrors the underlying morphology of the diffractive surface region 30a. In one embodiment, the display article 100 further includes a smudge-resistant fluorine-based ETC coating, deposited on at least a portion of the diffractive surface region 30a. In embodiments, the ETC coating comprises at least one amphiphobic substance having fluorine termination groups to provide the diffractive surface region 30a with amphiphobicity (i.e., hydrophobicity and oleophobicity, or lack of affinity for both oils and water), thus minimizing wetting of the surface by water and/or oils. The fluorine termination groups of the ETC coating are less polar than a surface having O1-1 termination groups, and therefore minimize hydrogen (i.e., Van der Waals) bonding between particles and liquids. For fingerprint oils and debris associated with fingerprints, bonding and adhesion is minimized. Consequently, mass transport of fingerprint oils and debris from the finger of a person to the ETC coating is minimized. In one embodiment, the ETC coating is formed by exchanging the hydrogen found in terminal OH groups on the diffractive surface region 30a of the display article 100 with a fluorine-based moiety such as, for example, a fluorine-containing monomer (e.g., a fluorosilane), to form a glass having terminal fluorinated groups.

In another embodiment, an ETC coating of the display article 100 depicted in FIGS. 1A-1C comprises a self-assembled monolayer of a fluorine-terminating molecular chain. In yet another embodiment, the ETC coating comprises a thin, fluoro-polymeric coating and, in yet another embodiment, the ETC coating comprises silica soot particles that have been treated to have pendent fluorocarbon groups attached to the soot particles. Such ETC coatings can be applied to the diffractive surface region 30a of the display article 100 by dipping, vapor coating, spraying, application with a roller, or other suitable method known in the art. After the ETC coating has been applied, it may be "cured" at temperatures ranging from about 25° C. up to about 150° C. and, in another embodiment, at temperatures ranging from about 40° C. up to about 100° C. Curing times can range from about 1 up to about 4 hours, and may be carried out in an atmosphere containing 40-95% moisture. After curing, the display article 100 with an ETC coating can be solvent rinsed to remove any unbound coating and air-dried prior to use.

Referring again to the display article 100 depicted in FIGS. 1A-1C, embodiments are configured in which the diffractive surface region 30a includes a plurality of structural features 20 with a first portion of structural features 22a, 22a' and a second portion of structural features 22b, 22b'. Further, the first portion of structural features 22a (e.g., pillars), 22a' (e.g., holes) can be defined by a pitch 42a of less than 125 µm, and the second portion of structural features 22b, 22b' can be defined by a pitch 42b (see FIG. 1A) substantially the same or different from the pitch 42a. According to some implementations, the second portion of structural features 22b, 22b' (e.g., ligaments, mesas) can be defined by a pitch 42b of less than 125 µm, with the pitch 42a substantially the same as or different from the pitch 42b. Further, as used herein, the pitch 42a and 42b of the first and second portion of structural features 22a, 22a' and 22b, 22b' are pitch values of these features, as would be commonly understood by those of ordinary skill in the field of the disclosure. As such, the pitch 42a and/or 42b of the first and second portion of structural features 22a, 22a' and 22b, 22b', respectively, can be less than 125 µm, 110 µm, 100 µm, 90 µm, 80 µm, 70 µm, 60 µm, 50 µm, 40 µm, 30 µm, 20 µm and all pitch values between these upper thresholds of the pitch value. In embodiments, the pitch values 42a, 42b may have a lower threshold, e.g., the pitch values may be larger than about 2 microns, larger than 5 microns, or larger than 10 microns.

Once again referring to the display article 100 depicted in FIGS. 1A-1C, embodiments are configured such that the first or the second portion of structural features 22a, 22a' (e.g., pillars or holes) or 22b, 22b' (e.g., ligaments or mesas), respectively, is at a fill fraction from about 30% to 70%, with the other portion (i.e., 22a, 22a' or 22b, 22b') at a fill fraction of 100% minus the fill fraction of the first or second portions 22a, 22a' or 22b, 22b'. Hence, the first portion of structural features 22a, 22a' or second portion of structural features 22b, 22b' of the diffractive surface region 30a can be configured at a fill fraction from about 30% to 70%, from about 35% to 65%, from about 40% to 60%, or from about 40% to 55%. For example, the first or second portions 22a, 22a' or 22b, 22b' can be configured within the diffractive surface region 30a such that they have a fill fraction of 30%, 35%, 40%, 45%, 50%, 55%, 60%, 65%, 70%, and all fill fraction levels between the foregoing values.

Still referring to the display article 100 depicted in FIGS. 1A-1C, the diffractive surface region 30a is arranged within the primary surface 12 of the substrate 10 such that each of the plurality of structural features 20, e.g., the first and second portions 22a, 22a' and 22b, 22b', has a diameter 32a, 32b of less than 125 µm, or less than 100 µm. Further, as used herein, the diameter 32a, 32b of the first and second portion of structural features 22a, 22a' and 22b, 22b' represents the effective diameter or longest width dimension of these features at their full width height maximum (FWHM), as would be commonly understood by those of ordinary skill in the field of the disclosure. As such, the diameter 32a, 32b of the structural features of the first and second portions 22a, 22a' and 22b, 22b' can be less than 125 µm, 120 µm, 110 µm, 100 µm, 90 µm, 80 µm, 70 µm, 60 µm, 50 µm, 40 µm, 30 µm, 20 µm, 10 µm, 5 µm, and all diameter values less than the foregoing diameters. Further, the diameter 32a, 32b of the structural features of the first and second portions 22a, 22a' and 22b, 22b' can also range from 5 µm to 120 µm, 5 µm to 100 µm, 5 µm to 80 or 10 µm to 100 µm, for example.

According to some embodiments of the display article 100 depicted in FIGS. 1A-1C, the diffractive surface region 30a is configured such that each of the structural features 20 has an aspect ratio of more than 10. Unless otherwise noted, the aspect ratio of each of the structural features 20, e.g., the first and second portion of structural features 22a, 22a' and 22b, 22b', is given by the average diameter 32a, 32b divided by the respective average height 24a, 24b. In some implementations, the aspect ratio of the structural features 20 of the diffractive surface region 30a is more than 10, more than 20, more than 50, or more than 100. For example, a first portion of structural features 22a, 22a' with an average diameter 32a of 20 μm and an average height 24a of 0.2 μm corresponds to an aspect ratio of 100. More generally, the diffractive surface region 30a, as characterized by these aspect ratios, is substantially flat or planar, at least as viewed under ambient lighting without any magnification aids. In a preferred embodiment, the aspect ratio of the structural features of the display article 100 shown in FIG. 1C can be greater than or equal to 50, which helps ensure that the antireflection coating 60 disposed thereon does not result in significant edge effects or shadowing that degrade the optical performance of the surface.

According to some implementations of the display article shown in FIGS. 1A-1C, the structural features 20 of the diffractive surface region 30a can be configured according to a period 47 to effect antiglare properties. In some implementations of the display article 100, the structural features 20 of the diffractive surface region 30a are configured with a period 47 that ranges from 1 μm to 200 μm, from 5 μm to 200 μm, from 5 μm to 150 μm, from 5 μm to 100 μm, from 5 μm to 50 μm, from 5 μm to 30 μm, from 20 μm to 150 μm, from 20 μm to 100 μm, from 10 μm to 30 μm, from 10 μm to 20 μm, and all period values between the foregoing ranges. For example, the structural features 20 can be configured with a relatively large period 47 on the order of about 100 μm (e.g., from about 70 to 200 μm) for end use applications of the display article 100 that benefit from maximizing a scattered light component near 0.3°, such as in the case where the application has a particular DOI target. Such DOI targets may require a scattered light component at or near 0.3° from the specular reflection direction, which can be enhanced by relatively large structural features 20. For end use applications for the display article 100 in which the DOI requirements are not as strict, smaller structural features 20 may be desirable, e.g., with a period 47 that ranges from about 5 to 30 μm and, according to some implementations, is semi-randomized to minimize color and/or Moiré artifacts. The level and type of feature randomization in the X-Y dimension can be very important to achieving low PPD while also minimizing other display artifacts such as Moiré or color banding. Put another way, traditional, perfectly ordered grating-like structures are not preferred for the articles of the disclosure. Structural features 20 that range from about 5 to 30 um can affect DOI, and can be designed to achieve DOI values, e.g., below 90 or below 80, so it is not essential to have larger structural features 20 to have some effect on DOI. The randomization of the structural features 20 at the period 47 can be characterized by a variation in nearest-neighbor distances over a distribution range which may be limited to 1.2, 1.3, 1.4 or 1.5× a minimum distance or an average distance. These smaller periods 47 can still effectively suppress specular reflection, but are believed to be more desirable to reduce artifacts such as sparkle (i.e., as measured by $PPD_{140}$) in display cover applications. In some embodiments, the period 47 can be configured to range from 5 μm to 30 μm, from 10 μm to 30 μm, and from 10 μm to 20 μm, which can lower DOI to less than 90, or even less than 80, while still maintaining desirable, low sparkle levels.

Figure 2:
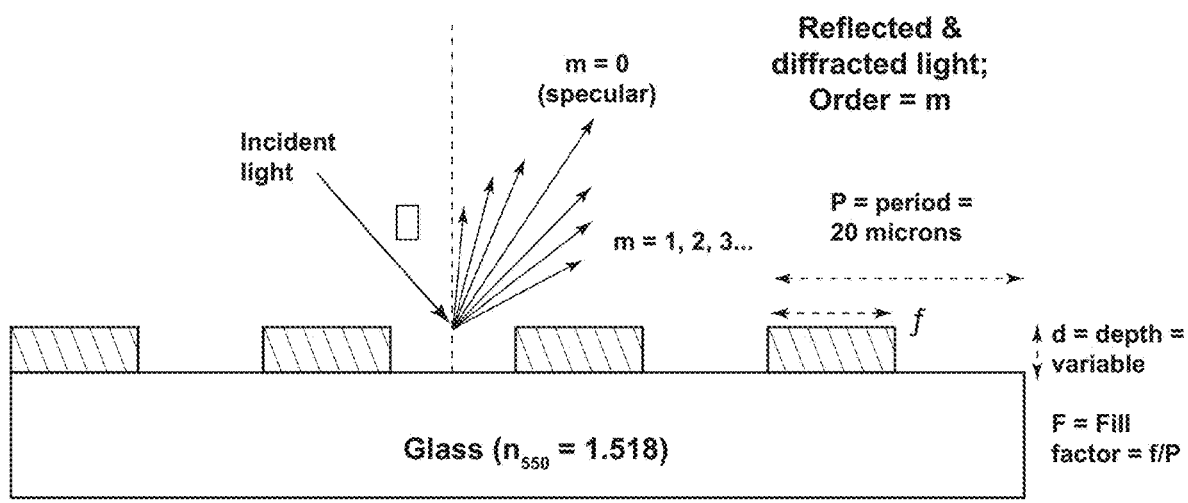
FIG. 2 is a cross-sectional, schematic view of a diffractive antiglare structure, according to an embodiment of the disclosure.

Referring now to FIG. 2, a cross-sectional, schematic view of a diffractive, antiglare structure is provided. As shown schematically in FIG. 2, a diffractive optical model can illustrate the principles of the diffractive surface region 30a. Optical modeling calculations were performed using Gsolver©, a commercially available software package. The Gsolver© package employs a rigorous, coupled-wave analysis to find solutions for Maxwell's equations, which can govern the optical performance of a diffraction grating. In the context of developing a diffractive surface region 30a, the Gsolver© software can be applied to a linear, rectangular diffractive antiglare structure as shown in FIG. 2. Note that the rectangular nature of the diffractive antiglare structure shown in FIG. 2 departs from the structural features 20 of the diffractive surface region 30a in the sense that the structural features 20 can comprise pillars, holes, mesas, plateaus, polygons, and other discrete, non-rectangular shapes. Nevertheless, the calculations conducted on the schematic shown in FIG. 2 demonstrate trends and provide data that is useful in the definition of the structural features 20 of the diffractive surface region 30a that is consistent with the principles of this disclosure. Notably, as shown in FIG. 2, the as-modeled diffractive antiglare structure has a period of 20 μm and is integrated within the surface of a glass substrate having a refractive index of 1.518 at 550 nm. Further, as shown in FIG. 2, incident light at a wavelength of 550 nm is directed against the diffractive antiglare structure at an incident angle of 20 degrees. For optimal antiglare properties, it is generally desirable to suppress the zero order reflected light (i.e., specular light).

Figure 3A:
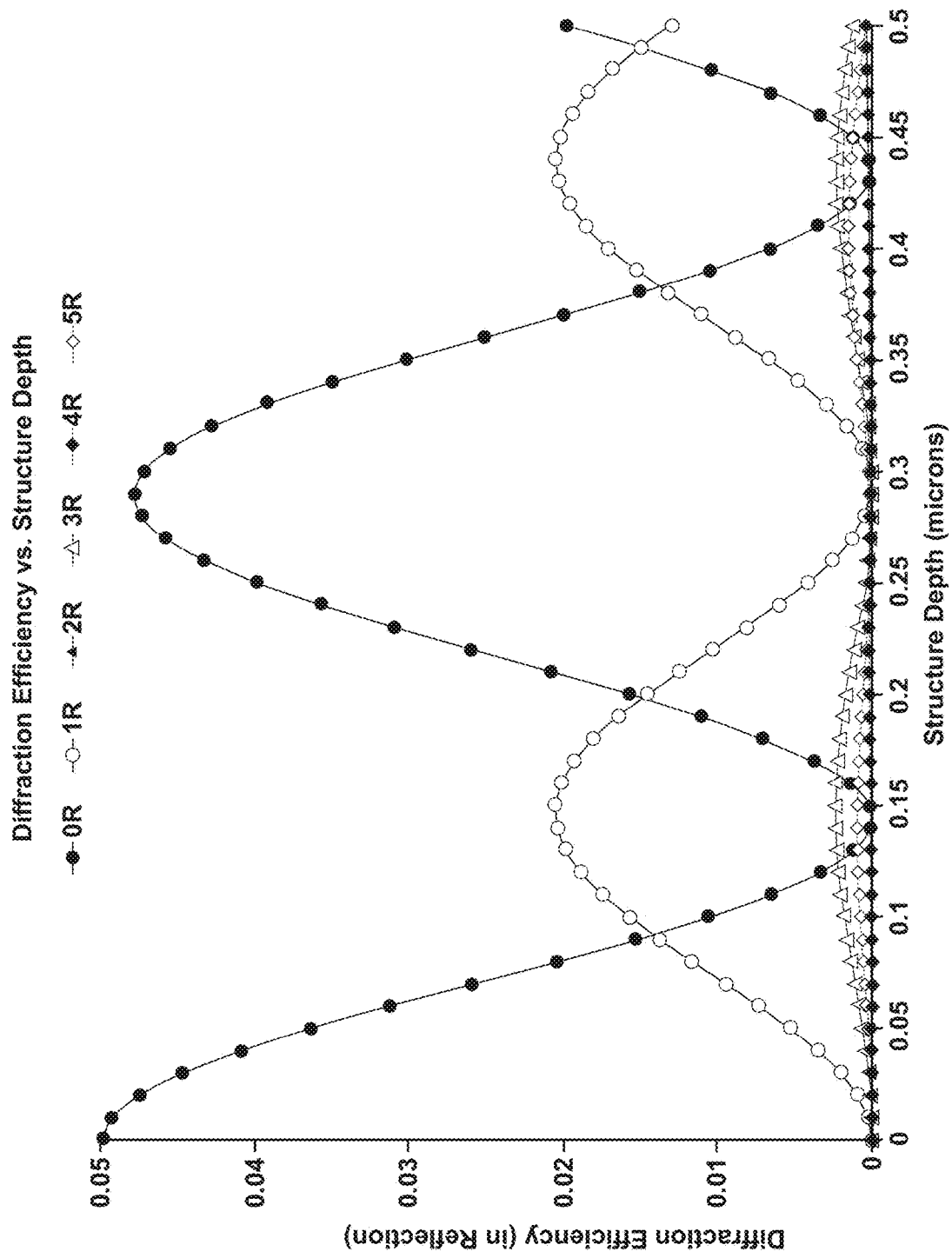
FIGS. 3A and 3B are plots of diffraction efficiency in reflection and transmission, respectively, as a function of structure depth for the diffractive antiglare structure depicted in FIG. 2, according to embodiments of the disclosure.
Figure 3B:
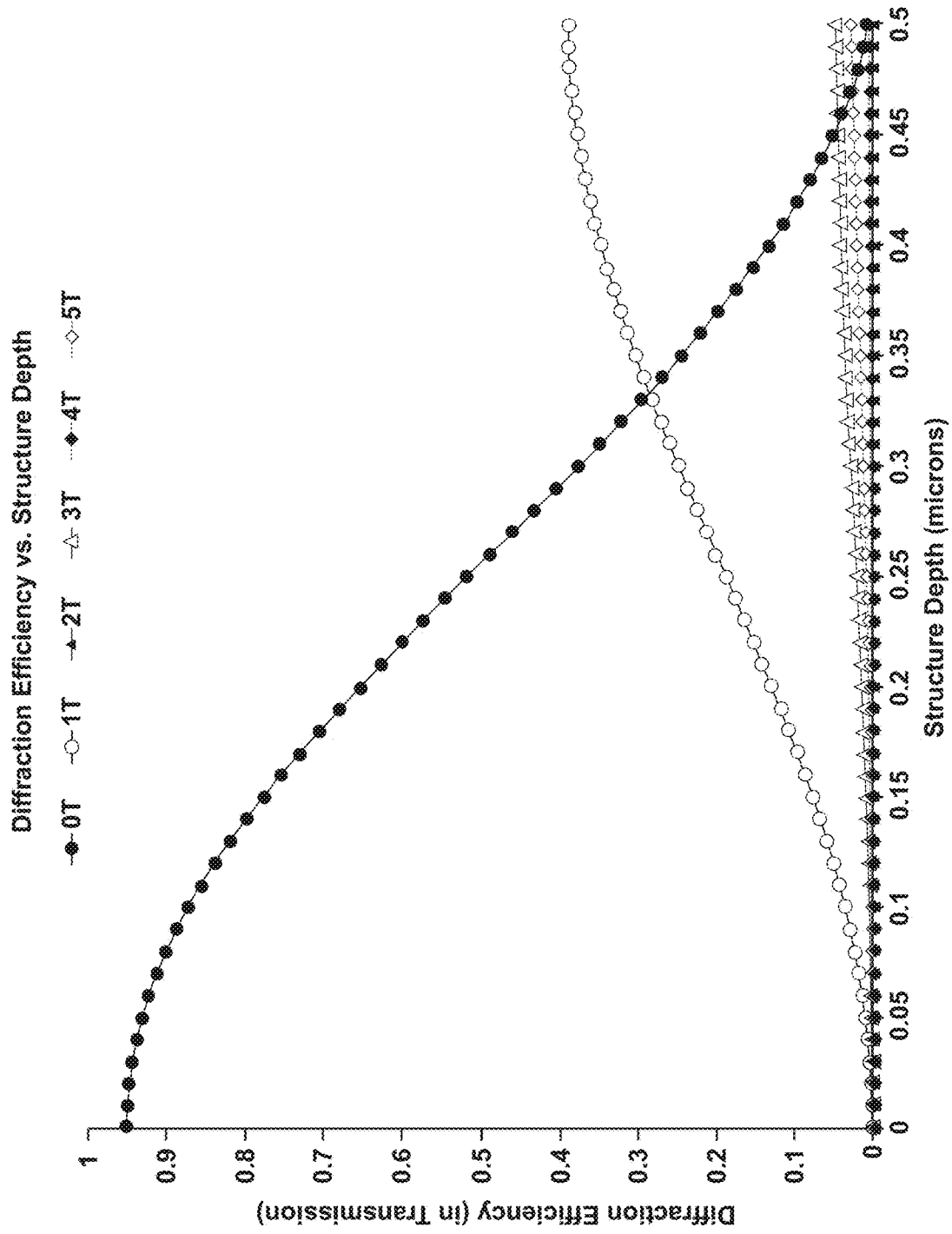

Referring now to FIGS. 3A and 3B, plots of diffraction efficiency in reflection and transmission, respectively, as a function of structure depth for the diffractive antiglare structure depicted in FIG. 2 are provided. These plots were developed from the Gsolver© software. As shown in FIG. 3A, the diffractive antiglare structure has a period of 20 μm and structure depths ranging from 0 to 0.5 μm are modeled. Further, as shown in FIG. 3A, plots of the zero through the fifth order are shown (i.e., m=0 to 5). Notably, the zero order curve is the amplitude of the specular reflectance and, as shown in the figure, is suppressed close to 0% at a structure depth of 0.14 to 0.15 μm. In addition, the specular reflectance can be suppressed by a factor of 10 compared to flat glass over a structure depth range of about 0.12 to 0.17 μm, which corresponds to about ¼ of the wavelength of light in air. A second minimum in specular reflectance is observed at the ¾ wavelength structure depth. As shown in FIG. 3B, the amplitude of the transmitted diffracted orders for the same structure as shown in FIGS. 2 and 3A is provided. For display applications, it can be desirable to maximize the zero order, i.e., the specular transmission. Specular transmission is greater than 78% of the transmittance of flat glass at a structure depth of ~0.15 μm, which is also the preferred depth for minimization of specular reflectance. The total transmission (considering all angles) remains close to the flat glass value, and the majority of scattered light in transmission is within 10 degrees or 5 degrees of the specular direction for preferred embodiments.

Figure 4A:
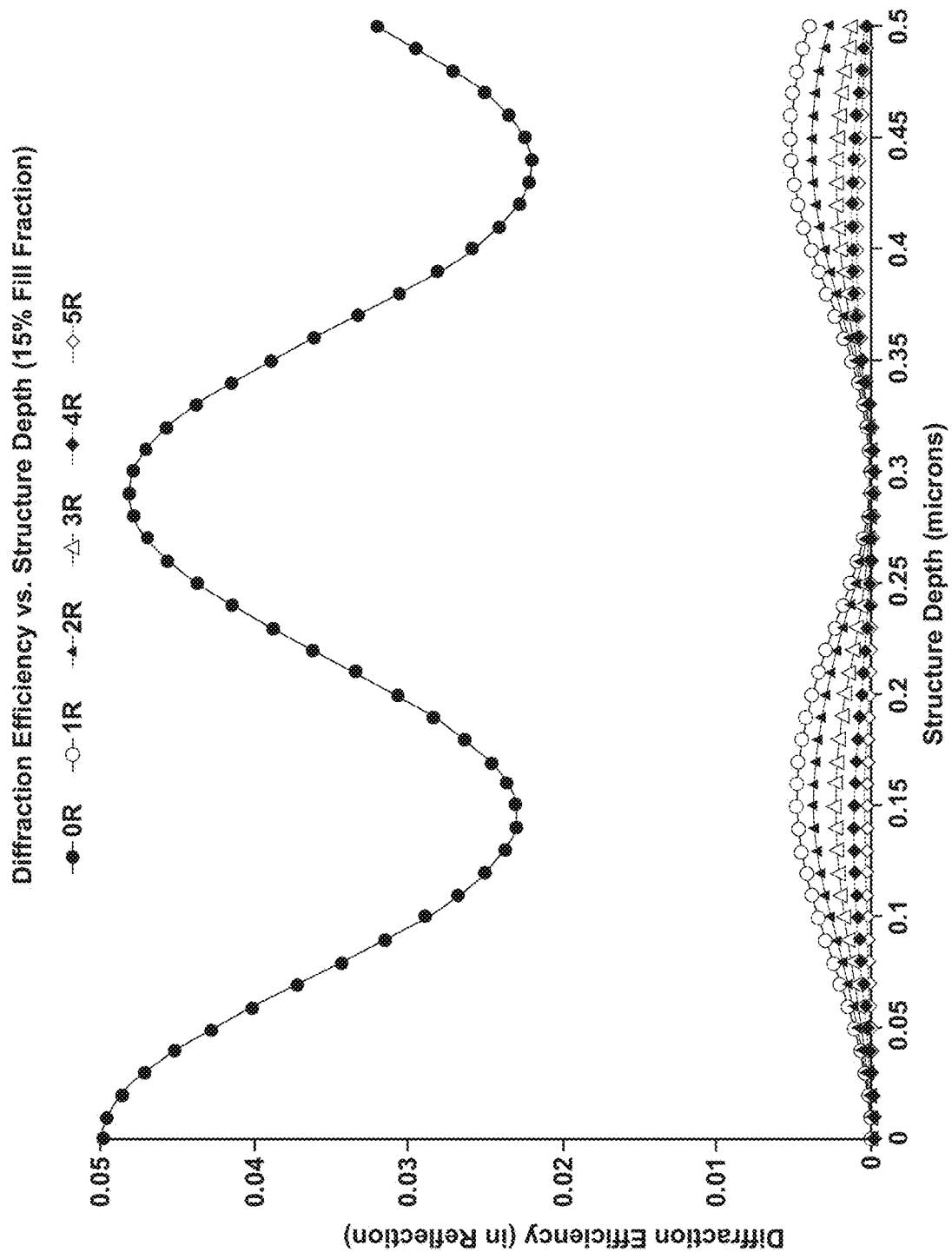
FIGS. 4A-4C are plots of diffraction efficiency in reflection as a function of structure depth for the diffractive antiglare structure depicted in FIG. 2 at fill fractions of 15%, 30% and 70%, respectively, according to embodiments of the disclosure.
Figure 4B:
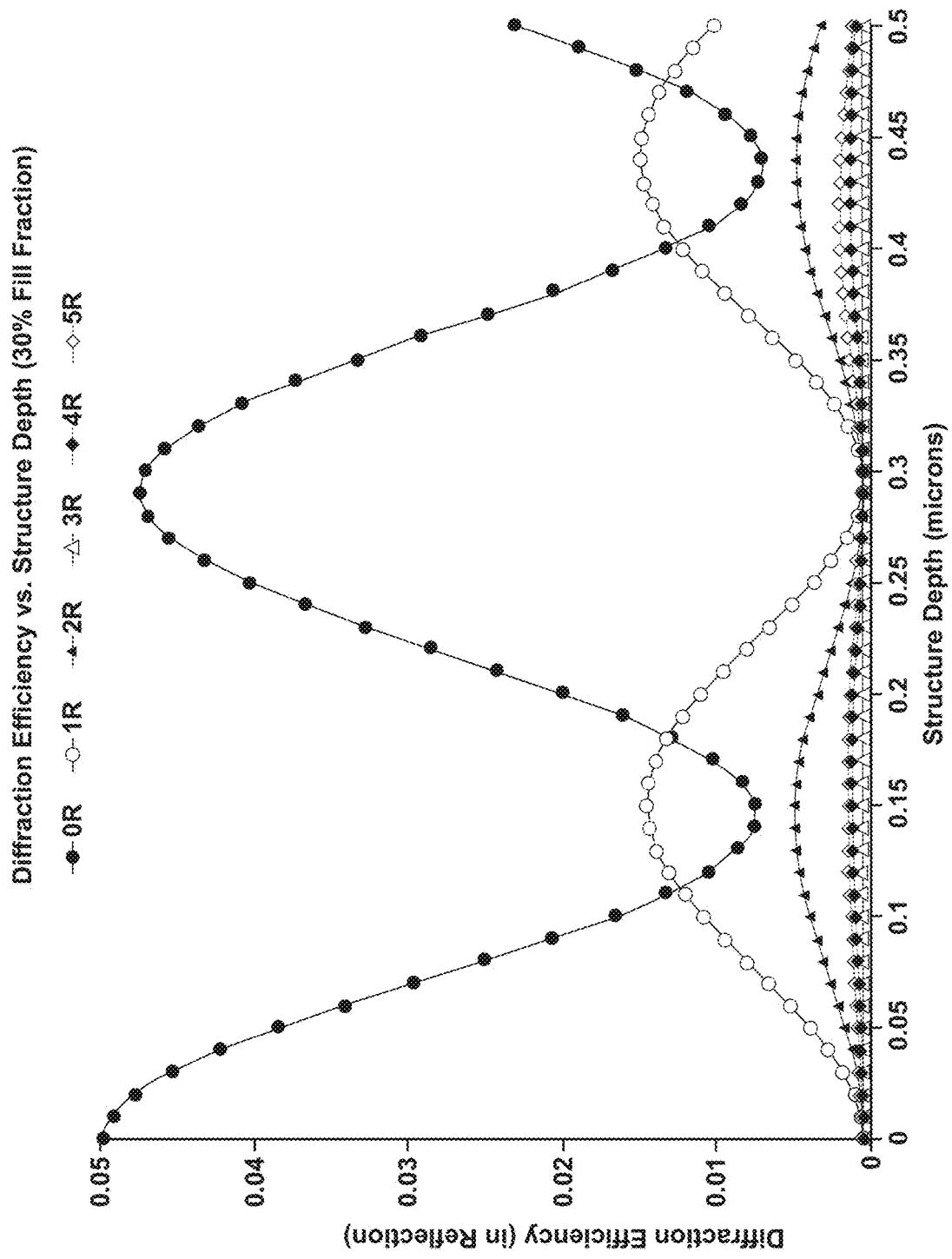
Figure 4C:
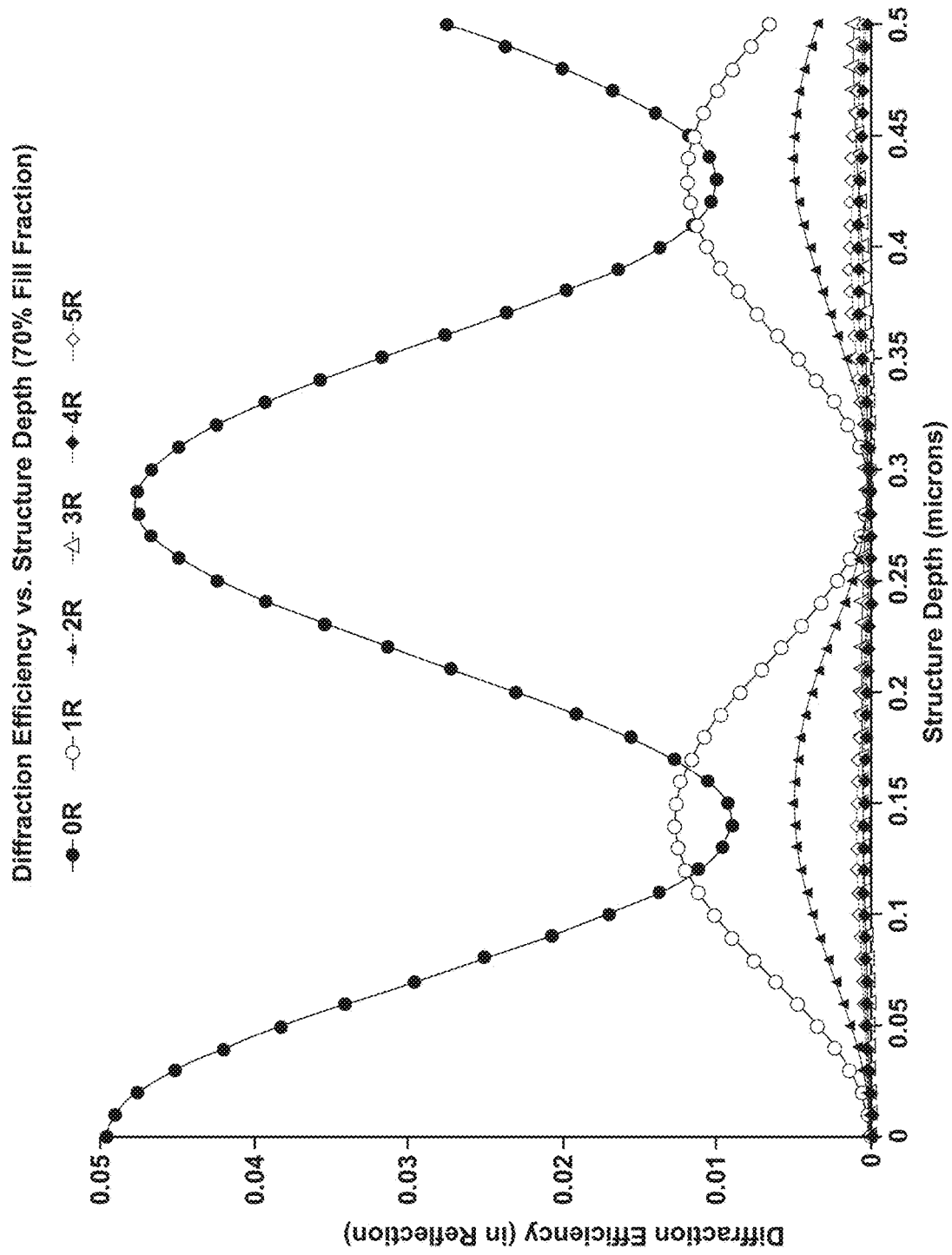

Referring now to FIGS. 4A-4C, plots of diffraction efficiency in reflection as a function of structure depth for the diffractive antiglare structure depicted in FIG. 2 at fill fractions of 15%, 30% and 70%, respectively, are provided. Notably, the diffractive structures with these fill fractions at 15%, 30% and 70% do not allow the zero order (specular)

reflectance to drop to zero. This indicates that the preferred fill fraction for simple bimodal height, single material structure such as this one is close to 50%, or in the range of 35% to 65%, as modeled and depicted in FIG. 2.

Figure 5:
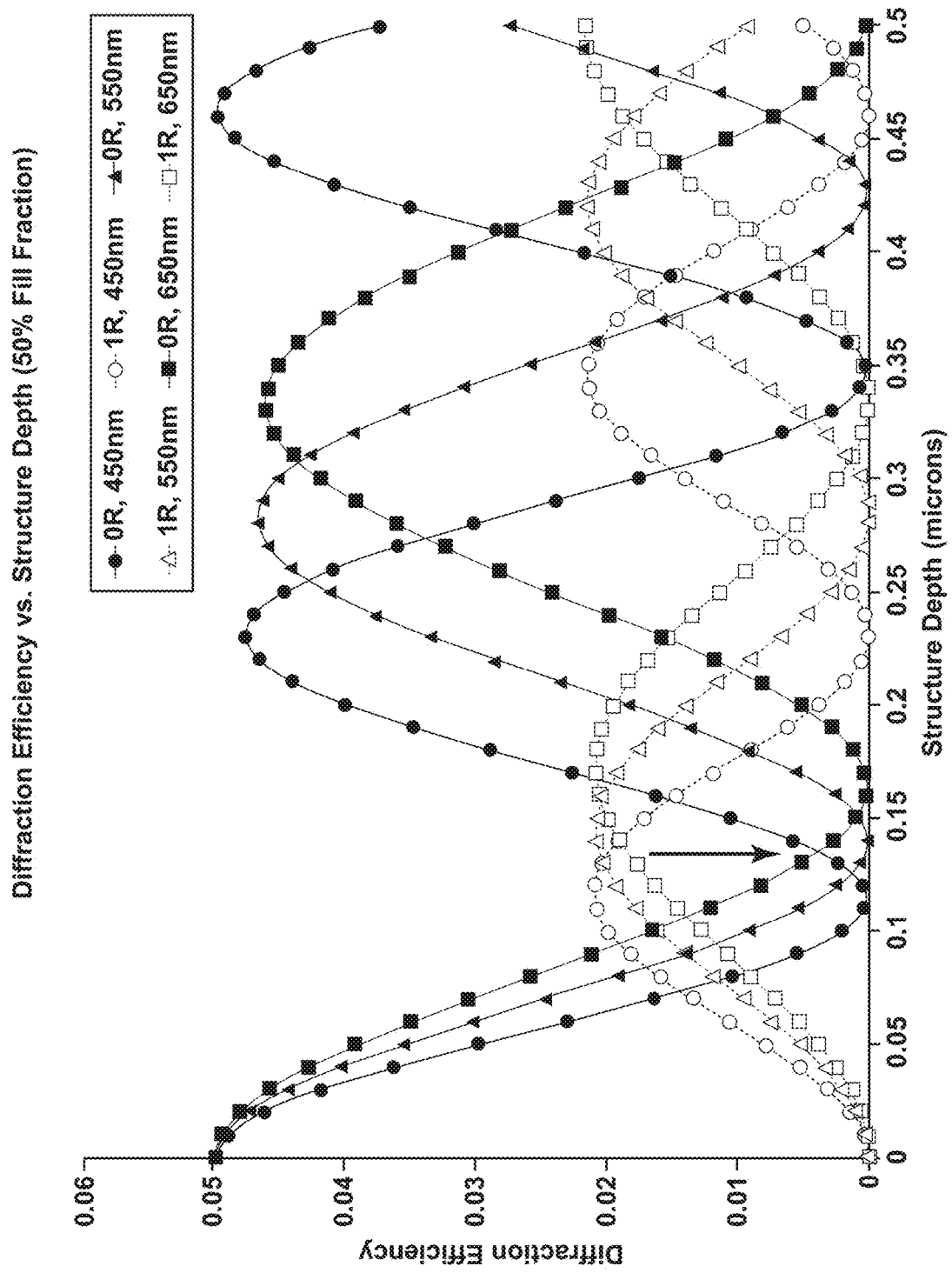
FIG. 5 is a plot of diffraction efficiency in reflection as a function of structure depth for the diffractive antiglare surface depicted in FIG. 2 with varying incident light wavelengths, according to embodiments of the disclosure.

Referring now to FIG. 5, a plot of diffraction efficiency in reflection as a function of structure depth for the diffractive antiglare structure depicted in FIG. 2 with varying incident light wavelengths is provided. In particular, this figure illustrates the effect of incident light wavelengths on the suppression of specular reflection, particularly at the zero order. Although the optimal structure depth varies with wavelength, as shown in FIG. 5, a single structure depth near the first ¼ wavelength minimum (at the arrow) can successfully achieve a 10× reduction in specular reflectance for all visible light wavelengths from 450 to 650 nm. This shows that broadband suppression of specular reflectance in the visible range is viable using a basic, diffractive antiglare structure as modeled in FIG. 2, with a bimodal surface height distribution.

Referring again to FIGS. 2-5, these figures generally provide guidance for the display article 100 to be configured to minimize specular reflectance while maximizing specular transmittance. Further, these figures illustrate how the depth of the diffractive antiglare structure (e.g., as serving as the general basis for the diffractive surface region 30a) affects specular reflectance. As noted earlier, the modeled linear diffractive antiglare structure of FIG. 2 differs from the diffractive surface region 30a of the display articles 100 shown in FIGS. 1A-1C, as the latter contains a plurality of structural features 20, such as pillars, holes, polygons and other discrete features disposed in an ordered or semi-ordered array. However, in view of the modeling of the basic diffractive structure shown in FIGS. 2-5, the height or depth of the structural features 20 of the diffractive surface region 30a is preferably maintained from 50 to 250 nm, 75 to 225 nm, 100 to 200 nm, 120 to 190 nm or from 140 to 190 nm.

More generally, the two-dimensional array of structural features 20 of the diffractive surface region 30a can be fabricated by many processes, such as optical lithography (photomask), ink jet printing, laser patterning and/or screen printing once the intended structure for the surface region 30a has been defined. The selection of the process depends on the resolution of the structural features 20 (e.g., in terms of diameter and/or pitch) and the technical capabilities of the given process. In some embodiments, once the structural parameters of the diffractive surface region 30a has been defined (e.g., pillars or holes, average heights, pitch, diameter, period, etc.), the design can be converted to a computer-aided design (CAD) file and then used with any of the foregoing processes to transfer it to a substrate 10 to create the 'engineered' diffractive surface region 30a.

Figure 6:
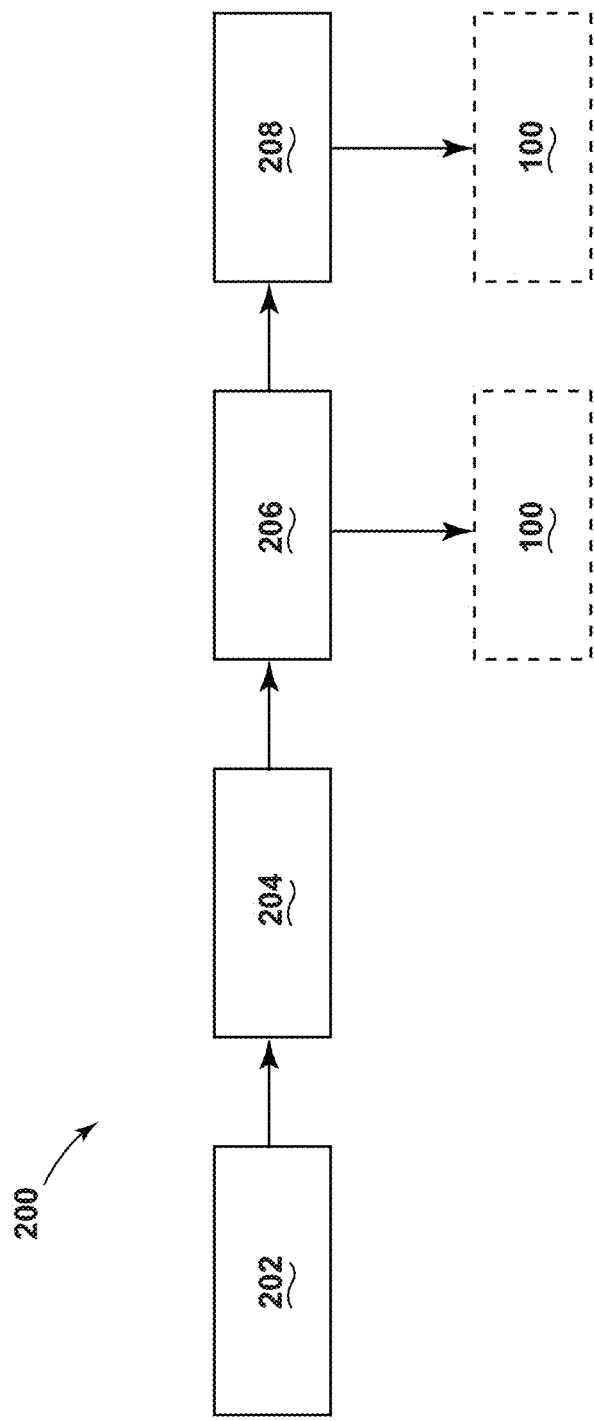
FIG. 6 is a schematic flow chart of a method of making a display article, according to an embodiment of the disclosure.

Referring now to FIG. 6, a schematic flow chart is provided of a method 200 of making a display article (i.e., the display article 100 shown and described in FIGS. 1A-1C). The method 200 includes: a step 202 of masking a substrate 10 comprising a thickness 13 and a primary surface 12 with a mask; a step 204 of forming a diffractive surface region 30a within the primary surface 12 of the substrate 10; and a step 206 of removing the mask from the substrate 10. The net result of the method 200 is a display article 100, for example, as depicted in FIGS. 1A and 1B. In some embodiments, the method 200 further includes a step 208 of forming an antireflective coating 60 over the diffractive surface region 30a, to define the display article 100 (see FIG. 1C and corresponding description). The diffractive surface region 30a comprises a plurality of structural features 20 that comprises a plurality of different heights in a multi-modal distribution. Further, the multimodal distribution further comprises a first portion of structural features 22a, 22a' at a first average height 24a and a second portion of structural features 22b, 22b' at a second average height 24b. In addition, the substrate 10, as fabricated according to the method 200, exhibits a sparkle of less than 4%, as measured by $PPD_{140}$ at an incident angle of 0° from normal, a DOI of less than 80% at an incident angle of 20° from normal, and a transmittance haze of less than 20% from an incident angle of 0° from normal.

According to some implementations of the method 200 depicted in FIG. 6 of making a display article 100 (see FIGS. 1A-1C and earlier description), the step 202 of masking the substrate 10 can include one or more of screen print masking, inkjet print masking and photoresist masking. In some embodiments, the step 204 of forming the diffractive surface region 30a includes etching the primary surface 12 of the substrate 10 through the mask to form the diffractive surface region 30a, wherein each structural feature is a hole at a depth from 50 nm to 250 nm. The step 204, for example, can be conducted by etching the substrate 10, as comprising a glass composition, with an $HF/HNO_3$ etchant. In embodiments, the wet etching solution employed in step 204 can consist of hydrofluoric acid (HF, 49 w/w %) and nitric acid ($HNO_3$, 69 w/w %) combinations with 0.1-5 v/v % HF and 0.1-5 v/v % $HNO_3$. Typical concentrations used to achieve 100-250 nm etching depths are 0.1 v/v % HF/1 v/v % $HNO_3$ to 0.5 v/v % HF/1 v/v % $HNO_3$ solutions. For example, etching in step 204 can be carried out using a dip or spray etch process from room temperature to about 45° C. In other embodiments, the step 204 of forming the diffractive surface region 30a can include depositing a film on the primary surface 12 of the substrate 10 through the mask (e.g., by sputtering, evaporation, or chemical vapor deposition) to form the diffractive surface region 30a, and each structural feature is a pillar at a height from 50 nm to 250 nm. The diffractive surface region can also be formed by masking plus 'dry etching', plasma-based etching, reactive ion etching, or other vacuum-based etching methods. In some embodiments, such a film can be deposited through the mask with a liquid phase silica layer or other oxide layer, followed by mask removal and lift off.

Figure 18A:
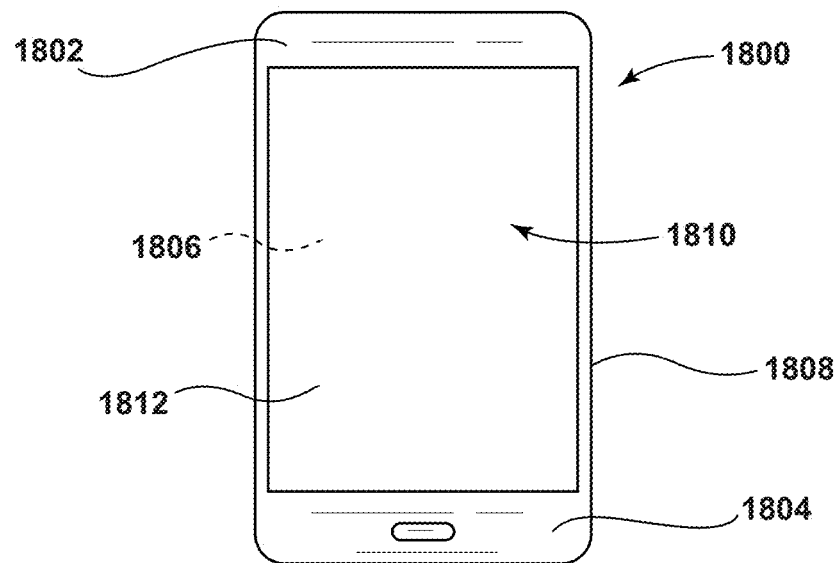
FIG. 18A is a plan view of an exemplary electronic device incorporating any of the articles disclosed herein.
Figure 18B:
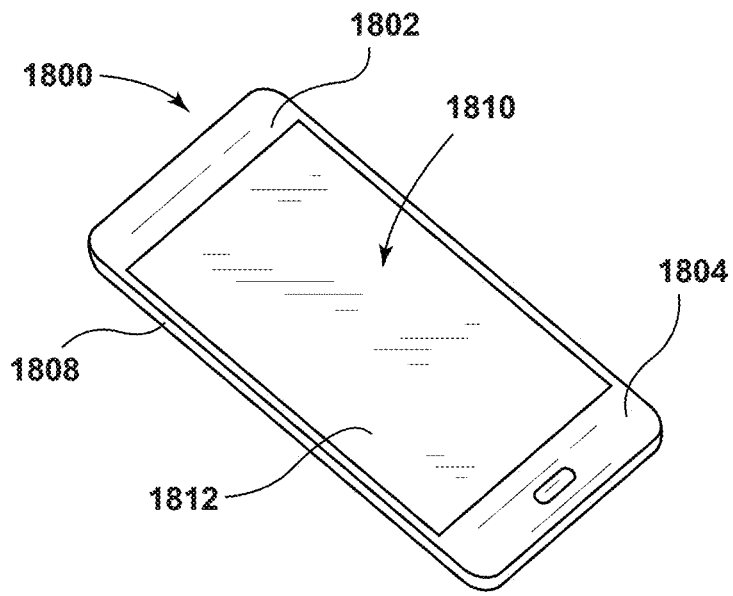
FIG. 18B is a perspective view of the exemplary electronic device of FIG. 18A.

The articles 100 disclosed herein (e.g., as shown in FIG. 1C) may be incorporated into a device article, e.g., a device article with a display (or display device articles) (e.g., consumer electronics, including mobile phones, tablets, computers, navigation systems, wearable devices (e.g., watches) and the like), augmented-reality displays, heads-up displays, glasses-based displays, architectural device articles, transportation device articles (e.g., automotive, trains, aircraft, sea craft, etc.), appliance device articles, or any device article that benefits from some transparency, scratch-resistance, abrasion resistance or a combination thereof. An exemplary device article incorporating any of the articles disclosed herein (e.g., as consistent with the articles 100 depicted in FIG. 1C) is shown in FIGS. 18A and 18B. Specifically, FIGS. 18A and 18B show a consumer electronic device 1800 including a housing 1802 having a front 1804, a back 1806, and side surfaces 1808; electrical components (not shown) that are at least partially inside or entirely within the housing and including at least a controller, a memory, and a display 1810 at or adjacent to the front surface of the housing; and a cover substrate 1812 at or over the front surface of the housing such that it is over the display. In some embodiments, the cover substrate 1812 may include any of the articles disclosed herein. In some embodiments, at least one of a portion of the housing or the cover glass comprises the articles disclosed herein.

EXAMPLES

The following examples describe various features and advantages provided by the disclosure, and are in no way intended to limit the invention and appended claims.

Example 1

Referring generally to FIGS. 7A-7D, a photomask/optical lithography process was used to develop the diffractive surface region structures shown in these images. In this case, a light-sensitive polymer (i.e., a photoresist) is exposed and developed to form three-dimensional relief images on the substrate (e.g., a substrate 10). In general, the ideal photoresist image has the exact shape of the designed or intended pattern in the plane of the substrate, with vertical walls through the thickness of the resist (<3 µm for spin-coatable resists, <20 µm for dry film resists, and <15 µm for screen-coatable photoresists). When exposed, the final resist pattern is binary with parts of the substrate covered with resist while other parts are completely uncovered. The general sequence of processing steps for a typical photolithography process, as consistent with the method 200 depicted in FIG. 6, is as follows: substrate preparation (clean and dehydration followed by an adhesion promoter for spin-coatable resist, e.g., hexamethyl disilazane (HMDS), photoresist spin coat, prebake, exposure, and development (i.e., step 202), followed by a wet etching process to transfer the binary image onto glass (i.e., step 204). The final step is to strip the resist after the resist pattern has been transferred into the underlying layer (i.e., step 206). In some cases, post bake and post exposure bake steps are required to ensure resist adhesion during wet etching process.

Figure 7A:
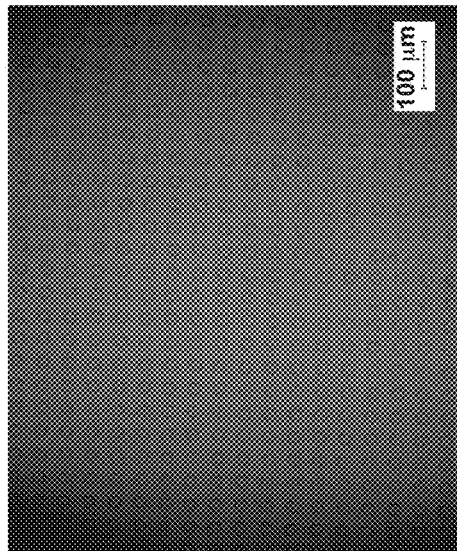
FIGS. 7A-7D are optical micrographs of diffractive surface regions of substrates employed in display articles, according to embodiments of the disclosure.
Figure 7B:
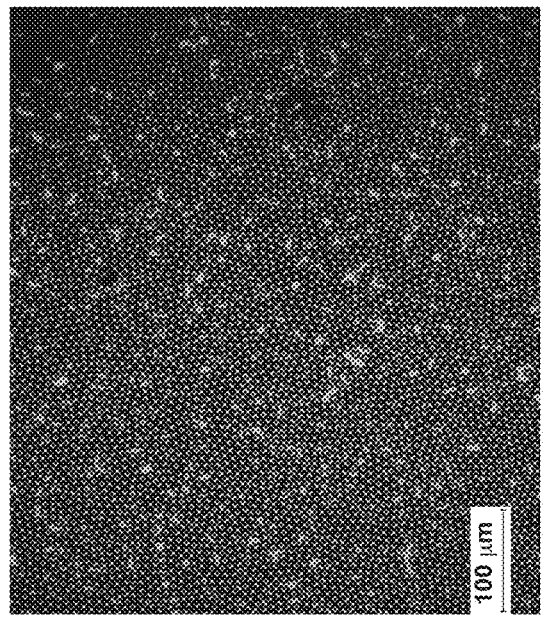
Figure 7C:
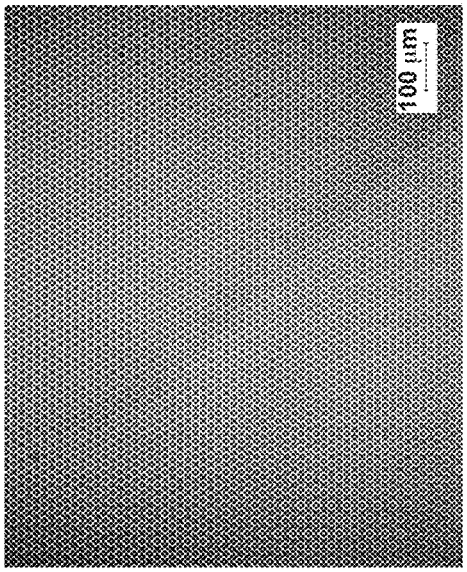
Figure 7D:
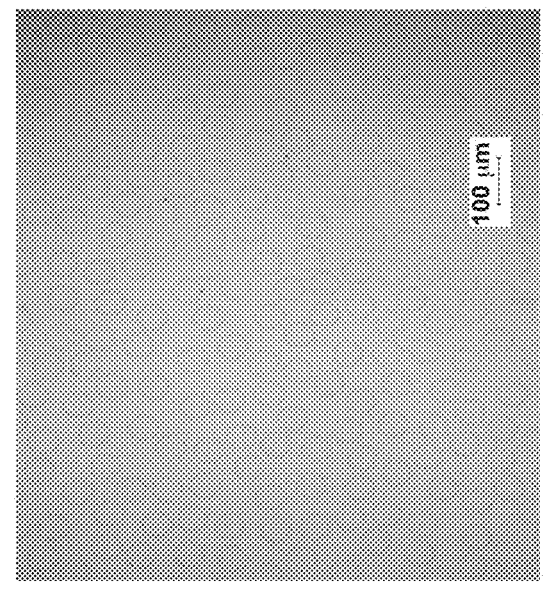

Referring now to FIGS. 7A-7D, optical micrographs are provided of diffractive surface regions of aluminosilicate glass substrates prepared according to this example with preferred etch depths in the range of 100 to 250 nm for the holes. These diffractive surface regions were prepared according to the foregoing photomasking process, followed by an etching process. More particularly, the wet etching solution used to prepare the samples of FIGS. 7A-7D consisted of hydrofluoric acid (HF, 49 w/w %) and nitric acid ($HNO_3$, 69 w/w %) with 0.1-5 v/v % HF and 0.1-5 v/v % $HNO_3$. For this example, the concentration of the etchant employed to achieve the 100-250 nm etch depths ranged from 0.1 v/v % HF/1 v/v % $HNO_3$ to 0.5 v/v % HF/1 v/v % $HNO_3$. FIGS. 7A and 7B show two-dimensional (2D) ordered arrays of structural features of diffractive surface regions at two spatial frequencies: (a) structural features with a diameter of 12 µm with a pitch of 17 µm (FIG. 7A) (referred to as a "12-17" array); and (b) structural features with a 25 µm diameter and a pitch of 50 µm (referred to as a "25-50" array). The surfaces for the ordered arrays were designed using hexagonal packing or a square packing array with a fill fraction varying from 20 to 50%. Further, FIGS. 7C and 7D show 2D arrays of structural features of diffractive surface regions with a randomly packed structure at two spatial frequencies: (a) a 50 µm structural feature diameter with a minimum pitch of 60 µm (FIG. 7C) (referred to as a "50-60" array); and (b) a 12 µm structural feature diameter with a minimum pitch of 14 µm (referred to as a "12-14" array).

Figure 8:
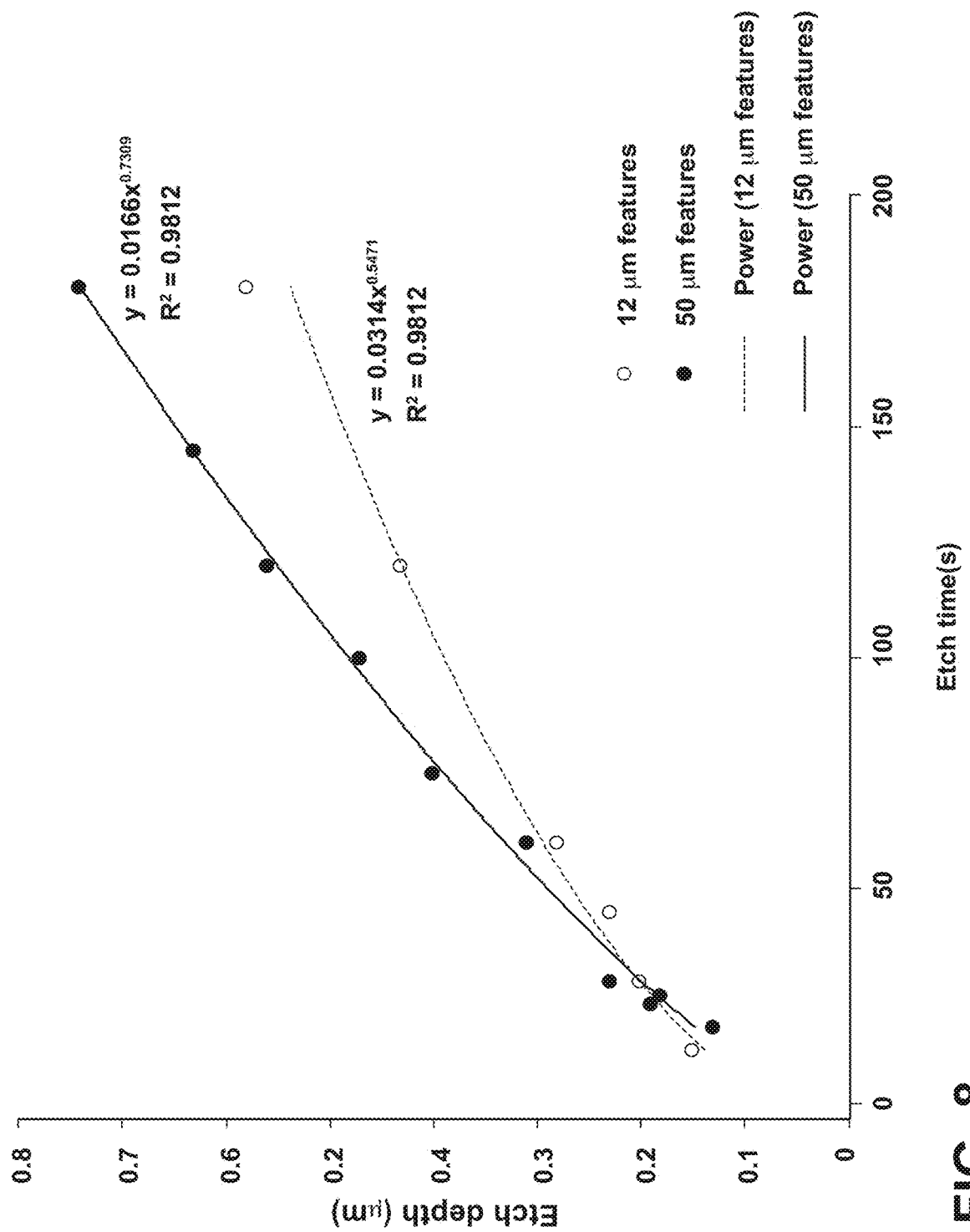
FIG. 8 is a plot of etch depth as a function of etch time to form two structural features of diffractive surface regions of substrates employed in display articles, according to embodiments of the disclosure.

Referring now to FIG. 8, a plot is provided of etch depth as a function of etch time to form two structural features of diffractive surface regions according to this example. In this example, structural features having a diameter of 12 µm and 50 µm are etched at various etch times and the resulting etch depths are plotted (e.g., as consistent with the structures shown in FIGS. 7D and 7C, respectively). In this example, the substrate is a glass composition and it was etched with a 49 vol % stock solution of HF. Etch depth was measured using a stylus-based profilometer (with a Z depth resolution set at <5 µm, <200 µm scan, 3 regions with a 3 mg force) or a Bruker ContourGT-X white light interferometer (with a 20× or 50× objective lens, green narrow-band light, in a single field of view image). As is evident from FIG. 8, the larger structural features (i.e., those at a diameter of about 50 µm) etch faster at longer times as compared to smaller structural features (i.e., those at a diameter of about 12 µm), which allows one to engineer the diffractive surface region to have features of different sizes at different depths or heights using the same etchant and one mask.

Figure 9A:
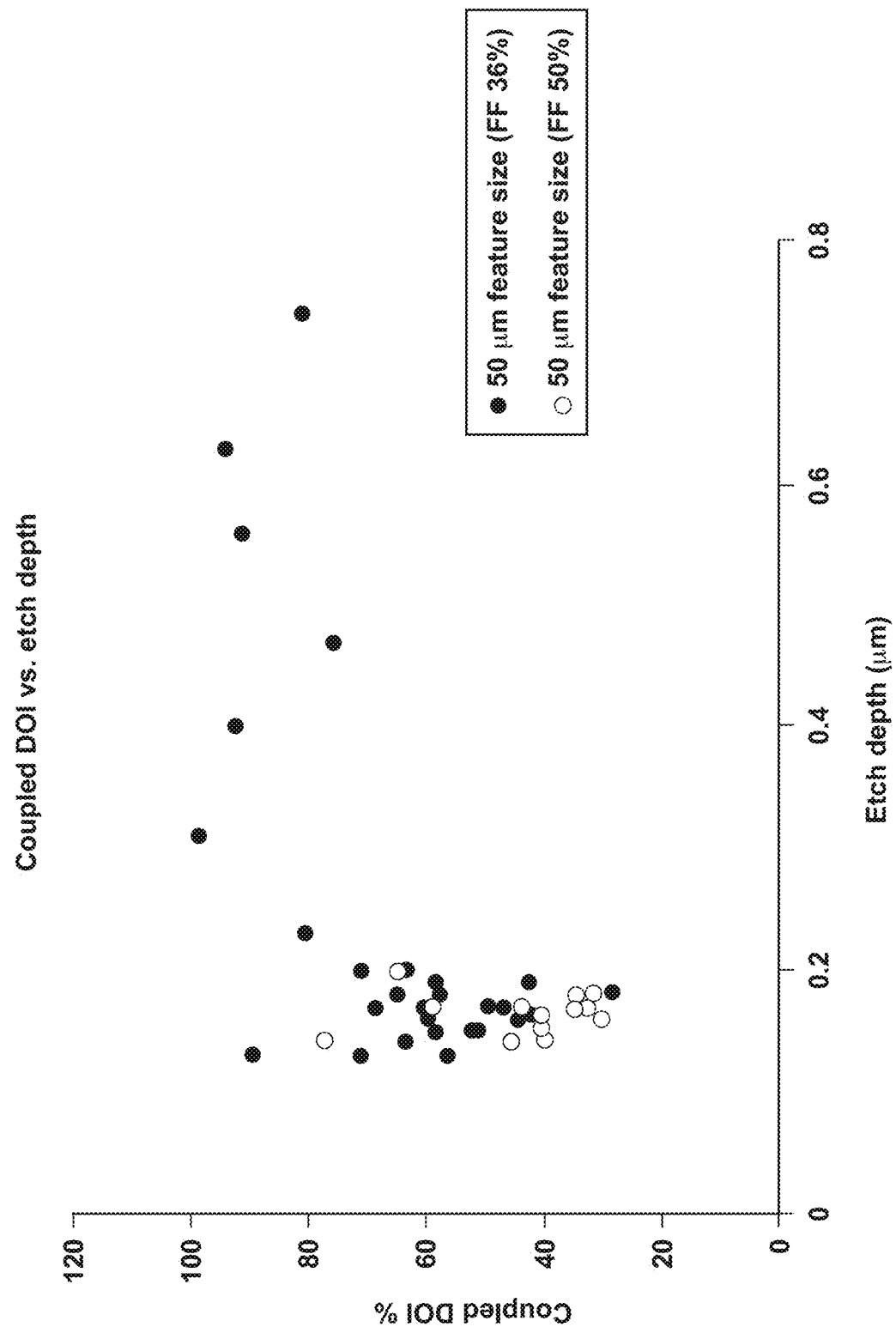
FIGS. 9A and 9B are plots of distinctness of image (DOI) as a function of etch depth for structural features having different sizes and fill fractions, as part of diffractive surface regions of substrates employed in display articles, according to embodiments of the disclosure.
Figure 9B:
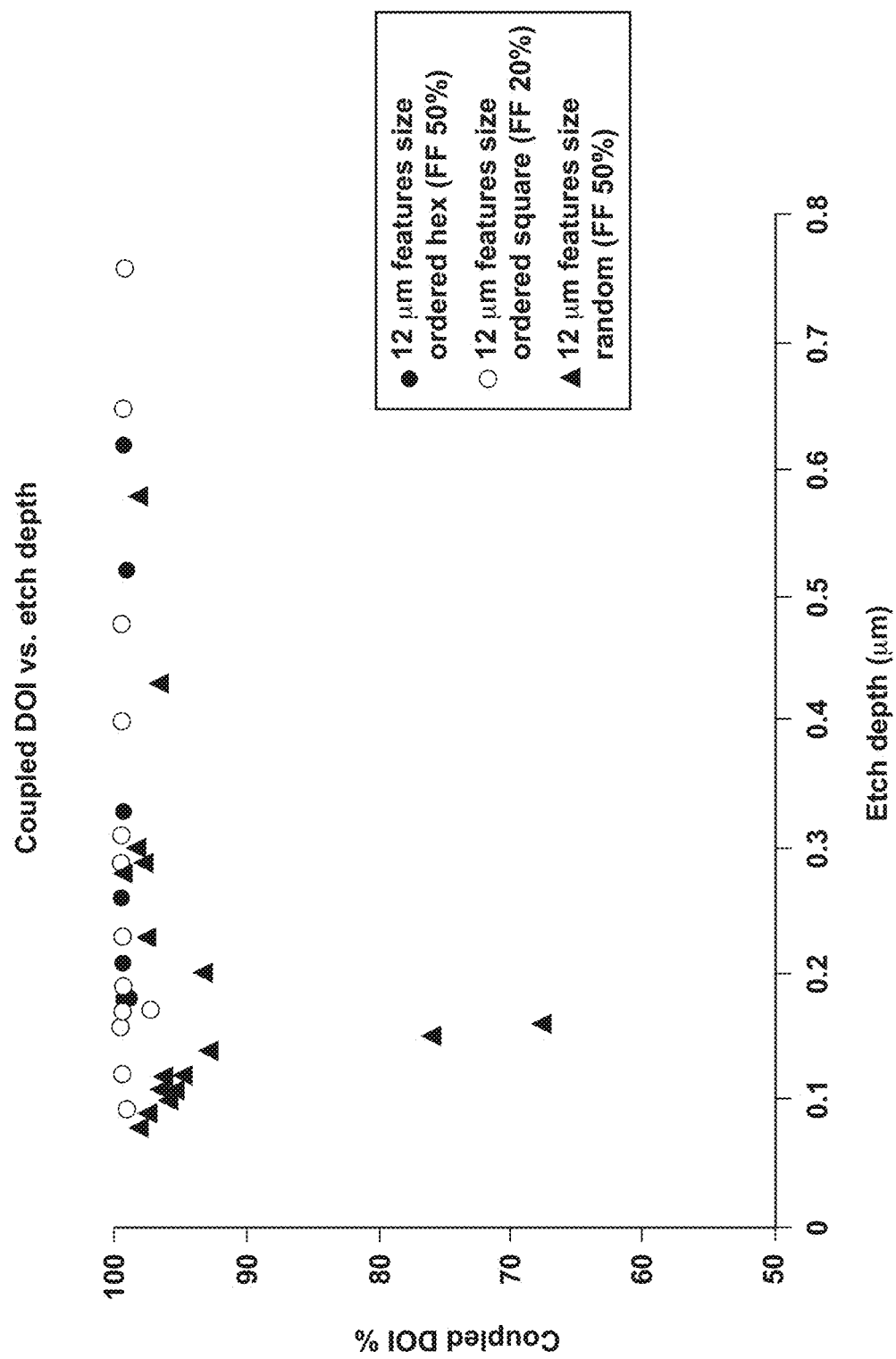

Referring now to FIGS. 9A and 9B, plots are provided of DOI as a function of etch depth for the structural features of the diffractive surface regions depicted in FIGS. 7C and 7D above, as having different sizes and fill fractions. As shown in FIG. 9A, the DOI levels of the 50-60 array of structural features (see also FIG. 7C) at fill fractions of 36% and 50% is shown as a function of etch depth. Similarly, as shown in FIG. 9B, the DOI levels of the 12-14 array of structural features (see also FIG. 7D) at fill fractions of 20% and 50% is shown as a function of etch depth. As is evident from FIGS. 9A and 9B, both arrays of structural features demonstrate that the minimum DOI is observed at an etch depth from about 150 to 180 nm, as generally predicted or otherwise suggested by the modeling outlined earlier and shown in FIGS. 2-5.

Figure 10A:
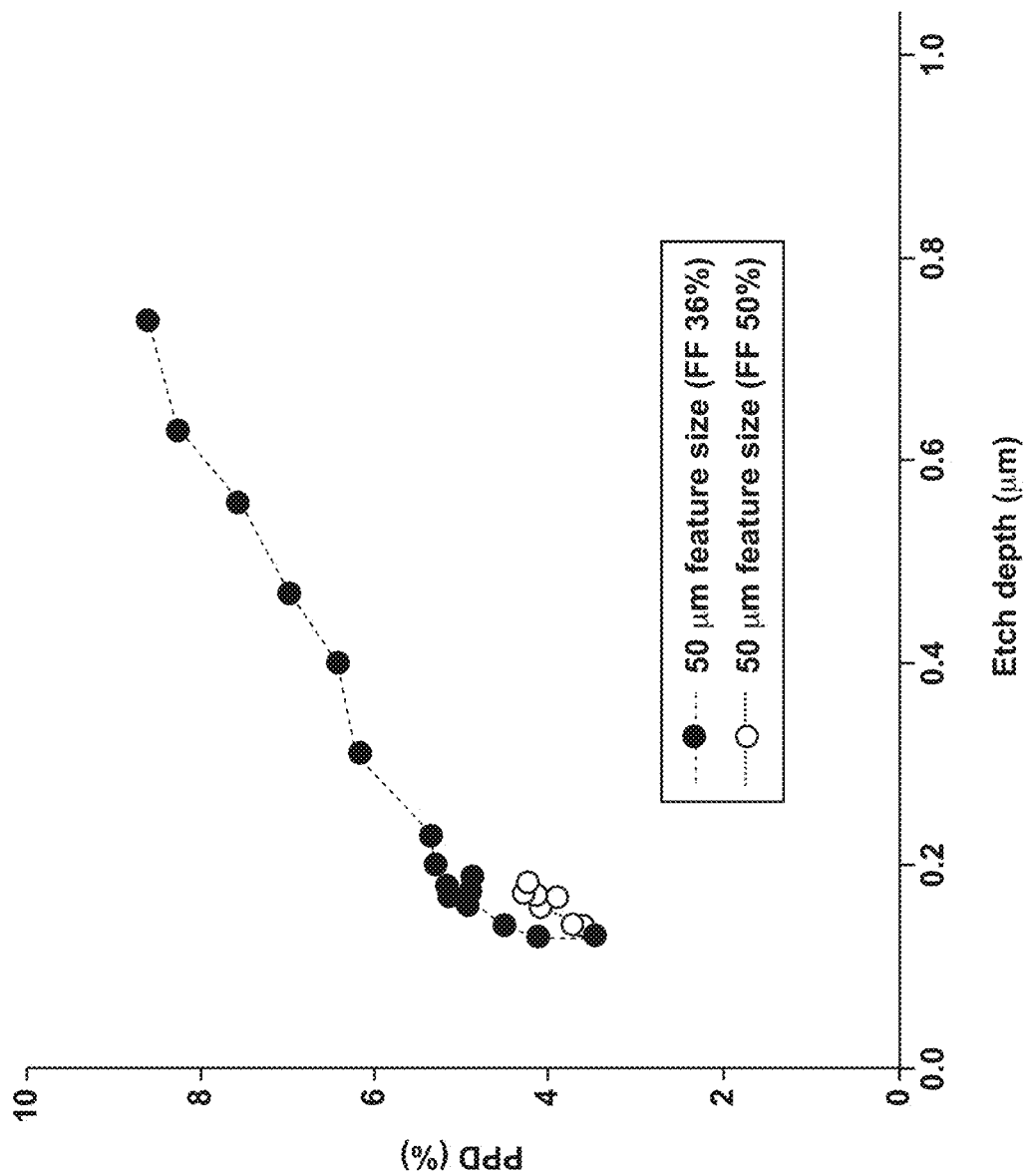
FIGS. 10A and 10B are plots of pixel power deviation ($PPD_{140}$) and haze as a function of etch depth for structural features having different sizes and fill fractions, as part of diffractive surface regions of substrates employed in display articles, according to embodiments of the disclosure.
Figure 10B:
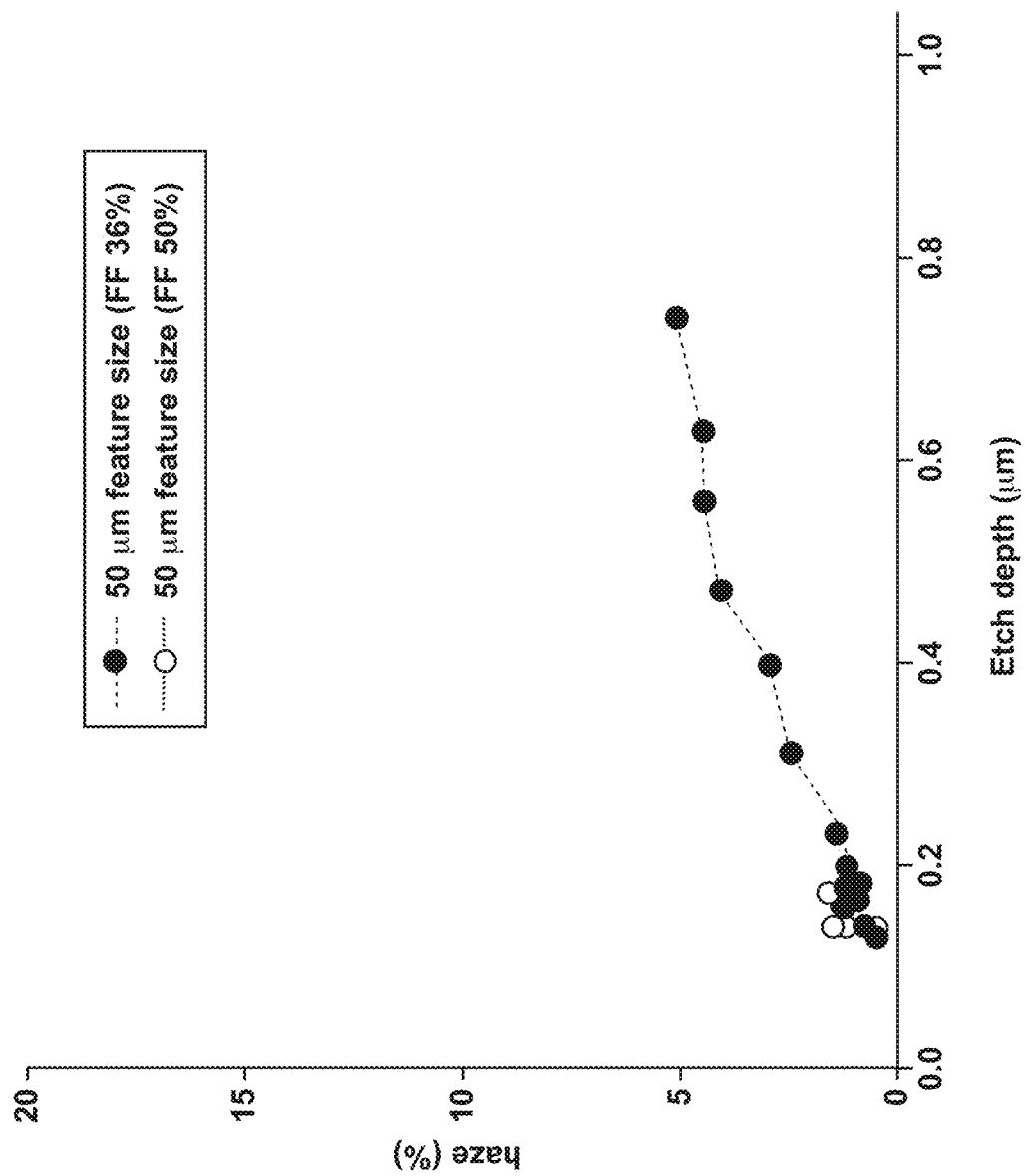
Figure 10C:
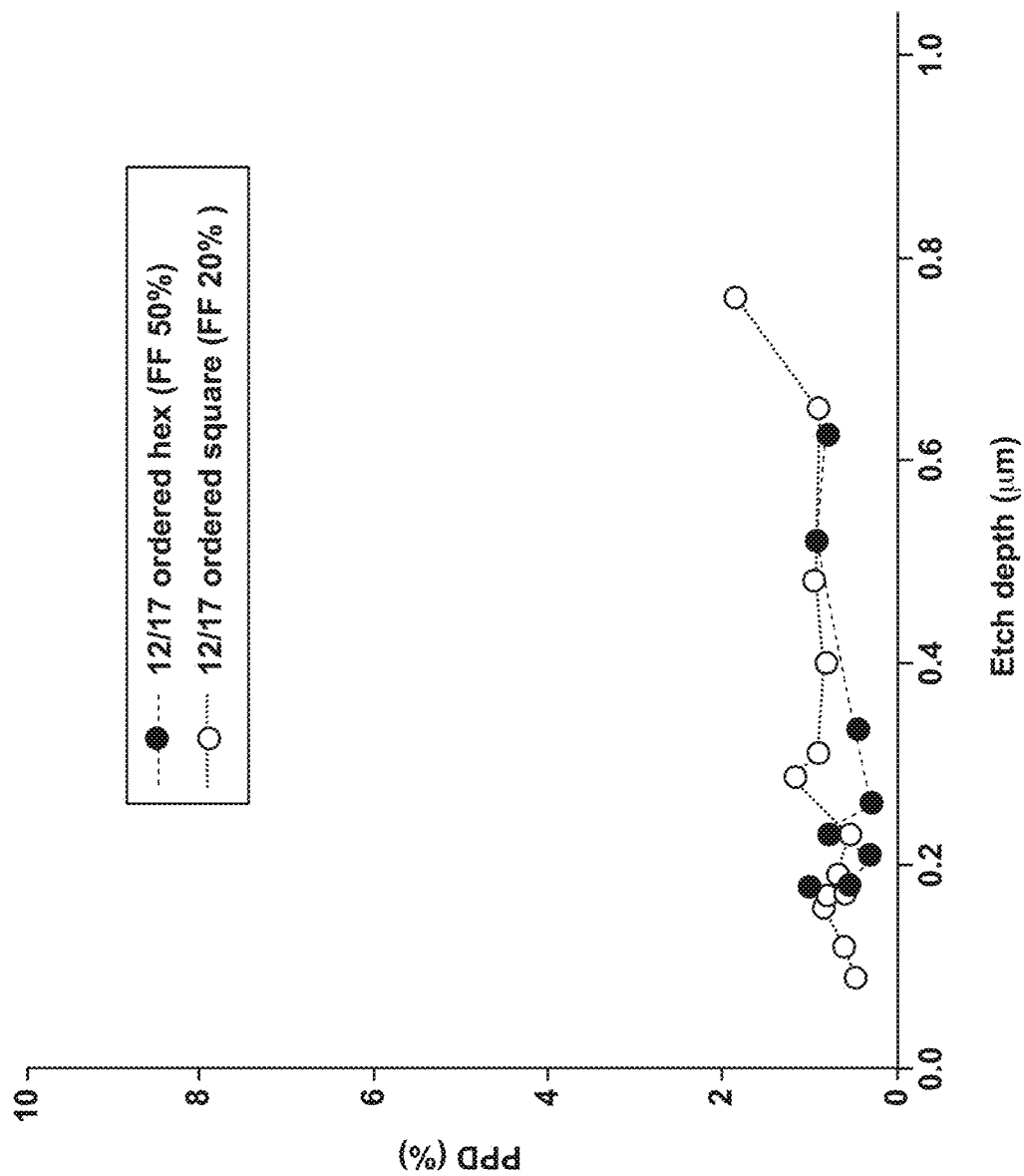
FIGS. 10C and 10D are plots of pixel power deviation (PPD$_{140}$) and haze as a function of etch depth for structural features having different sizes and fill fractions, as part of diffractive surface regions of substrates employed in display articles, according to embodiments of the disclosure.
Figure 10D:
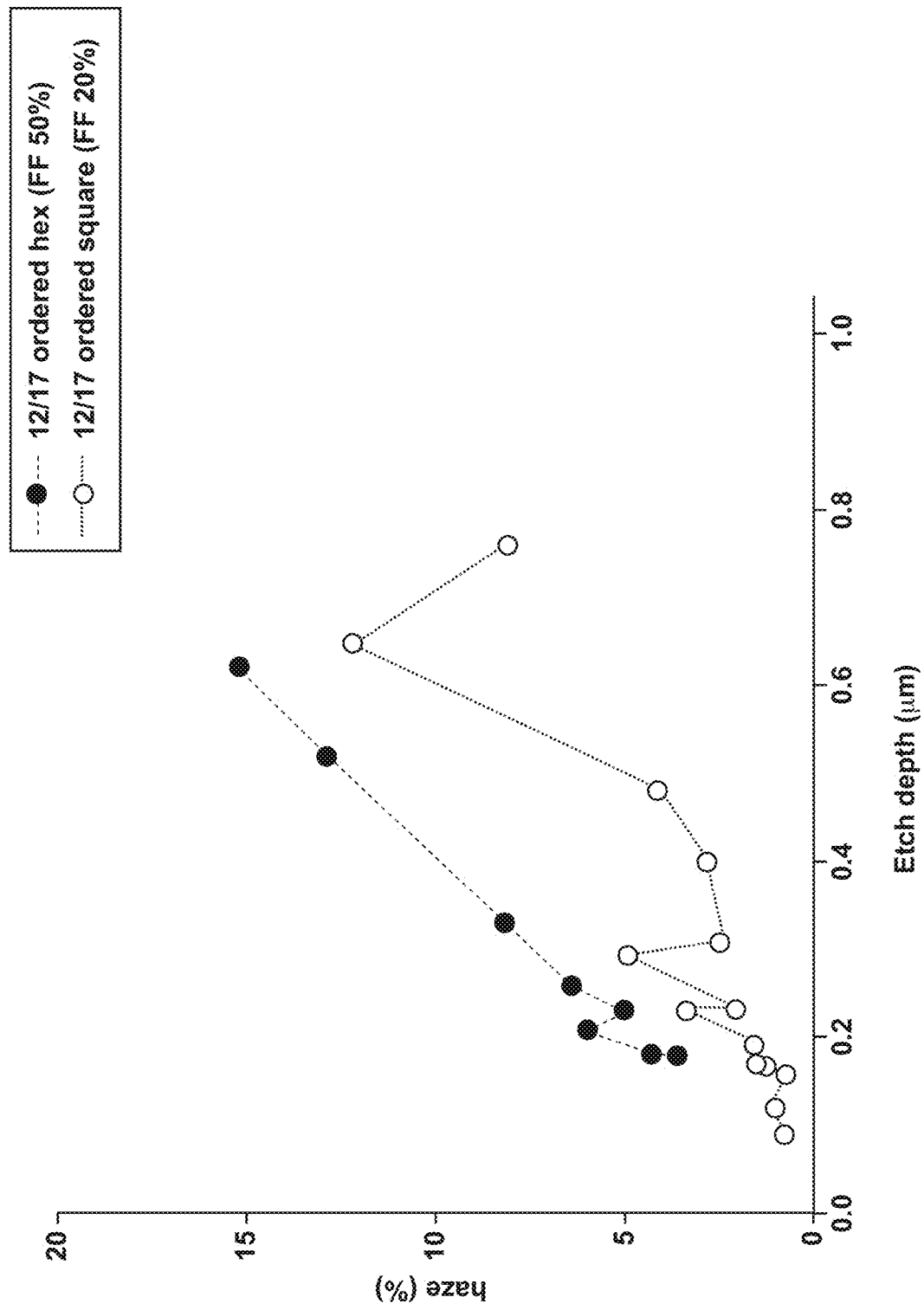

Referring now to FIGS. 10A and 10B, plots are provided of measured $PPD_{140}$ and haze as a function of etch depth for structural features having different sizes and fill fractions from this example. As shown in FIGS. 10A and 10B, the 50-60 array of structural features (see also FIG. 7C) at fill fractions of 36% and 50% exhibits minimum $PPD_{140}$ and haze values at low etch depths of less than 0.2 µm. With regard to FIGS. 10C and 10D, plots are provided of measured $PPD_{140}$ and haze as a function of etch depth for structural features having different sizes and fill fractions from this example. As shown in FIGS. 10C and 10D, the 12-17 array of structural features (see also FIG. 7A) at fill fractions of 20% and 50% also exhibits minimum $PPD_{140}$ and haze values at low etch depths of less than 0.2 µm. More generally, FIGS. 10A-10D demonstrate that these arrays of structural features at periods of 60 µm and 17 µm, respectively, show that $PPD_{140}$ and haze increase as a function of etch depth. Further, the samples having a larger spatial frequency (i.e., the 50-60 array) have more of an impact on $PPD_{140}$ with increasing etch depth (see FIG. 10A), and the samples having a higher frequency (i.e., the 12-17 array) have more of an impact on haze with increasing etch depth (see FIG. 10D).

Example 2

According to this example, an array of structural features (i.e., holes) was developed on a glass substrate with depths of 0.15 µm, 0.2 µm and 0.23 µm (Samples 950, 951, 952, respectively) according to a method consistent with the principles of the disclosure. Table 2 below lists the optical properties measured on these samples, including $PPD_{140}$ (%, as measured in a display unit at 0°), transmissivity (%), haze (%, as measured in transmission at 0°), DOI (coupled, %, as measured in reflectance at 20°) and specular reflectance, Rs (coupled, GU, as measured in reflectance at 20°). As is evident from Table 2, the sample (950) with an etch depth of 0.15 μm exhibits DOI<80%, $PPD_{140}$<2%, and a haze <5%, as consistent with the diffractive surface regions consistent with the disclosure. The other samples, with depths of 0.2 and 0.23 μm, do not exhibit this combination of optical properties. This illustrates the value of preferred depth ranges in achieving targeted combinations of properties, which may vary for different preferred applications.

TABLE 2

| Sample | Depth (μm) | $PPD_{140}$ | Transmissivity | Haze | DOI (Coupled, %) | Rs (Coupled, GU) |
|---|---|---|---|---|---|---|
| 950 | 0.15 | 1.34 | 92.9 | 4.85 | 76 | 5.9 |
| 951 | 0.2 | 1.61 | 92.9 | 8.18 | 93 | 12.5 |
| 952 | 0.23 | 1.77 | 92.9 | 9.07 | 97 | 26.1 |

Figure 11A:
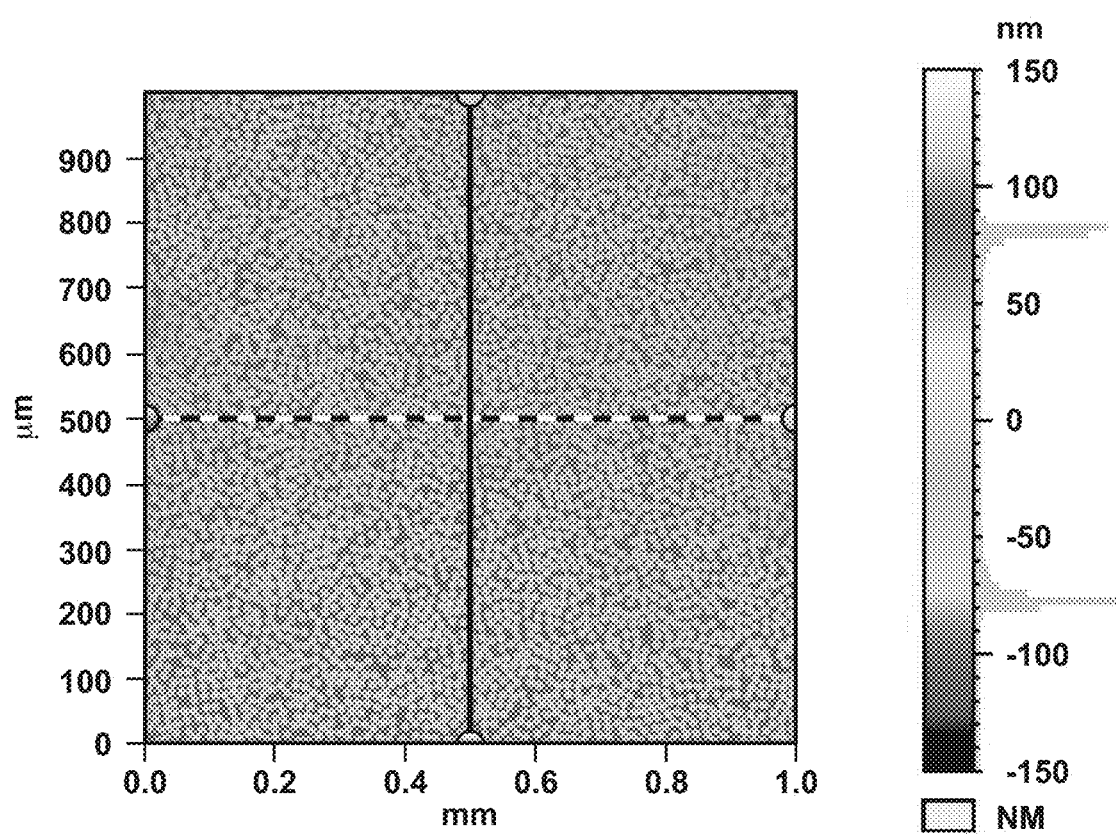
FIG. 11A is an optical image and surface height distribution bar of a diffractive surface region with a first set of structural features having a depth of about 150 nm and a fill fraction of about 50%, according to an embodiment of the disclosure.
Figure 11B:
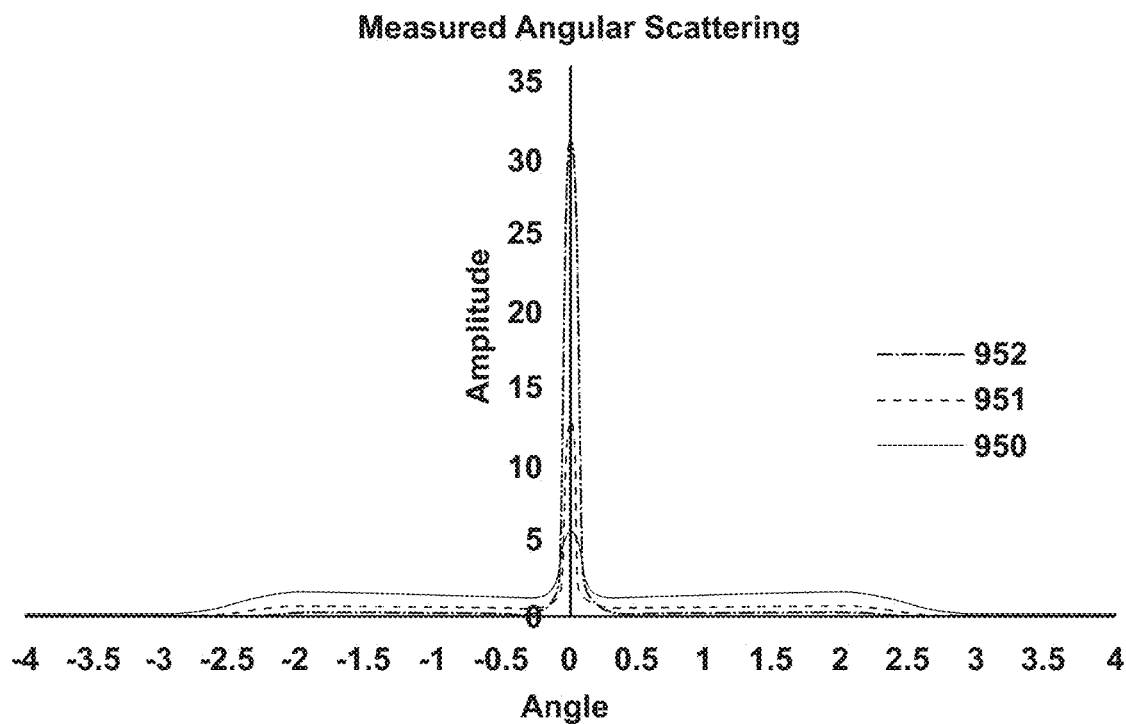
FIG. 11B is an angular plot with amplitude of reflectance vs. reflectance angle in degrees for three articles having differing diffractive surface regions, according to embodiments of the disclosure.

Referring now to FIG. 11A, an optical image and surface height distribution bar of the diffractive surface region of the sample with best combination of optical properties from Table 2 (Sample 950) is provided. More specifically, the structural features of this sample (Sample 950) have a depth of about 150 nm, a fill fraction of 50%, a 12 μm feature diameter/size and a minimum pitch of 14 μm. Referring now to FIG. 11B, an angular spectra plot is provided of the samples from Table 2 in this example. More particularly, the plot of FIG. 11B shows amplitude of reflectance vs. reflectance angle for Samples 950-952. It is evident from FIG. 11B that a reduction in specular reflectance is observed for Sample 950 as compared to Samples 951 and 952. Note that the Rhopoint IQ Gloss Haze & DOI Meter reports an Rs value in gloss units (GU), as listed in Table 2, that is normalized to a maximum of 100 for a flat glass having an index of 1.567 illuminated at 20° angle of incidence and no back-surface reflectance. Such glass is known to have a first-surface absolute reflectance (% R) value of 4.91%. Thus, the Rs value reported by the Rhopoint IQ Meter can be converted to an absolute specular reflectance value (% R value) by multiplying by a factor of 4.91/100. As such, Sample 950, with an Rs amplitude of ~6 at 0°, corresponds to a first-surface absolute specular reflectance value (% R) of 6/100*4.91%=0.295%.

Example 3

According to this example, samples with an array of structural features defining a diffractive surface region were made using screen printing and etching, generating pillars on a glass surface. The target pillar size/diameter was 75 μm on the screen print pattern, which after wetting with the etchant on the glass expanded closer to a diameter of about 100 Further, the target pitch for these samples was 125 μm in a hexagonal pattern with a target fill fraction of 55% (the actual fill fraction was closer to 56%). The screen print pattern was made using an ink on a clean glass surface. Table 3 lists the samples made according to this example, which reflect various etch times that result in various etch depths (i.e., pillar heights), and optical properties associated with these samples (sparkle, haze, DOI and Rs). Further, as noted earlier, the first-surface specular reflectance (Rs, in gloss units (GU)) can be converted to 20° angle of incidence, first-surface absolute specular reflectance (% R) by multiplying them by a factor of 4.91/100. As is evident from Table 3, the optimal etch depth range in terms of the optical property measurements corresponds to ~¼ wavelength of light in air, i.e., the samples at etch depths of 0.141 and 0.172 μm

TABLE 3

| Sample ID | Etch time (s) | Etch depth (μm) | % Sparkle @ 140PPI | % Haze | Coupled DOI | Coupled Rs (GU) |
|---|---|---|---|---|---|---|
| C17-T10a-75H-E30-Bare-C | 30 | 0.099 | 2.9 | 0.35 | 78.6 | 41.0 |
| C17-T10a-75H-E45-Bare-C | 45 | 0.141 | 4.5 | 0.44 | 49.0 | 24.5 |
| C17-T10a-75H-E60-Bare-C | 60 | 0.172 | 4.9 | 0.44 | 37.3 | 12.7 |
| C17-T10a-75H-E75-Bare-C | 75 | 0.203 | 11.1 | 0.58 | 72.7 | 18.7 |
| C17-T10a-75H-E90-Bare-C | 90 | 0.260 | 13.1 | 0.57 | 89.2 | 27.1 |
| C17-T10a-75H-E130-Bare-C | 130 | 0.339 | 16.5 | 0.97 | 92.3 | 40.2 |
| C17-T10a-75H-E145-Bare-C | 145 | 0.396 | 19.5 | 1.19 | 80.5 | 20.5 |
| C17-T10a-75H-E160-Bare-C | 160 | 0.420 | 9.9 | 1.35 | 61.7 | 15.3 |
| C17-T10a-75H-E175-Bare-C | 175 | 0.448 | 9.8 | 1.49 | 62.5 | 30.9 |
| C17-T10a-75H-E190-Bare-C | 190 | 0.505 | 25.7 | 1.96 | 79.7 | 20.9 |
| C17-T10a-75H-E205-Bare-C | 205 | 0.531 | 15.9 | 2.06 | 86.1 | 25.6 |

Figure 12:
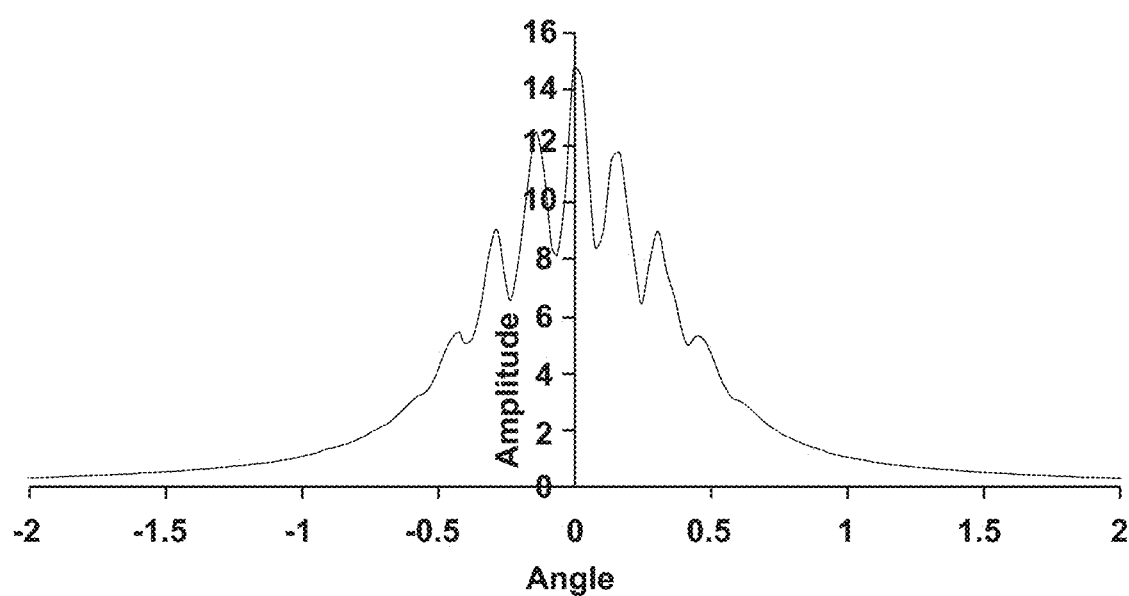
FIG. 12 is an angular plot with amplitude of reflectance vs. reflectance angle in degrees for a display article having a diffractive surface region, according to an embodiment of the disclosure.

Referring now to FIG. 12, an angular spectra plot is provided for the sample in this example with an etch depth of ~0.172 μm (C17-T10a-75H-E60-Bare-C), with the plot depicting amplitude of reflectance vs. reflectance angle. As is evident from FIG. 12 and Table 3, the optimal etch depth for obtaining low DOI and low Rs lies in the range of 120 to 180 nm for the structural features, and the other etch depths do not exhibit this combination of optical properties.

Figure 13A:
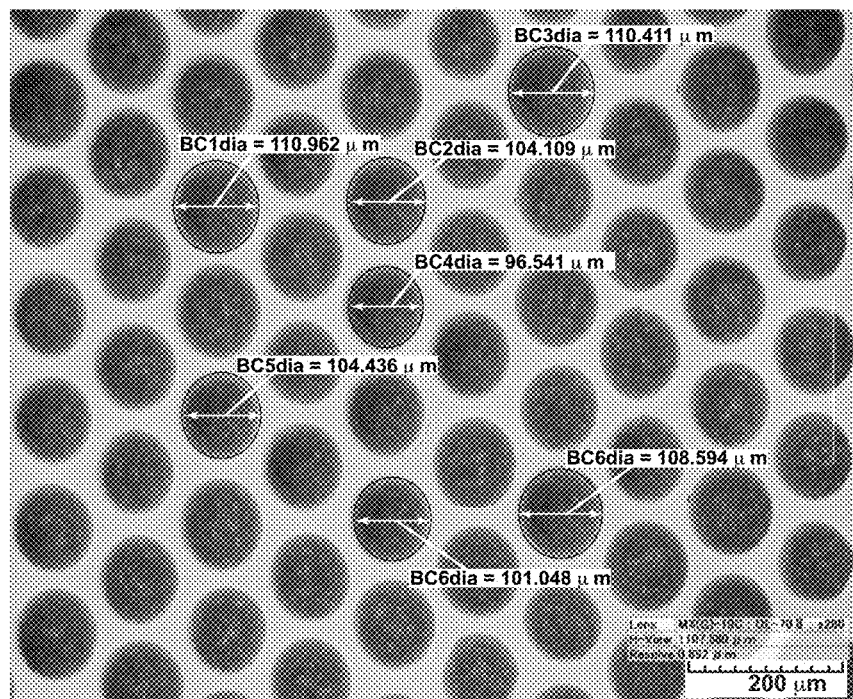
FIGS. 13A and 13B are optical images of a display article with a diffractive surface region, before and after removal of a mask and etchant employed in a method of making a display article, according to an embodiment of the disclosure.
Figure 13B:
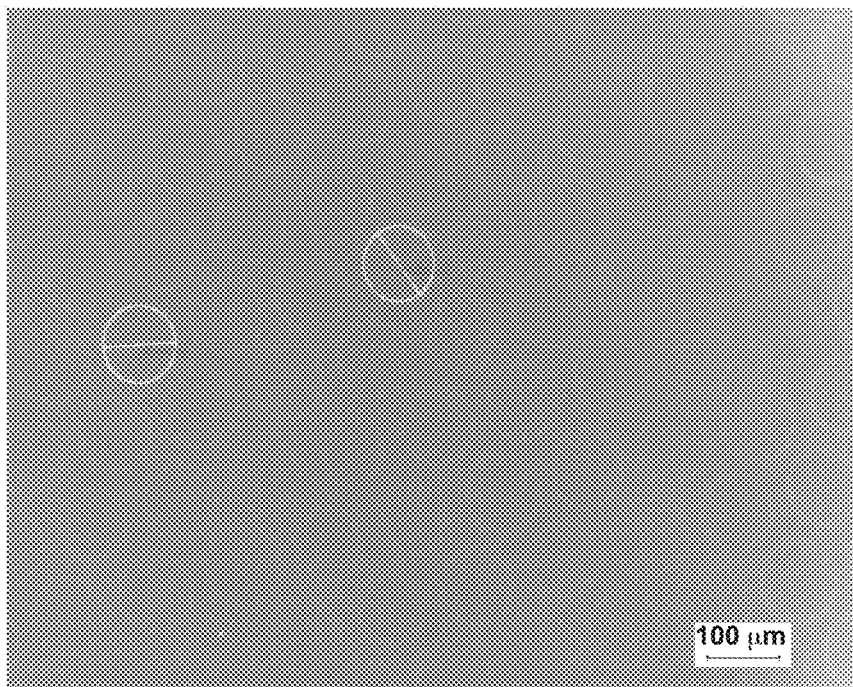

Referring now to FIGS. 13A and 13B, optical images are provided of the diffractive surface region and structural features of the sample depicted in FIG. 12 and Table 3 with an etch depth of 0.172 μm (C17-T10a-75H-E60-Bare-C), as viewed before and after removal of the ink as part of the screen printing and etching process. As noted earlier in the description of this example, the target size/diameter of these features was about 75 μm; however, upon expansion of the ink upon drying, the actual size of the screen-printed features (i.e., the mask) ranged from 101 to 110 μm for the specific features depicted in FIG. 13A. Also, as is evident from FIG. 13B, the regions around these ink circles were etched, thus forming the pillars of this example.

Figure 14:
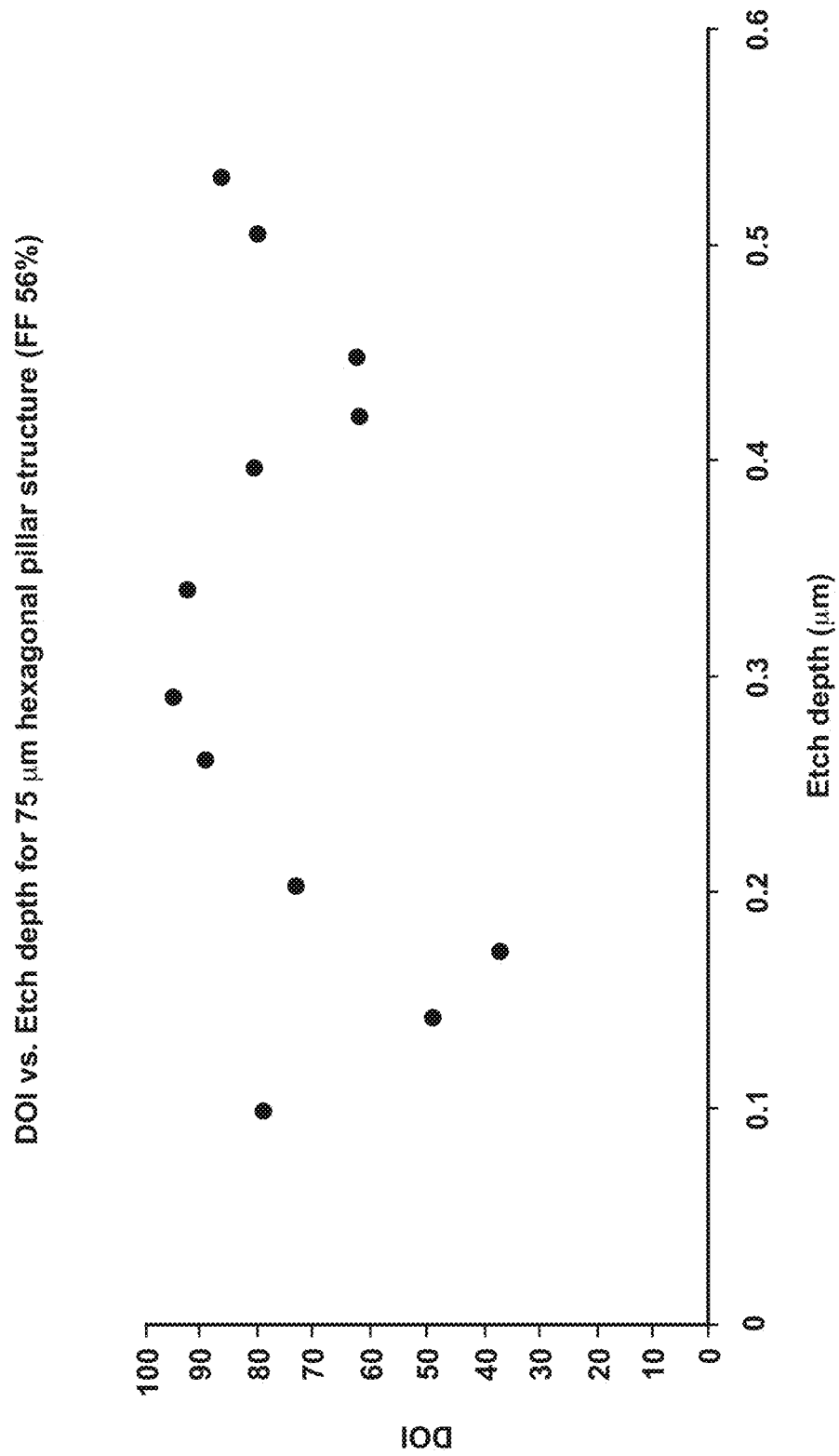
FIG. 14 is a plot of distinctness of image (DOI) as a function of etch depth for structural features of a diffractive surface region of a display article, according to an embodiment of the disclosure.

Referring now to FIG. 14, a plot is provided of DOI as a function of etch depth for the structural features of this example and detailed above in Table 3. As noted earlier, the preferred etch depth is at about ¼ wavelength of light between 0.1 and 0.2 μm with regard to reductions in DOI. In addition, a second preferred etch depth in terms of DOI is located at about % wavelength of the light at an etch depth between 0.4 and 0.5 The % wavelength etch depth can be less desirable because of its effect on transmitted light, as shown by the higher $PPD_{140}$ values in Table 3, as well as its lesser impact on DOI as relative to the samples at the ¼ wavelength etch depth. These results are generally consistent with the previously described diffractive antiglare optical models.

Example 4

While the diffractive surface regions of the display articles of the disclosure employ structural features having a multimodal distribution of surface heights (e.g., a bimodal distribution of surface heights), embodiments of these diffractive surface regions employ spatial randomization of the features in the X-Y dimension. In this example, two X-Y pattern randomizations are employed for the diffractive surface regions—a "hard sphere" distribution and a "Poisson disk" distribution. The former hard sphere pattern design targeted structural features at approximate 50% fill fractions, and samples with structural features having 12 μm and 50 μm diameters, respectively, were prepared according to this pattern. The latter Poisson disk pattern design targeted structural features at approximate 36% fill fractions. Each of these X-Y randomization schemes can also target diffractive surface regions with structural features at different fill fractions, feature depths, and combinations with antireflective coatings. Further, as is evident from this example and noted earlier, the level and type of feature randomization in the X-Y dimension can be very important to achieving low PPD while also minimizing other display artifacts such as Moiré or color banding.

Figure 15:
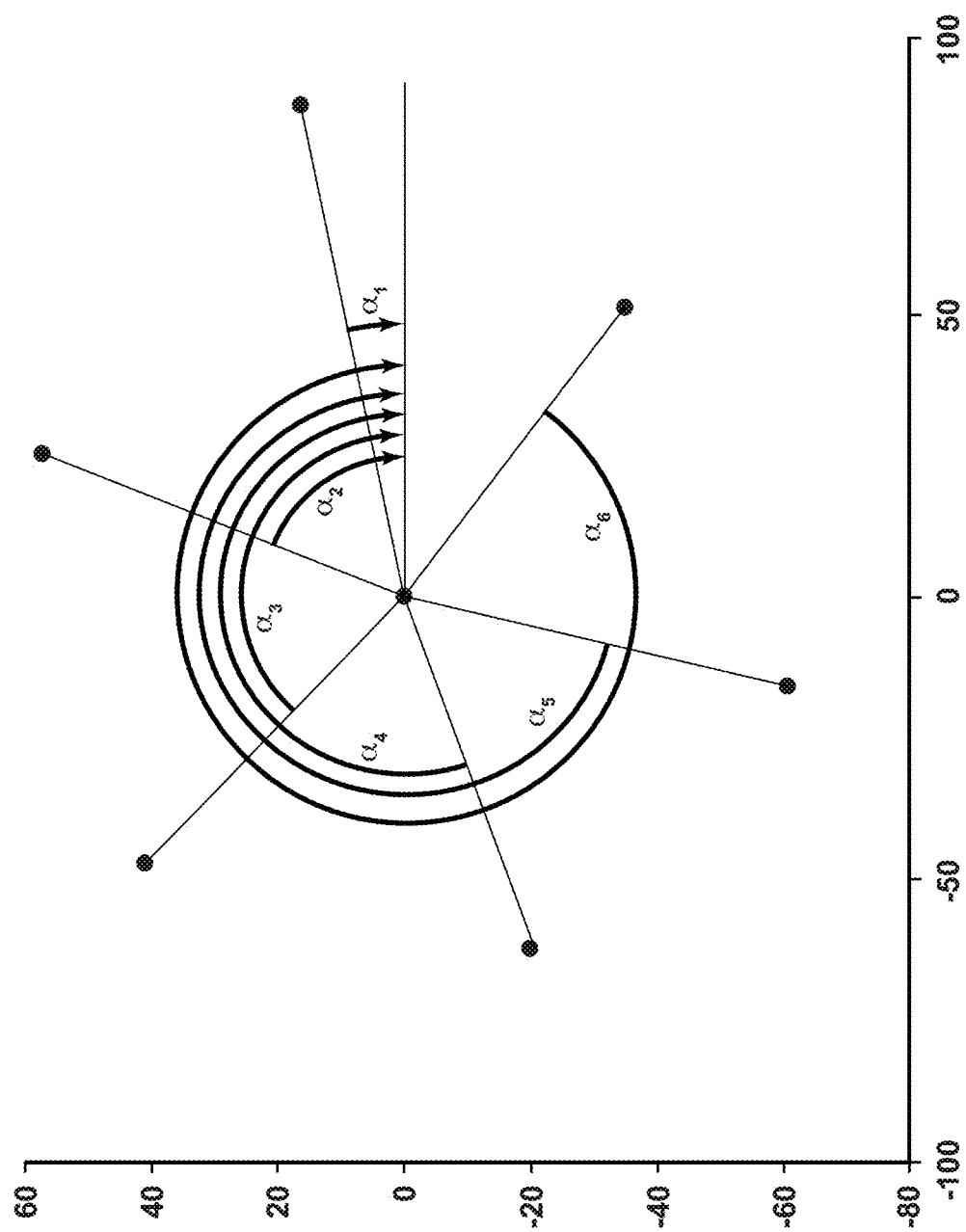
FIG. 15 is a schematic plot of seven structural features of a diffractive surface region, as arranged in a hexagonal pattern to depict hexagonality (H), according to an embodiment of the disclosure.

X-Y pattern randomization can be defined in different ways. One method is hexagonality with FIG. 15 showing the definition of hexagonality (H). Hexagonality is a metric for quantifying locally how close a pattern is to a hexagonal lattice. For each point in the pattern, the hexagonality (H) at that point is computed using the angles of its six nearest neighbors with respect to an arbitrary axis. The mean hexagonality (H) can be defined as follows by Equation (1):

$$H = \frac{1}{6}\left|\sum_{k=1}^{6} e^{6i\alpha_k}\right| \in [0, 1] \quad (1)$$

where k=1 to 6 for the six nearest neighbor structural features to the one structural feature and $a_k$ represents the angles of each of the six nearest neighbor structural features to an arbitrary axis. As such, in the context of the diffractive surface region of the display articles of the disclosure, the spatial distribution of the plurality of structural features can have a mean hexagonality (H) that ranges from 0.4 to 1.0, according to embodiments of the disclosure. As shown in FIG. 15, the variables $a_k$ represent the angles of the six nearest neighbors. On a hexagonal lattice, these six angles all differ by 60 degrees (π/3 radians); therefore, the exponents in the six summands differ by a radians and the six complex numbers in the summation are all the same. H is unity in that case. One may take the mean hexagonality (H) of the pattern as a global metric of deviation from a perfect hexagonal lattice, useful if the pattern is homogenous. A perfect hexagonal lattice has a mean hexagonality (H) of 1.0. A completely random, stationary Poisson distribution of points has a mean hexagonality (H) of approximately 0.36, or 36%. As such, according to embodiments of the display article 100 depicted in FIGS. 1A and 1B, the plurality of structural features 20 can be characterized with a non-random spatial distribution such that H ranges from 0.4 to 0.95, from 0.4 to 0.9, from 0.4 to 0.8, from 0.36 to 0.9, from 0.36 to 0.8, from 0.36 to 0.7, and all mean hexagonality (H) values and ranges between the foregoing ranges.

Figure 16A:
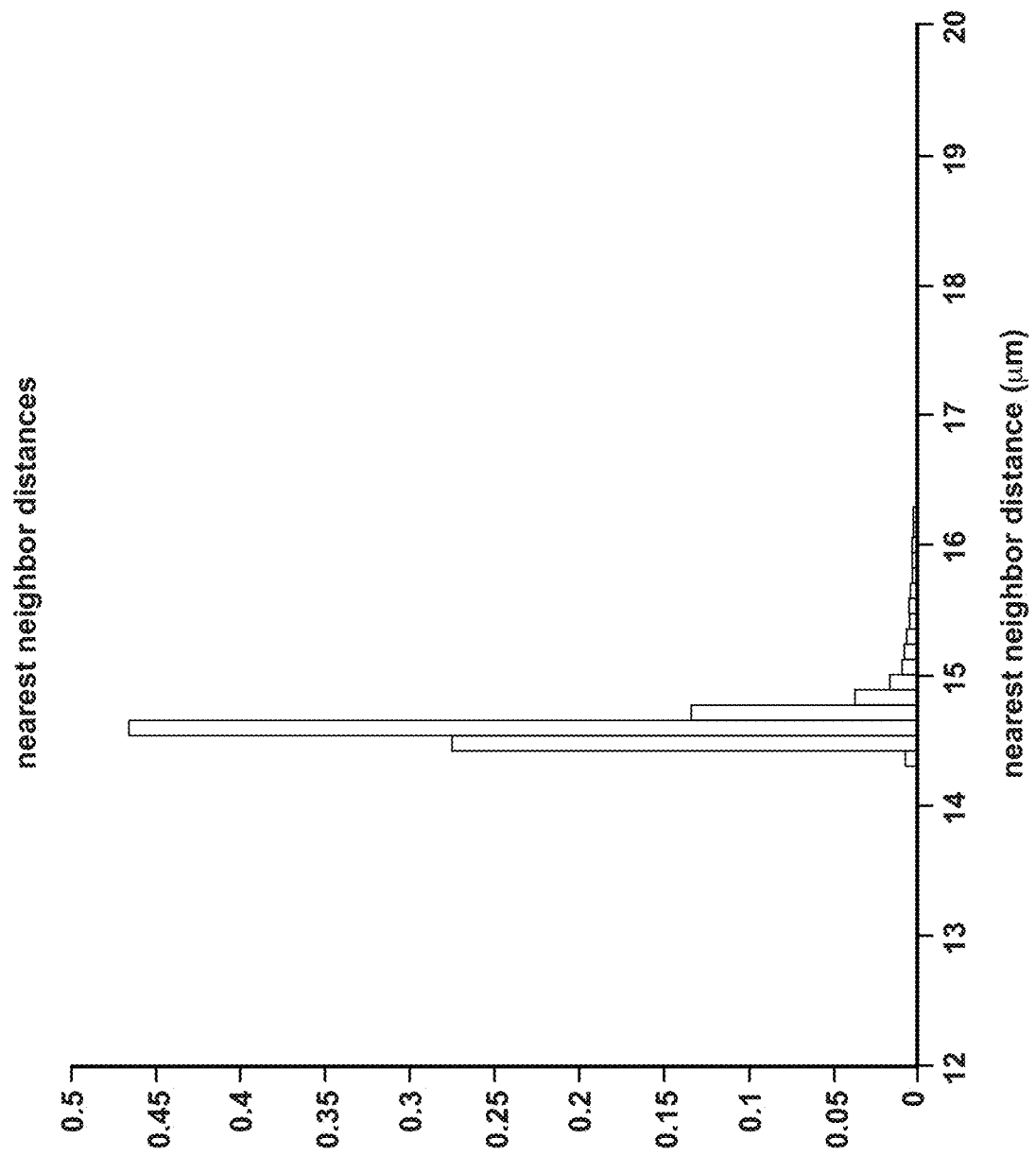
FIGS. 16A and 16B are nearest neighbor distribution and pattern periodogram plots, respectively, of a diffractive surface region of a display article, according to an embodiment of the disclosure.
Figure 16B:
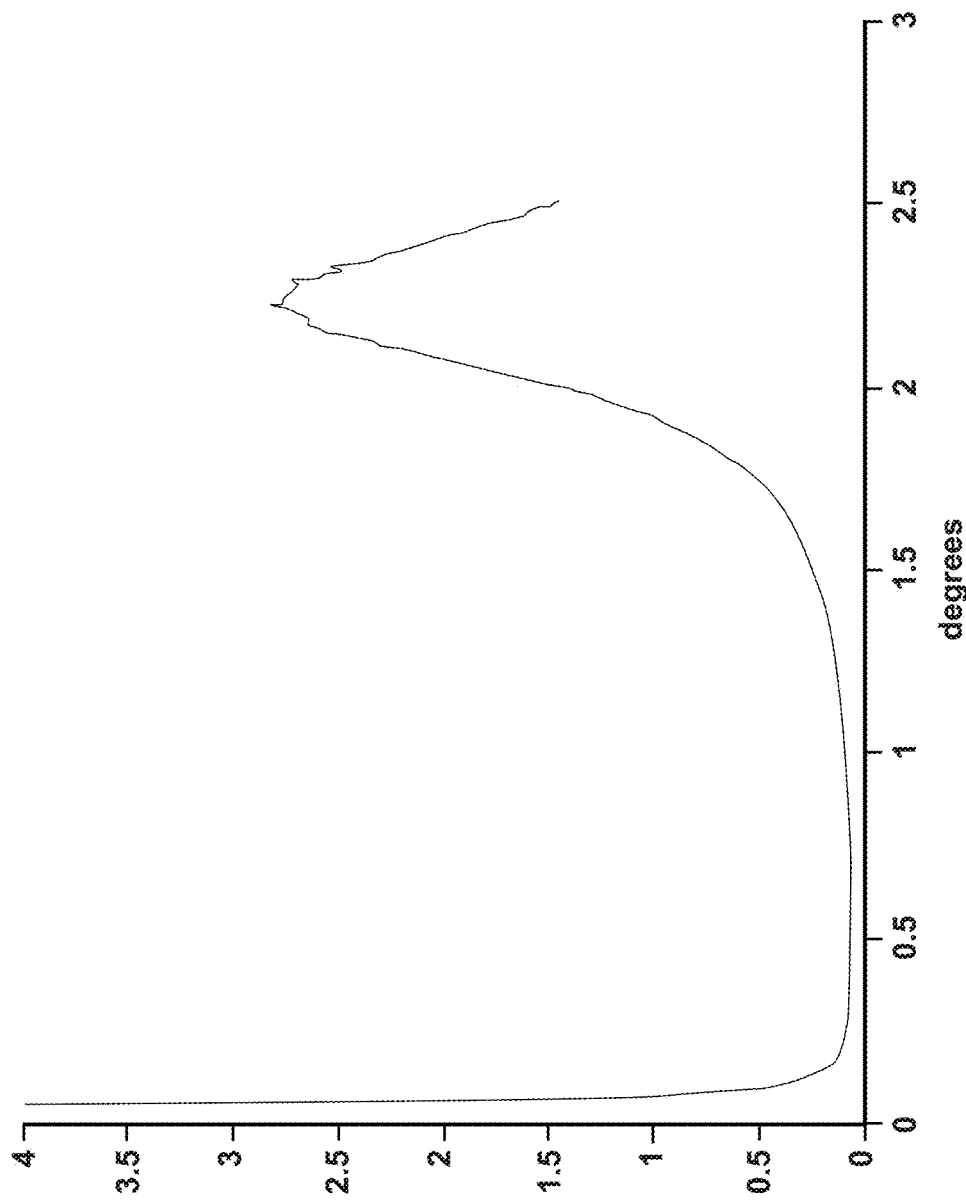

With further regard to the hard sphere randomization pattern, this pattern was employed in the formation of the structural features of the diffractive surface region depicted in FIGS. 7C and 7D. These patterns were generated using a molecular dynamics simulation tool (LAMMPS) to generate the pattern. A gas of "molecules" representing the features was initially placed on a two-dimensional hexagonal lattice to fix the fill fraction at 50%. Then the gas was heated and allowed to randomize in two dimensions. The molecules were endowed with a repulsive hard-sphere potential to maintain the minimum specified spacing. The example pattern in FIG. 7C has a mean hexagonality (H) of 49% (see also FIG. 15), indicating a large deviation from a regular lattice. The "12-14" and "50-60" arrays have pattern geometries that are the same: the 50-60 pattern is simply the 12-14 pattern scaled up by an overall factor of 50/12. This scaling does not impact fill fraction, hexagonality or feature distribution functions (aside from an obvious scaling of axes), but it does impact the optical performance of the texture. The distribution of nearest neighbor distances (defined as center-to-center spacing of features in the X-Y space) of the 12/14 pattern is shown in FIG. 16A. Its periodogram is shown in FIG. 16B. Instead of spatial frequency, the X-axis of FIG. 16B is converted to off-specular scattering angle in degrees, for an optical wavelength of 0.55 μm.

Figure 17A:
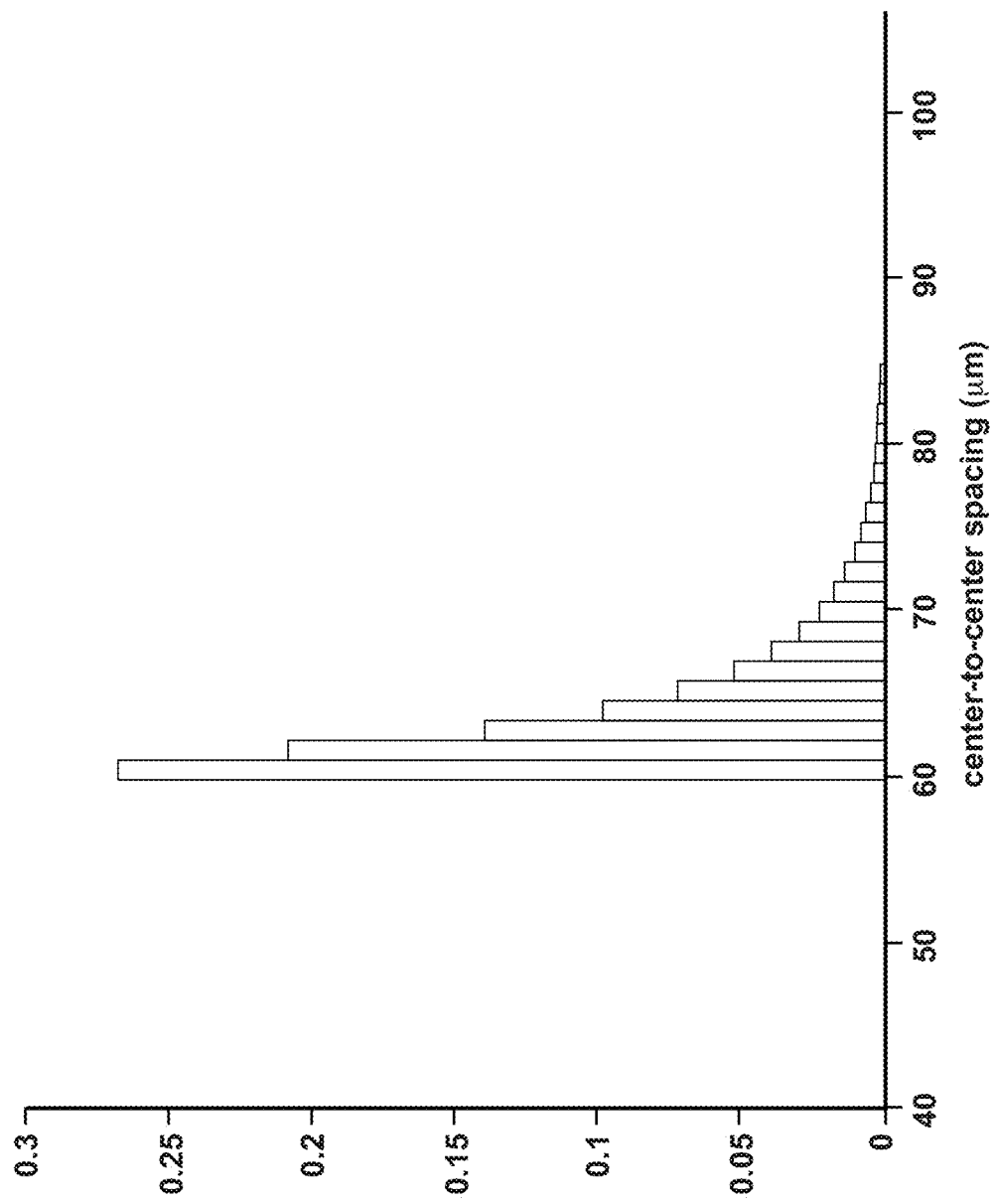
FIGS. 17A and 17B are nearest neighbor distribution and pattern periodogram plots, respectively, of a diffractive surface region of a display article, according to an embodiment of the disclosure.
Figure 17B:
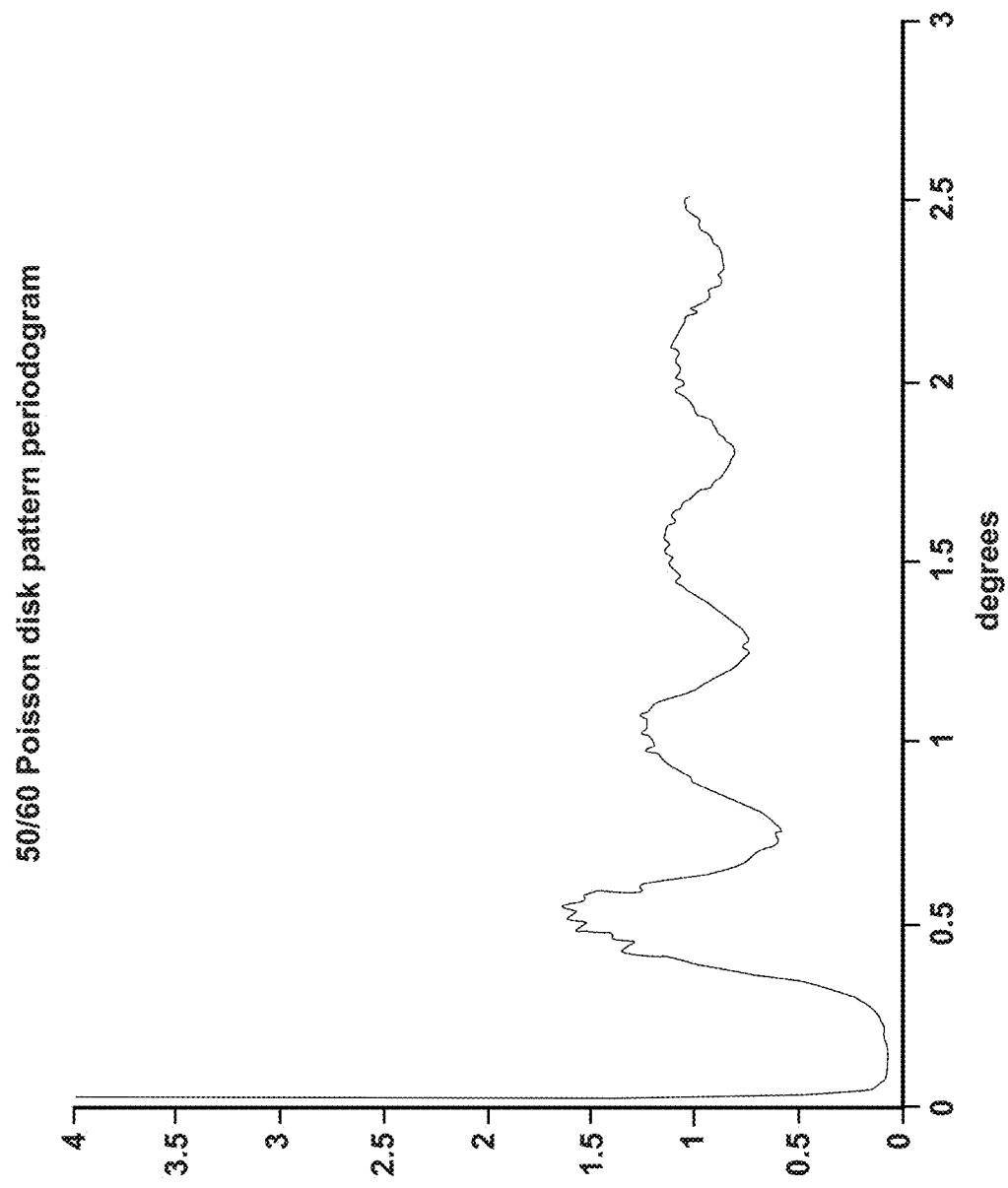

Turning to the other 50/60 array (see FIGS. 9A and 10A) has a larger distribution of nearest neighbor distances and a lower fill fraction (36%). The structural features of these samples were arranged in a Poisson disk pattern that was generated using a "dart throwing" algorithm. This algorithm ensures an absolute minimum feature spacing (60 μm in this example), but is not very efficient at filling space. The mean hexagonality (H) is lower, at 41%. The distribution of nearest neighbor distances for the 50/60 Poisson disk pattern is shown in FIG. 17A. Its periodogram is shown in FIG. 17B. Instead of spatial frequency, the X-axis of FIG. 17B is converted to off-specular scattering angle in degrees, for an optical wavelength of 0.55 μm.

Example 5

Figure 19:
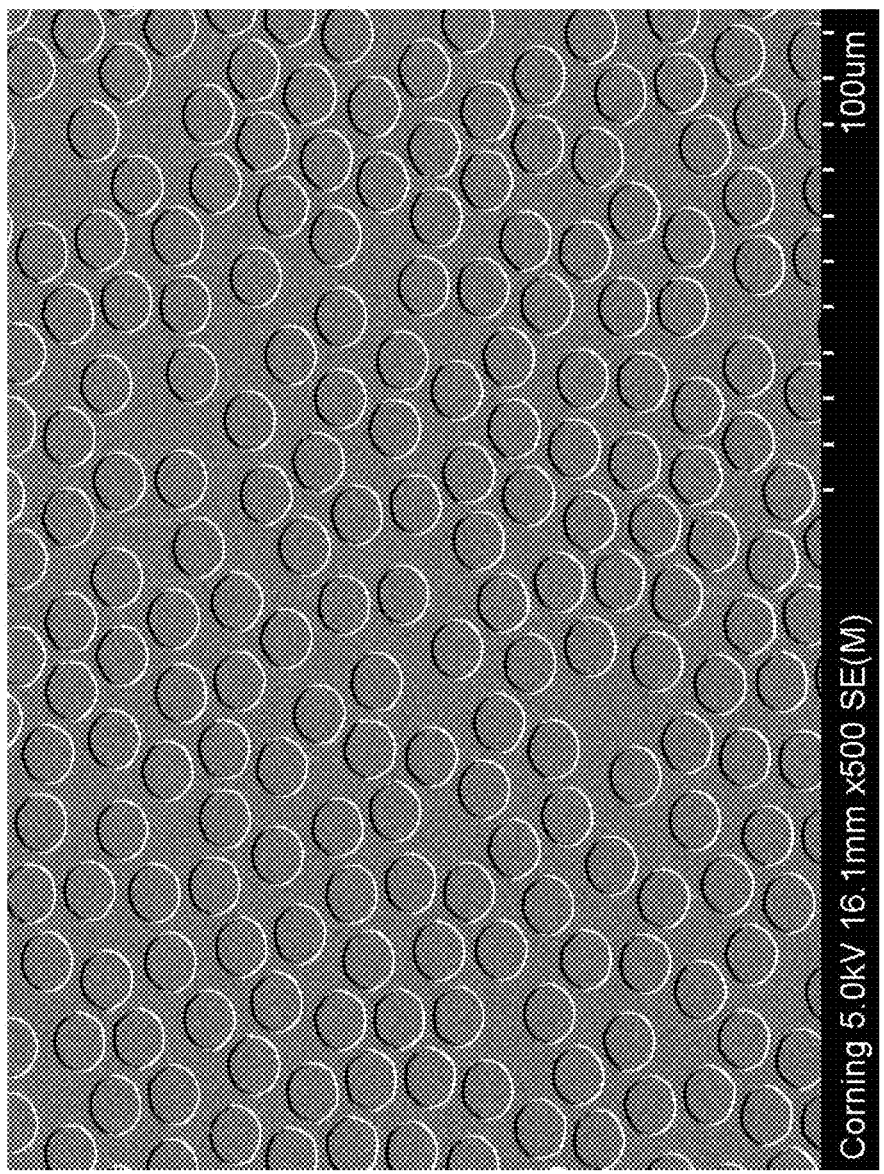
FIG. 19 is a scanning electron microscope (SEM) image of a display article, according to an embodiment of the disclosure.

According to this example, a display article was fabricated with a method consistent with the embodiment of FIG. 6 (see corresponding description) with a strengthened, aluminosilicate glass substrate having a primary surface with a diffractive surface region and a multilayer AR coating structure disposed thereon. As shown in FIG. 19, the diffractive surface region comprises structural features in the form of holes etched into the glass surface having a diameter of about 12 μm. The holes have a randomized pattern that was generated through photolithography (see FIG. 6 and corresponding description), a 14 μm minimum pitch, a targeted hole area fill fraction of 50% and an etch depth of about 0.16 μm to 0.17 μm (160-170 nm). The positions of the holes were randomized using a 'hard sphere' pattern (see preceding Example).

After glass etching and photolithographic mask removal, the glass substrate was strengthened by ion-exchange and the entire surface (as including the diffractive surface region) was coated with a 5-layer AR coating using reactive sputtering, with the layer design shown in Table 1A (i.e., with a total thickness of about 261 nm). The AR coating evenly coats the mesas and valleys of the diffractive AG surface region, allowing both the multilayer AR interference effects and the diffractive AG effects to operate simultaneously. This is due to the optical design strategy and the high precision fabrication (dimensional control) of both the diffractive surface morphology and the multilayer AR coating. 'Edge effects' from the edges of the surface texture valleys are minimized in part by the design approach which uses relatively large (12 micron diameter) holes/valleys, as compared to the relatively thin (0.26 μm) AR coating thickness and relatively shallow (0.16 μm) etch depth.

Figure 20:
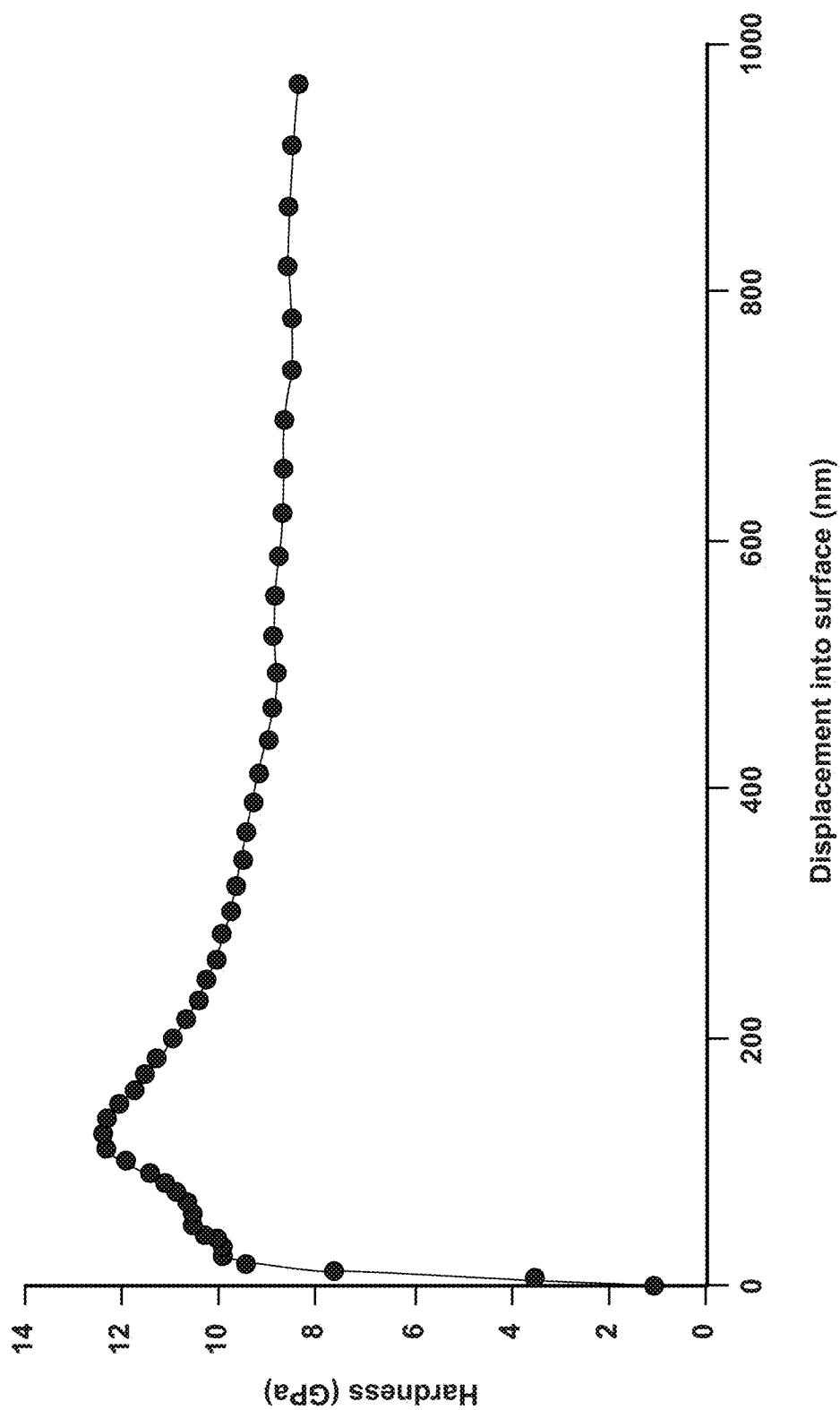
FIG. 20 is a plot of hardness vs. indentation depth of a display article, as measured according to a Berkovich Indenter Hardness Test, according to an embodiment of the disclosure.

These $SiO_xN_y$—$SiO_2$ based AR coatings, despite their relative thinness, demonstrate a measurable coated surface hardness that is higher than the glass substrate, owing to the high hardness of the $SiO_xN_y$ material. Hardness was measured on sister test samples made according to the method outlined earlier in this same example. As shown in FIG. 20, mechanical properties were measured on these sister samples with a Berkovich Indenter Hardness Test with the following results: hardness at 100 nm indentation depth=11.9 GPa; hardness at 500 nm depth=8.8 GPa; and a maximum hardness (at ~125 nm depth)=12.4 GPa.

Table 4 below summarizes the optical performance demonstrated experimentally for the samples in this example having a diffractive AG surface region and a multilayer AR coating (Ex. 5B), compared to a sample having a diffractive AG surface region without the multilayer AR (Ex. 5A), and the same multilayer AR coated on a glass substrate with no diffractive surface region (Comp. Ex. 5). These results show the enhanced performance that can be achieved using the combined diffractive AG surface region plus multilayer AR coating approach. In particular, the specular reflectance of 0.077% for Ex. 5B is significantly lower than for either Ex. 5A (0.25%) or Comp. Ex. 5 (0.61%) alone.

The specular reflectance values in Table 4 were measured using a Rhopoint IQ Goniophotometer, which is somewhat unique relative to other instruments for measuring specular reflectance, in that the specular reflectance value report (Rspec) is measured in a small angular aperture range of +/−0.1 degrees (compared to +/−2 degrees for other common instruments). This small angular aperture gives a higher resolution of separation between specular and non-specular reflected light. The 1-side % Reflectance in Table 4 below was calculated by normalizing the Rspec value to the value measured (Rspec=85) using the same coupling method on a reference glass substrate with a known $1^{st}$-surface reflectance (4.16% R for a glass with index=1.51 at 20°). Thus, the Rspec value of 1.6 was converted to % specular reflectance using the calculation 1.6*(4.16%/85)=0.077% reflectance. This method of calculation agrees well with the expected conversion between Rspec, Gloss and % Reflectance provided by the instrument manufacturer, which is a conversion factor of 100% Reflectance=2000 gloss units, which matches the previously described ratio of 4.91/100. Using either calculation method gives practically the same values, thus multiplying by the ratio 4.16%/85, 100%/2000, or 4.91/100 gives the same result, within practical measurement error ranges. Using this same conversion ratio, the gloss units in Table 4 below can be converted to % Reflectance values. For example, the 20° gloss value of 2.7 for Example 2 corresponds to a % Reflectance value of 2.7*(100%/2000)=0.13%. The reason for the difference between % R calculated from the 20° gloss and % R calculated from 20 degree Rspec is the different angular acceptance of the gloss measurement, which is +/−0.9 degrees from the specular angle, according to the method of ASTM D523, as opposed to +/−0.1 degrees angular acceptance range for the measured Rspec value. Further according to ASTM D523, the angular acceptance range for 60° gloss is +/−2.2 degrees, and for 85° gloss is +/−2.0 degrees (all angular acceptance values are in the plane of the measurement).

All Rhopoint IQ measured values in Table 4 below were measured in the coupled state (leading to $1^{st}$-surface values), meaning that the back surface of the glass sample was coupled with an index-matching oil to an absorber, which effectively removes reflectance from the back surface of the sample (back surface reflectance not included in measured values). Pixel power deviation (PPD), or sparkle, values were measured using an internal instrument ('SMS1') according to the methods of U.S. Pat. No. 9,411,180 (US '180) on a 140 PPI display, as referenced to the native display pixel power variations, with the salient portions of US '180 hereby incorporated by reference into this disclosure. "Sparkle," "sparkle contrast," "display sparkle," "pixel power deviation," "PPD", or like terms refers to the visual phenomenon that occurs when a textured transparent surface is combined with a pixelated display. Generally speaking, quantitation of sparkle involves imaging a lit display or simulated display with the textured surface in the field of view. The calculation of sparkle for an area P is equal to σ(P)/μ(P), where σ(P) is the standard deviation of the distribution of integrated intensity for each display pixel contained within area P divided by the mean intensity μ(P). Following guidance in the literature, one could build an imaging system to quantify sparkle. (See, e.g., US '180; A. Stillwell, et al., "Perception of Sparkle in Anti-Glare Display Screens," JSID 22(2), 129-136 (2014); and C. Cecala, et al., "Fourier Optics Modeling of Display Sparkle from Anti-Glare Cover Glass: Comparison to Experimental Data", Optical Society of America Imaging and Applied Optics Congress, JW5B.8 (2020).) Alternatively, a commercially available system (e.g. the SMS-1000, Display Messtechnik & Systeme GmbH & Co. KG, Germany) can also be used. A 140 PPI display (e.g. Z50, Lenovo Group Limited, Hong Kong) with only the green subpixels lit (R=0, B=0, G=255), at full display brightness was imaged using a f=50 mm lens/machine vision camera combination. The lens settings were aperture=5.6, and depth of field=0.3; and with these settings, the ratio of display pixels to camera pixels is approximately 1 to 9. The field of view for analysis contained approximately 7500 display pixels. Camera settings had the gain and gamma correction turned off. Periodic intensity variations from, e.g., the display, and non-periodic intensity variations, e.g., dead pixels, were removed during analysis prior to the calculation of sparkle.

Further, % Transmittance and % Transmitted haze values reported in Table 4 are two-surface measurements (i.e., as between both primary surfaces of the substrate) that are performed using a BYK Haze-Gard instrument.

TABLE 4

| | | BYK Haze-Gard | Internal | Rhopoint IQ, Coupled measurements | | | | | | |
|---|---|---|---|---|---|---|---|---|---|---|
| Sample | % T | Trans. Haze % | (SMS1) PPD$_{140}$ % | Refl. Haze % | Gloss 20° | Gloss 60° | Gloss 85° | DOI 20° | Rspec 20° (GU) | 1-side specular % R, @20°, ±0.1° aperture* |
| Ex. 5A - Diffractive AG | 92.9 | 6.20 | 1.32 | 32.9 | 12.4 | 50.6 | 94.7 | 77.9 | 5.1 | 0.25 |
| Ex. 5B - Diffractive AG + Multilayer AR | 95.5 | 6.15 | 1.30 | 5.9 | 2.7 | 33.2 | 92.6 | 88.2 | 1.6 | 0.077 |
| Comp. Ex. 5 - Multilayer AR only | 96.0 | 0.17 | 0.22 | n/m | 13.4 | 49.8 | 94.5 | 99.4 | 12.4 | 0.61 |

*These measurements were calculated.

As outlined herein, a first aspect of the disclosure pertains to a display article. The display article comprises: a substrate comprising a thickness and a primary surface; and the primary surface having defined thereon a diffractive surface region. The diffractive surface region comprises a plurality of structural features that comprises a plurality of different heights in a multimodal distribution. Further, the substrate exhibits a sparkle of less than 4%, as measured by pixel power deviation (PPD$_{140}$) at an incident angle of 0° from normal, a distinctness of image (DOI) of less than 80% at an incident angle of 20° from normal, and a transmittance haze of less than 20% from an incident angle of 0° from normal.

According to a second aspect, the first aspect is provided, wherein the plurality of structural features further comprises a first portion of structural features having a first average height and a second portion of structural features having a second average height.

According to a third aspect, the second aspect is provided, wherein the first average height and the second average height have a difference of from 50 nm to 250 nm.

According to a fourth aspect, the second aspect is provided, wherein the first average height and the second average height have a difference of from 120 nm to 200 nm.

According to a fifth aspect, any one of the second through fourth aspects is provided, wherein the diffractive surface region further comprises a first planar region corresponding to the first average height and a second planar region corresponding to the second average height. Further, each of the first planar region and the second planar region comprises a root-mean-square (RMS) height variation of less than 50 nm.

According to a sixth aspect, the fifth aspect is provided, wherein the first and second planar regions have a total surface area that is at least 50% of a total surface area of the diffractive surface region.

According to a seventh aspect, any one of the first through sixth aspects is provided, wherein the substrate comprises a glass composition.

According to an eighth aspect, any one of the first through seventh aspects is provided, wherein the substrate further exhibits a sparkle of less than 2%, as measured by PPD$_{140}$ at an incident angle of 0° from normal.

According to a ninth aspect, any one of the first through eighth aspects is provided, wherein the substrate further exhibits a transmittance haze of less than 5% from an incident angle of 0° from normal.

According to a tenth aspect, any one of the first through ninth aspects is provided, wherein the substrate further exhibits a first-surface absolute specular reflectance (% R) of less than 1% at an incident angle of 20° from normal.

According to an eleventh aspect, any one of the first through tenth aspects is provided, further comprising an antireflective coating disposed on the primary surface of the substrate. The antireflective coating comprises a plurality of alternating high refractive index and low refractive index layers. Each of the low refractive index layers comprises a refractive index of less than or equal to about 1.8, and each of the high refractive index layers comprises a refractive index that is greater than 1.8. Further, the article exhibits a first-surface absolute specular reflectance (% R) of less than 0.1% at an incident angle of 20° from normal.

A twelfth aspect of the disclosure pertains to a display article. The display article comprises: a substrate comprising a thickness and a primary surface; and the primary surface having defined thereon a diffractive surface region. The diffractive surface region comprises a plurality of structural features comprising a pitch of less than 125 μm and a fill fraction from 30% to 70%, each structural feature comprising a diameter of less than 100 μm. Further, the substrate exhibits a sparkle of less than 4%, as measured by pixel power deviation (PPD) at an incident angle of 0° from normal, a distinctness of image (DOI) of less than 80% at an incident angle of 20° from normal, and a transmittance haze of less than 20% from an incident angle of 0° from normal.

According to a thirteenth aspect, the twelfth aspect is provided, wherein the substrate comprises a glass composition.

According to a fourteenth aspect, the twelfth or the thirteenth aspect is provided, wherein the substrate further exhibits a sparkle of less than 2%, as measured by PPD$_{140}$ at an incident angle of 0° from normal.

According to a fifteenth aspect, any one of the twelfth through fourteenth aspects is provided, wherein the substrate further exhibits a transmittance haze of less than 5% from an incident angle of 0° from normal.

According to a sixteenth aspect, any one of the twelfth through fifteenth aspects is provided, wherein the substrate further exhibits a first-surface absolute specular reflectance (% R) of less than 1% at an incident angle of 20° from normal.

According to a seventeenth aspect, any one of the twelfth through sixteenth aspects is provided, wherein a first portion of the plurality of structural features comprises pillars having a first average height from 50 nm to 250 nm.

According to an eighteenth aspect, the seventeenth aspect is provided, wherein the plurality of structural features further comprises a plurality of heights in a multimodal distribution. The multimodal distribution further comprises the first portion of structural features at the first average height and a second portion of structural features at a second average height. Further, the first portion of the distribution has a first fill fraction from 30 to 70% and the second portion of the distribution has a second fill fraction of 100% minus the first fill fraction.

According to a nineteenth aspect, any one of the twelfth through sixteenth aspects is provided, wherein a first portion of the plurality of structural features comprises holes having a first average depth from 50 nm to 250 nm.

According to a twentieth aspect, the nineteenth aspect is provided, wherein the plurality of structural features further comprises a plurality of depths in a multimodal distribution. The multimodal distribution further comprises the first portion of structural features at the first average depth and a second portion of structural features at a second average depth. Further, the first portion of the distribution has a first fill fraction from 30 to 70% and the second portion of the distribution has a second fill fraction of 100% minus the first fill fraction.

According to a twenty-first aspect, any one of the twelfth through twentieth aspects is provided, wherein the fill fraction is from 40% to 55%.

According to a twenty-second aspect, any one of the twelfth through twenty-first aspects is provided, wherein each structural feature further comprises an aspect ratio of more than 10.

According to a twenty-third aspect, any one of the twelfth through twenty-second aspects is provided, wherein the plurality of structural features further comprises a period of from 5 µm to 100 µm.

According to a twenty-fourth aspect, any one of the twelfth through sixteenth aspects is provided, further comprising an antireflective coating disposed on the primary surface of the substrate. The antireflective coating comprises a plurality of alternating high refractive index and low refractive index layers. Each of the low refractive index layers comprises a refractive index of less than or equal to about 1.8 and about the same or greater than a refractive index of the substrate. Each of the high refractive index layers comprises a refractive index that is greater than 1.8. Further, the article exhibits a first-surface absolute specular reflectance (% R) of less than 0.1% at an incident angle of 20° from normal.

A twenty-fifth aspect of the disclosure pertains to a display article. The display article comprises: a substrate comprising a thickness and a primary surface; and the primary surface having defined thereon a diffractive surface region. The diffractive surface region comprises a plurality of structural features comprising a pitch of less than 125 µm, and a fill fraction from 30% to 70%. Further, each structural feature comprises a height or depth of from 50 nm to 250 nm.

According to a twenty-sixth aspect, the twenty-fifth aspect is provided, wherein the plurality of structural features further comprises a non-random spatial distribution.

According to a twenty-seventh aspect, the twenty-fifth or twenty-sixth aspect is provided, wherein the substrate exhibits a sparkle of less than 4%, as measured by pixel power deviation ($PPD_{140}$) at an incident angle of 0° from normal, a distinctness of image (DOI) of less than 80% at an incident angle of 20° from normal, and a transmittance haze of less than 20% from an incident angle of 0° from normal.

According to a twenty-eighth aspect, any one of the twenty-fifth through twenty-seventh aspects is provided, wherein the non-random spatial distribution of the plurality of structural features comprises a mean hexagonality (H) of from greater than 0.4 to less than 1.0, wherein the hexagonality (H) of one structural feature is given by Equation (1):

$$H = \frac{1}{6}\left|\sum_{k=1}^{6} e^{6i\alpha_k}\right| \in [0, 1] \qquad (1)$$

where k=1 to 6 for the six nearest neighbor structural features to the one structural feature and $a_k$ represents the angles of each of the six nearest neighbor structural features to an arbitrary axis.

According to a twenty-ninth aspect, any one of the twenty-fifth through twenty-eighth aspects is provided, wherein a first portion of the plurality of structural features comprises pillars having a first average height from 50 nm to 250 nm.

According to a thirtieth aspect, the twenty-ninth aspect is provided, wherein the height of each pillar is from 120 nm to 180 nm.

According to a thirty-first aspect, any one of the twenty-fifth through twenty-eighth aspects is provided, wherein a first portion of the plurality of structural features comprises holes having a first average depth from 50 nm to 250 nm.

According to a thirty-second aspect, the thirty-first aspect is provided, wherein the depth of each hole is from 120 nm to 180 nm.

According to a thirty-third aspect, any one of the twenty-fifth through thirty-second aspects is provided, further comprising an antireflective coating disposed on the primary surface of the substrate. The antireflective coating comprises a plurality of alternating high refractive index and low refractive index layers. Each of the low refractive index layers comprises a refractive index of less than or equal to about 1.8 and about the same or greater than a refractive index of the substrate. Each of the high refractive index layers comprises a refractive index that is greater than 1.8. Further, the article exhibits a first-surface absolute specular reflectance (% Rs) of less than 0.1% at an incident angle of 20° from normal.

A thirty-fourth aspect of the disclosure pertains to a method of making a display article. The method comprises: masking a substrate comprising a thickness and a primary surface with a mask; forming a diffractive surface region within the primary surface of the substrate; and removing the mask from the substrate. The diffractive surface region comprises a plurality of structural features that comprises a plurality of different heights in a multimodal distribution. The multimodal distribution further comprises a first portion of structural features at a first average height and a second portion of structural features at a second average height. Further, the substrate exhibits a sparkle of less than 4%, as measured by pixel power deviation ($PPD_{140}$) at an incident angle of 0° from normal, a distinctness of image (DOI) of less than 80% at an incident angle of 20° from normal, and a transmittance haze of less than 20% from an incident angle of 0° from normal.

According to a thirty-fifth aspect, the thirty-fourth aspect is provided, wherein the step of masking comprises one or more of screen print masking, inkjet print masking, photoresist masking.

According to a thirty-sixth aspect, the thirty-fourth or thirty-fifth aspect is provided, wherein the step of forming comprises etching the primary surface of the substrate through the mask to form the diffractive surface region, and wherein each structural feature is a hole comprising a depth from 50 nm to 250 nm.

According to a thirty-seventh aspect, the thirty-fourth or thirty-fifth aspect is provided, wherein the step of forming comprises depositing a film on the primary surface of the substrate through the mask to form the diffractive surface region, and wherein each structural feature is a pillar comprising a height from 50 nm to 250 nm.

According to a thirty-eighth aspect of the present disclosure, a display article is provided that includes: a substrate comprising a thickness and a primary surface; a diffractive surface region defined by the primary surface; and an antireflective coating disposed on the diffractive surface region defined by the primary surface of the substrate. The diffractive surface region comprises a plurality of structural features that comprises a plurality of different heights in a multimodal distribution. Further, the substrate exhibits a sparkle of less than 4%, as measured by pixel power deviation ($PPD_{140}$) at an incident angle of 0° from normal, and a transmittance haze of less than 40% from an incident angle of 0° from normal. The antireflection coating comprises a plurality of alternating high refractive index and low refractive index layers. Further, each of the low refractive index layers comprises a refractive index of less than or equal to about 1.8, and each of the high refractive index layers comprises a refractive index of greater than 1.8. The article exhibits a first-surface average specular reflectance (% R) of less than 0.2% at an incident angle of 20° from normal in the visible spectrum from about 450 nm to 650 nm. In addition, the article exhibits a maximum hardness of 8 GPa or greater, as measured by a Berkovich Indenter Hardness Test over an indentation depth of 50 nm or greater.

According to a thirty-ninth aspect, the thirty-eighth aspect is provided, wherein the antireflective coating comprises a total physical thickness from 200 nm to 500 nm, and wherein the antireflective coating has a total of three (3) to nine (9) layers.

According to a fortieth aspect, the thirty-eighth aspect or the thirty-ninth aspect is provided, wherein each high refractive index layer comprises one of $Si_3N_4$, $SiN_x$ and $SiO_xN_y$.

According to a forty-first aspect, any one of the thirty-eighth through fortieth aspects is provided, wherein one of the low refractive index layers is disposed directly on the primary surface of the substrate.

According to a forty-second aspect, any one of the thirty-eighth through forty-first aspects is provided, wherein each low refractive index layer comprises $SiO_2$ or $SiO_x$.

According to a forty-third aspect, any one of the thirty-eighth through forty-second aspects is provided, wherein the antireflective coating further comprises a scratch resistant layer which is the thickest high refractive index layer, wherein the scratch resistant layer comprises one of $Si_3N_4$, $SiN_x$ and $SiO_xN_y$ having a physical thickness from 50 nm to 200 nm, and further wherein the antireflective coating has a total of three (3) to six (6) layers.

According to a forty-fourth aspect, the forty-third aspect is provided, wherein the total physical thickness of the antireflective coating is from 200 nm to 350 nm and the physical thickness of the scratch resistant layer is from about 75 nm to 175 nm.

According to a forty-fifth aspect, the forty-third aspect is provided, wherein the total physical thickness of the antireflective coating is from 250 nm to 340 nm and the physical thickness of the scratch resistant layer is from 100 nm to 160 nm.

According to a forty-sixth aspect, any one of the thirty-eighth through forty-fifth aspects is provided, wherein the plurality of structural features further comprises a first portion of structural features having a first average height and a second portion of structural features having a second average height.

According to a forty-seventh aspect, the forty-sixth aspect is provided, wherein the first average height and the second average height have a difference of from 120 nm to 200 nm.

According to a forty-eighth aspect, any one of the thirty-eighth through forty-seventh aspects is provided, wherein the substrate comprises a glass substrate or a glass-ceramic substrate.

According to a forty-ninth aspect, any one of the thirty-eighth through forty-eighth aspects is provided, wherein the sparkle is less than 2%, as measured by $PPD_{140}$ at an incident angle of 0° from normal.

According to a fiftieth aspect, any one of the thirty-eighth through forty-ninth aspects is provided, wherein the transmittance haze is less than 10% from an incident angle of 0° from normal.

According to a fifty-first aspect, any one of the thirty-eighth through fiftieth aspects is provided, wherein the first-surface average specular reflectance (% R) is less than 0.1% at an incident angle of 20° from normal in the visible spectrum from about 450 nm to 650 nm.

According to a fifty-second aspect, a consumer electronic product is provided which includes: a housing comprising a front surface, a back surface and side surfaces; electrical components at least partially within the housing, the electrical components comprising a controller, a memory, and a display, the display at or adjacent to the front surface of the housing; and a cover substrate disposed over the display. At least one portion of the housing or the cover substrate comprises the article of any one of the thirty-eighth through fifty-first aspects is provided.

According to a fifty-third aspect of the present disclosure, a display article is provided that includes: a substrate comprising a thickness and a primary surface; a diffractive surface region defined by the primary surface; and an antireflective coating disposed on the diffractive surface region defined by the primary surface of the substrate. The diffractive surface region comprises a plurality of structural features comprising a pitch of less than 125 μm and a fill fraction from 30% to 70%, each structural feature comprising a diameter from 5 μm to 120 μm. Further, the substrate exhibits a sparkle of less than 4%, as measured by pixel power deviation ($PPD_{140}$) at an incident angle of 0° from normal, and a transmittance haze of less than 40% from an incident angle of 0° from normal. The antireflection coating comprises a plurality of alternating high refractive index and low refractive index layers. Further, each of the low refractive index layers comprises a refractive index of less than or equal to about 1.8, and each of the high refractive index layers comprises a refractive index of greater than 1.8. The article exhibits a first-surface average specular reflectance (% R) of less than 0.2% at an incident angle of 20° from normal in the visible spectrum from about 450 nm to 650 nm. In addition, the article exhibits a maximum hardness of 8 GPa or greater, as measured by a Berkovich Indenter Hardness Test over an indentation depth of 50 nm or greater.

According to a fifty-fourth aspect, the fifty-third aspect is provided, wherein the antireflective coating comprises a total physical thickness from 200 nm to 500 nm, and wherein the antireflective coating has a total of three (3) to nine (9) layers.

According to a fifty-fifth aspect, the fifty-third aspect or the fifty-fourth aspect is provided, wherein each high refractive index layer comprises one of $Si_3N_4$, $SiN_x$ and $SiO_xN_y$.

According to a fifty-sixth aspect, any one of the fifty-third through fifty-fifth aspects is provided, wherein one of the low refractive index layers is disposed directly on the primary surface of the substrate.

According to a fifty-seventh aspect, any one of the fifty-third through fifty-sixth aspects is provided, wherein each low refractive index layer comprises $SiO_2$ or $SiO_x$.

According to a fifty-eighth aspect, any one of the fifty-third through fifty-seventh aspects is provided, wherein the antireflective coating further comprises a scratch resistant layer which is the thickest high refractive index layer, wherein the scratch resistant layer comprises one of $Si_3N_4$, $SiN_x$ and $SiO_xN_y$ having a physical thickness from 50 nm to 200 nm, and further wherein the antireflective coating has three (3) to six (6) layers.

According to a fifty-ninth aspect, any one of the fifty-third through fifty-eighth aspects is provided, wherein the substrate comprises a glass substrate or a glass-ceramic substrate.

According to a sixtieth aspect, any one of the fifty-third through fifty-ninth aspects is provided, wherein the sparkle is less than 2%, as measured by $PPD_{140}$ at an incident angle of 0° from normal.

According to a sixty-first aspect, any one of the fifty-third through sixtieth aspects is provided, wherein the transmittance haze is less than 10% from an incident angle of 0° from normal.

According to a sixty-second aspect, any one of the fifty-third through sixty-first aspects is provided, wherein the first-surface average specular reflectance (% R) is less than 0.1% at an incident angle of 20° from normal in the visible spectrum from about 450 nm to 650 nm.

According to a sixty-third aspect, any one of the fifty-third through sixty-second aspects is provided, wherein a first portion of the plurality of structural features comprises pillars having a first average height from 50 nm to 250 nm.

According to a sixty-fourth aspect, any one of the fifty-third through sixty-second aspects is provided, wherein a first portion of the plurality of structural features comprises holes having a first average depth from 50 nm to 250 nm.

According to a sixty-fifth aspect, any one of the fifty-third through sixty-fourth aspects is provided, wherein the fill fraction is from 40% to 55%.

According to a sixty-sixth aspect, any one of the fifty-third through sixty-fifth aspects is provided, wherein each structural feature further comprises an aspect ratio of greater than or equal to 50.

According to a sixty-seventh aspect, a consumer electronic product is provided which includes: a housing comprising a front surface, a back surface and side surfaces; electrical components at least partially within the housing, the electrical components comprising a controller, a memory, and a display, the display at or adjacent to the front surface of the housing; and a cover substrate disposed over the display. At least one portion of the housing or the cover substrate comprises the article of any one of the fifty-third through sixty-sixth aspects.

According to a sixty-eighth aspect of the present disclosure, a display article is provided that includes: a substrate comprising a thickness and a primary surface; a diffractive surface region defined by the primary surface; and an antireflective coating disposed on the diffractive surface region defined by the primary surface of the substrate. The diffractive surface region comprises a plurality of structural features comprising a pitch of less than 125 µm and a fill fraction from 30% to 70%, each structural feature comprises a height or depth from 50 nm to 250 nm. The antireflection coating comprises a plurality of alternating high refractive index and low refractive index layers. Further, each of the low refractive index layers comprises a refractive index of less than or equal to about 1.8, and each of the high refractive index layers comprises a refractive index of greater than 1.8. The article exhibits a first-surface average specular reflectance (% R) of less than 0.2% at an incident angle of 20° from normal in the visible spectrum from about 450 nm to 650 nm. In addition, the article exhibits a maximum hardness of 8 GPa or greater, as measured by a Berkovich Indenter Hardness Test over an indentation depth of 50 nm or greater.

According to a sixty-ninth aspect, the sixty-eighth aspect is provided, wherein the plurality of structural features further comprises a non-random spatial distribution.

According to a seventieth aspect, the sixty-eighth aspect or the sixty-ninth aspect is provided, wherein a first portion of the plurality of structural features comprises pillars having a first average height from 50 nm to 250 nm.

According to a seventy-first aspect, the sixty-eighth aspect or the sixty-ninth aspect is provided, wherein a first portion of the plurality of structural features comprises holes having a first average depth from 50 nm to 250 nm.

According to a seventy-second aspect, any one of the sixty-eighth through seventy-first aspects is provided, wherein each structural feature further comprises an aspect ratio of greater than or equal to 50.

According to a seventy-third aspect, any one of the sixty-eighth through seventy-second aspects is provided, wherein the substrate comprises a glass substrate or a glass-ceramic substrate.

According to a seventy-fourth aspect, a consumer electronic product is provided which includes: a housing comprising a front surface, a back surface and side surfaces; electrical components at least partially within the housing, the electrical components comprising a controller, a memory, and a display, the display at or adjacent to the front surface of the housing; and a cover substrate disposed over the display. At least one portion of the housing or the cover substrate comprises the article of any one of the sixty-eighth through seventy-third aspects.

Many variations and modifications may be made to the above-described embodiments of the disclosure without departing substantially from the spirit and various principles of the disclosure. All such modifications and variations are intended to be included herein within the scope of this disclosure and protected by the following claims.

What is claimed is:

1. A display article, comprising:
   a substrate comprising a thickness and a primary surface;
   a diffractive surface region defined by the primary surface; and
   an antireflective coating disposed on the diffractive surface region defined by the primary surface of the substrate,
   wherein the diffractive surface region comprises a plurality of structural features that comprises a plurality of different heights in a multimodal distribution,
   wherein the article exhibits a sparkle of less than 4%, as measured by pixel power deviation ($PPD_{140}$) at an incident angle of 0° from normal, and a transmittance haze of less than 20% from an incident angle of 0° from normal, wherein the antireflective coating comprises a plurality of alternating high refractive index and low refractive index layers, wherein each of the low refractive index layers comprises a refractive index of less than or equal to about 1.8, and each of the high refractive index layers comprises a refractive index of greater than 1.8, wherein the article exhibits a first-surface average specular reflectance (% R) of less than 0.2% at an incident angle of 20° from normal in the visible spectrum from about 450 nm to 650 nm, and further wherein the article exhibits a maximum hardness of 8 GPa or greater, as measured by a Berkovich Indenter Hardness Test over an indentation depth of 50 nm or greater, wherein the anti-reflective coating comprises a total physical thickness that is less than or equal to 450 nm, wherein the plurality of structural features further comprises a first portion of structural features having a first average height and a second portion of structural features having a second average height, and further wherein the first average height and the second average height have a difference of from 120 nm to 200 nm.

2. The display article according to claim 1, wherein the total physical thickness is from 200 nm to 400 nm, and wherein the antireflective coating has a total of three (3) to nine (9) layers.

3. The display article according to claim 1, wherein each high refractive index layer comprises one of $Si_3N_4$, $SiN_x$ and $SiO_xN_y$.

4. The display article according to claim 1, wherein one of the low refractive index layers is disposed directly on the primary surface of the substrate.

5. The display article according to claim 1, wherein each low refractive index layer comprises $SiO_2$ or $SiO_x$.

6. The display article according to claim 1, wherein the anti-reflective coating comprises a scratch resistant layer having a physical thickness, wherein the scratch resistant layer is the thickest high refractive index layer, wherein the scratch resistant layer comprises one of $Si_3N_4$, $SiN_x$ and $SiO_xN_y$, wherein the physical thickness is from 100 nm to 160 nm, and further wherein the antireflective coating has a total of three (3) to six (6) layers.

7. The display article according to claim 6, wherein the total physical thickness of the antireflective coating is from 250 nm to 340.

8. The display article according to claim 1, wherein the substrate comprises a glass substrate or a glass-ceramic substrate.

9. A consumer electronic product, comprising:
a housing comprising a front surface, a back surface and side surfaces;
electrical components at least partially within the housing, the electrical components comprising a controller, a memory, and a display, the display at or adjacent to the front surface of the housing; and
a cover substrate disposed over the display,
wherein at least one portion of the housing or the cover substrate comprises the article of claim 1.

10. A display article, comprising:
a substrate comprising a thickness and a primary surface;
a diffractive surface region defined by the primary surface; and
an antireflective coating disposed on the diffractive surface region defined by the primary surface of the substrate, wherein the diffractive surface region comprises a plurality of structural features comprising a pitch of less than 125 μm and a fill fraction from 30% to 70%, each structural feature comprising a diameter from 5 μm to 120 μm, wherein the article exhibits a sparkle of less than 4%, as measured by pixel power deviation ($PPD_{140}$) at an incident angle of 0° from normal, and a transmittance haze of less than 20% from an incident angle of 0° from normal, wherein the antireflective coating comprises a plurality of alternating high refractive index and low refractive index layers, wherein each of the low refractive index layers comprises a refractive index of less than or equal to about 1.8, and each of the high refractive index layers comprises a refractive index of greater than 1.8, wherein the article exhibits a first-surface average specular reflectance (% R) of less than 0.2% at an incident angle of 20° from normal in the visible spectrum from about 450 nm to 650 nm, and further wherein the article exhibits a maximum hardness of 8 GPa or greater, as measured by a Berkovich Indenter Hardness Test over an indentation depth of 50 nm or greater, wherein the anti-reflective coating comprises a total physical thickness that is less than or equal to 450 nm, wherein the plurality of structural features further comprises a first portion of structural features having a first average height and a second portion of structural features having a second average height, and further wherein the first average height and the second average height have a difference of from 120 nm to 200 nm.

11. The display article according to claim 10, wherein the total physical thickness is from 200 nm to 400 nm, and wherein the antireflective coating has a total of three (3) to nine (9) layers.

12. The display article according to claim 10, wherein each high refractive index layer comprises one of $Si_3N_4$, $SiN_x$ and $SiO_xN_y$, wherein one of the low refractive index layers is disposed directly on the primary surface of the substrate, and further wherein each low refractive index layer comprises $SiO_2$ or $SiO_x$.

13. The display article according to claim 10, wherein the anti-reflective coating comprises a scratch resistant layer having a physical thickness, wherein the scratch resistant layer which is the thickest high refractive index layer, wherein the scratch resistant layer comprises one of $Si_3N_4$, $SiN_x$ and $SiO_xN_y$, wherein the physical thickness is from 100 nm to 160 nm, and further wherein the antireflective coating has three (3) to six (6) layers.

14. The display article according to claim 10, wherein the substrate comprises a glass substrate or a glass-ceramic substrate.

15. The display article according to claim 10, wherein the fill fraction is from 40% to 55%.

16. The display article according to claim 10, wherein each structural feature further comprises an aspect ratio of greater than or equal to 50.

17. A consumer electronic product, comprising:
a housing comprising a front surface, a back surface and side surfaces;
electrical components at least partially within the housing, the electrical components comprising a controller, a memory, and a display, the display at or adjacent to the front surface of the housing; and
a cover substrate disposed over the display, wherein at least one portion of the housing or the cover substrate comprises the article of claim 10.

18. A display article, comprising:

a substrate comprising a thickness and a primary surface;

a diffractive surface region defined by the primary surface; and an antireflective coating disposed on the diffractive surface region defined by the primary surface of the substrate, wherein the diffractive surface region comprises a plurality of structural features comprising a pitch of less than 125 μm, and a fill fraction from 30% to 70%, wherein each structural feature comprises a height or depth of from 50 nm to 250 nm, wherein the antireflective coating comprises a plurality of alternating high refractive index and low refractive index layers, wherein each of the low refractive index layers comprises a refractive index of less than or equal to about 1.8, and each of the high refractive index layers comprises a refractive index of greater than 1.8, wherein the article exhibits a first-surface average specular reflectance (% R) of less than 0.2% at an incident angle of 20° from normal in the visible spectrum from about 450 nm to 650 nm, and wherein the article exhibits a sparkle of less than 4%, as measured by pixel power deviation ($PPD_{140}$) at an incident angle of 0° from normal, and a transmittance haze of less than 20% from an incident angle of 0° from normal, further wherein the article exhibits a maximum hardness of 8 GPa or greater, as measured by a Berkovich Indenter Hardness Test over an indentation depth of 50 nm or greater, wherein the anti-reflective coating comprises a total physical thickness that is less than or equal to 450 nm.

19. The display article according to claim 18, wherein the plurality of structural features further comprises a non-random spatial distribution.

20. The display article according to claim 18, wherein each structural feature further comprises an aspect ratio of greater than or equal to 50.

21. The display article according to claim 18, wherein the substrate comprises a glass substrate or a glass-ceramic substrate.

22. A consumer electronic product, comprising:

a housing comprising a front surface, a back surface and side surfaces;

electrical components at least partially within the housing, the electrical components comprising a controller, a memory, and a display, the display at or adjacent to the front surface of the housing; and a cover substrate disposed over the display, wherein at least one portion of the housing or the cover substrate comprises the article of claim 18.

* * * * *